United States Patent
Ito et al.

[11] Patent Number: 6,154,038
[45] Date of Patent: Nov. 28, 2000

[54] APPARATUS AND METHOD FOR TESTING CIRCUIT BOARD

[75] Inventors: Akio Ito; Kazuyuki Ozaki, both of Kawasaki; Kazuhiro Nakazawa, Sagamihara, all of Japan

[73] Assignee: Fujitsu Limited, Kawasaki, Japan

[21] Appl. No.: 08/859,266

[22] Filed: May 20, 1997

Related U.S. Application Data

[62] Division of application No. 08/251,953, May 31, 1994, Pat. No. 5,680,056.

[30] Foreign Application Priority Data

Sep. 20, 1993 [JP] Japan ................................ 5-233635
Mar. 11, 1994 [JP] Japan ................................ 66-41333

[51] Int. Cl.$^7$ .............................................. G01R 31/02
[52] U.S. Cl. ......................... 324/750; 324/501; 324/752
[58] Field of Search ................................. 324/459, 500, 324/501, 514, 537, 750, 752, 754

[56] References Cited

U.S. PATENT DOCUMENTS

| | | | |
|---|---|---|---|
| 4,507,605 | 3/1985 | Geisel ........................................ | 324/501 |
| 4,600,878 | 7/1986 | Doemens et al. ........................ | 324/514 |
| 4,705,329 | 11/1987 | Doemens ................................ | 324/500 |
| 4,721,910 | 1/1988 | Bokor et al. ............................ | 324/752 |
| 4,771,230 | 9/1988 | Zeh .......................................... | 324/459 |
| 4,777,432 | 10/1988 | Doemens et al. ........................ | 324/459 |
| 4,891,578 | 1/1990 | Doemens ................................ | 324/158.1 |
| 4,967,149 | 10/1990 | Doemens et al. ........................ | 324/500 |
| 4,970,461 | 11/1990 | LePage ..................................... | 324/514 |
| 5,017,863 | 5/1991 | Mellitz ..................................... | 324/754 |
| 5,032,788 | 7/1991 | Ringleb et al. .......................... | 324/501 |
| 5,148,102 | 9/1992 | Rose et al. ............................... | 324/537 |
| 5,177,437 | 1/1993 | Henley ..................................... | 324/754 |
| 5,179,279 | 1/1993 | Millard et al. ......................... | 324/158.1 |
| 5,202,623 | 4/1993 | LePage ..................................... | 324/501 |

Primary Examiner—Ernest Karlsen
Attorney, Agent, or Firm—Armstrong, Westerman, Hattori, McLeland & Naughton

[57] ABSTRACT

An apparatus for testing a circuit board has a holder for holding the circuit board, a detector for detecting the electrical characteristics of the circuit board, and a controller for controlling laser plasma switches. The detector has a path forming unit positioned away from the circuit board by a predetermined gap. The path forming unit forms a first conductive path between a position corresponding to a first test pad on a trace of the circuit board and a first power source, as well as a second conductive path between a position corresponding to a second test pad on another trace of the circuit board and a second power source. The controller emits a laser beam to a first space between the first test pad and the first conductive path and another laser beam toward a second space between the second test pad and the second conductive path, to make the first and second spaces conductive. The detector has a sampler connected to one of the first and second conductive paths, to sample electrical characteristic values of the circuit board.

12 Claims, 42 Drawing Sheets

$$R_{ij} = \frac{V}{I} - R_{in} - R_{out} - 2 \times R_{LPS}$$

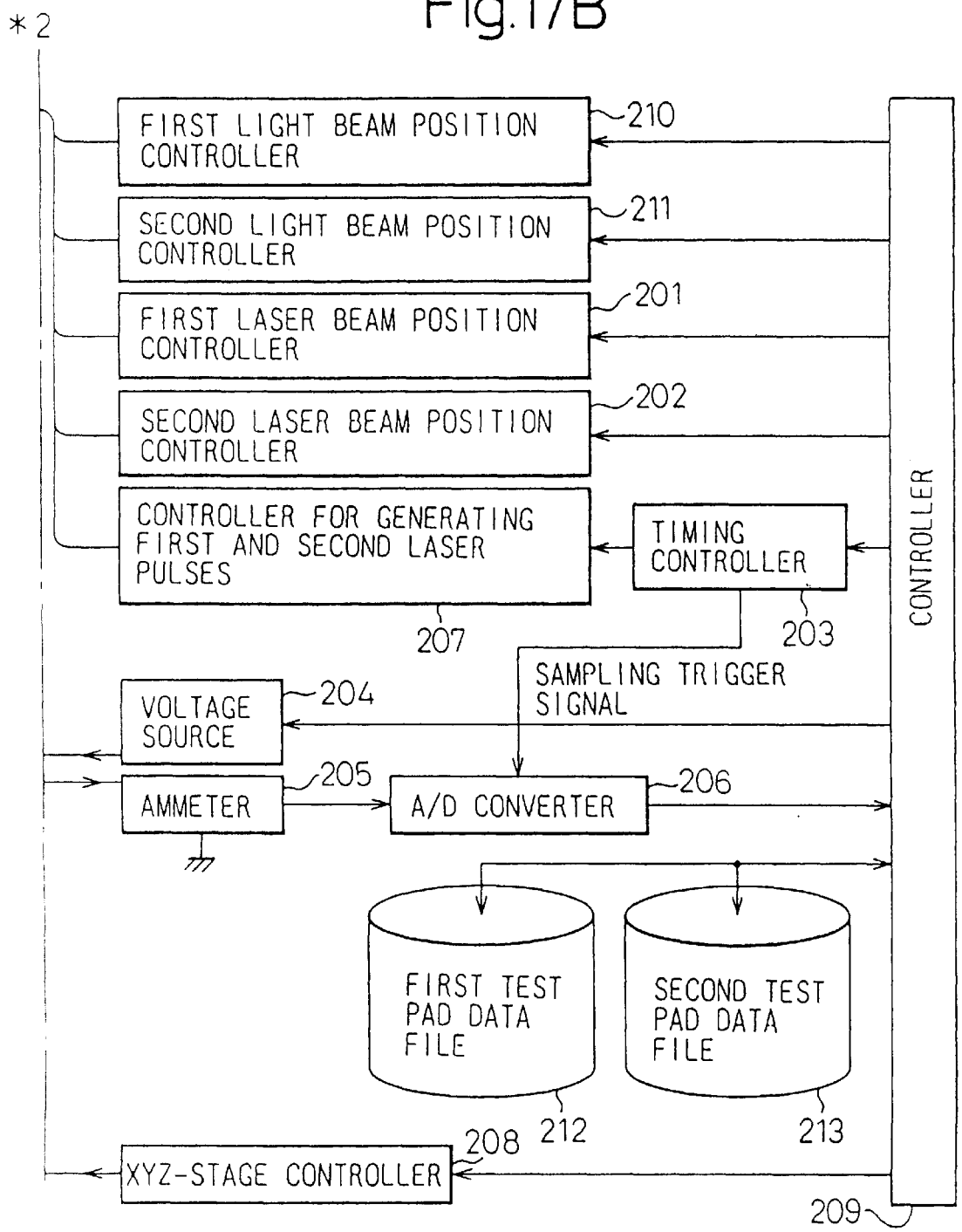

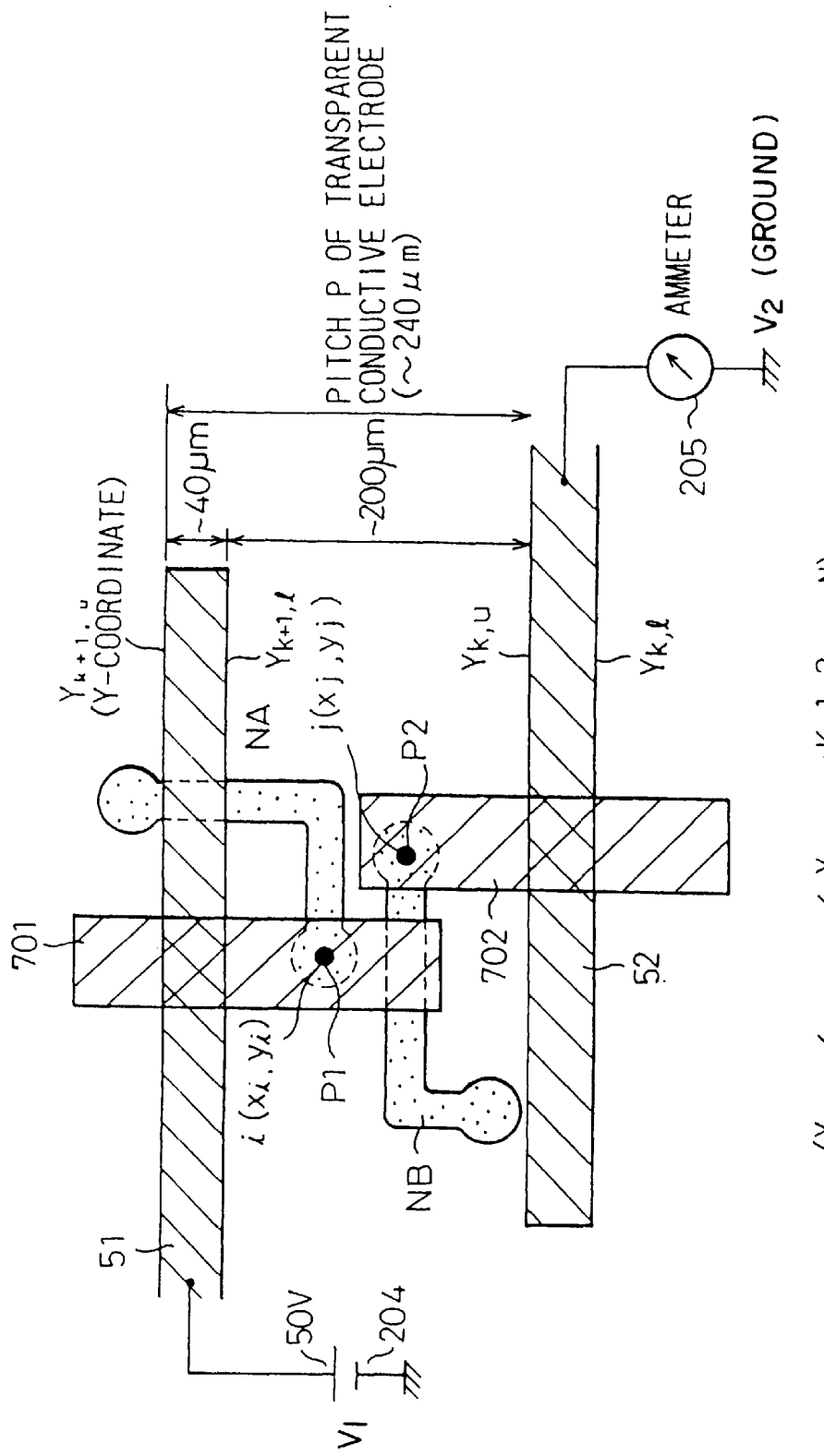

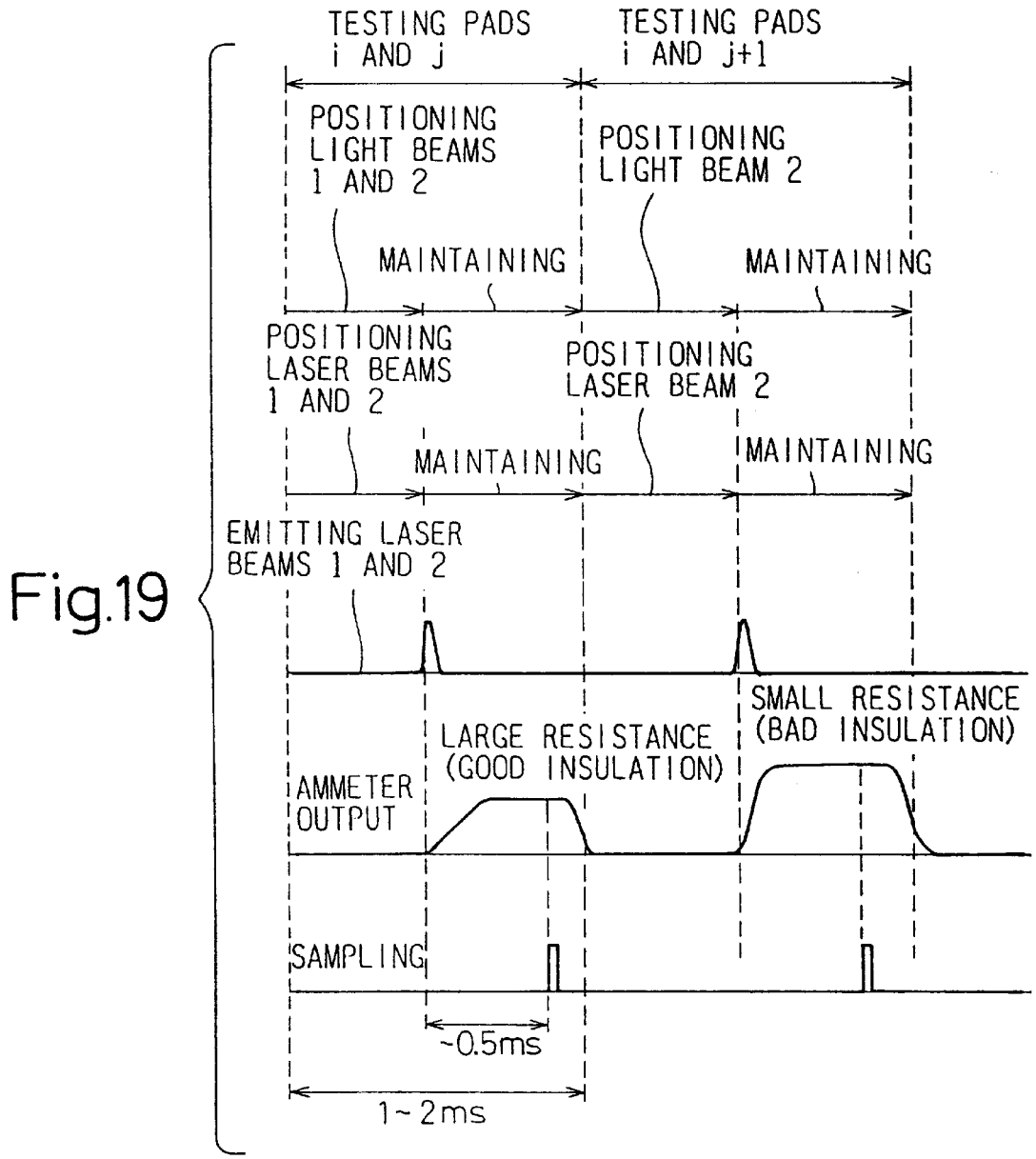

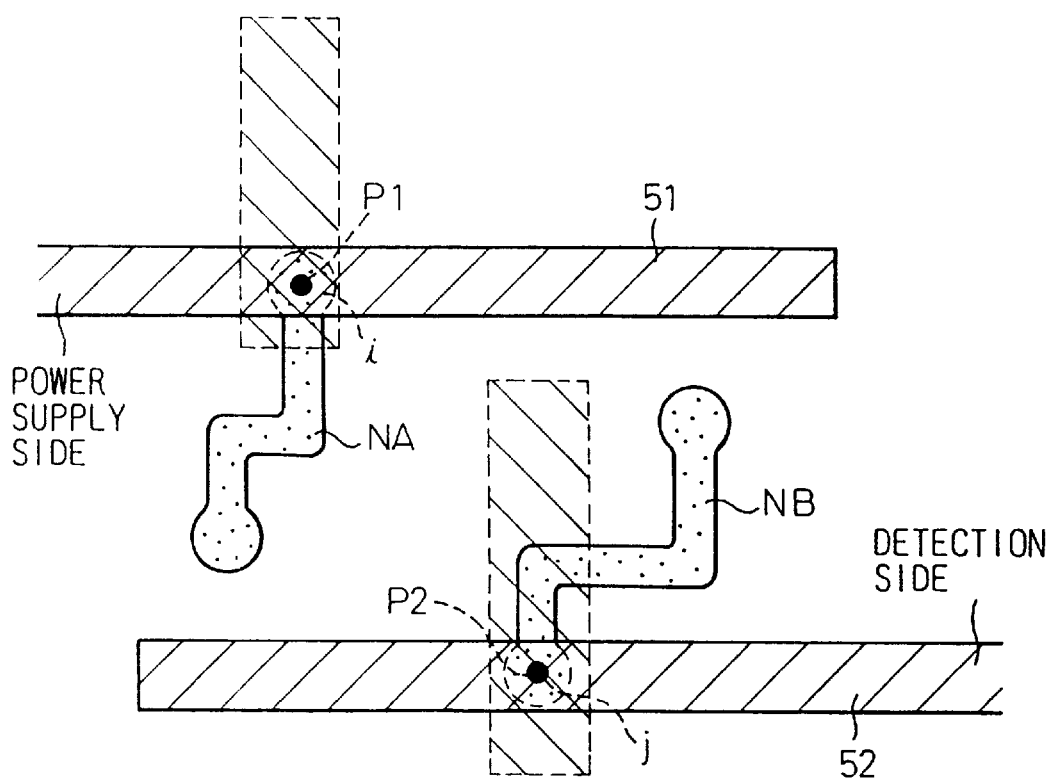

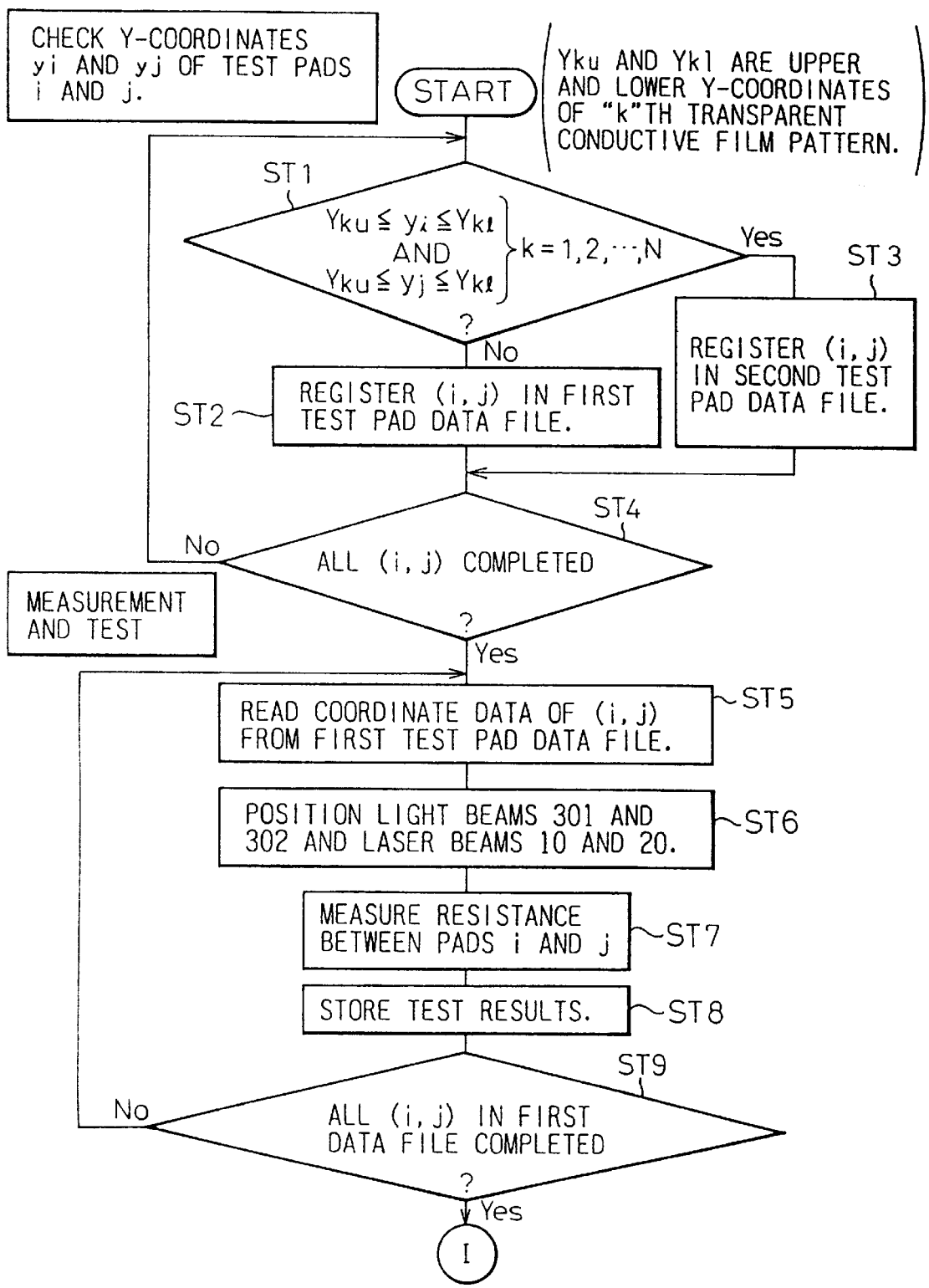

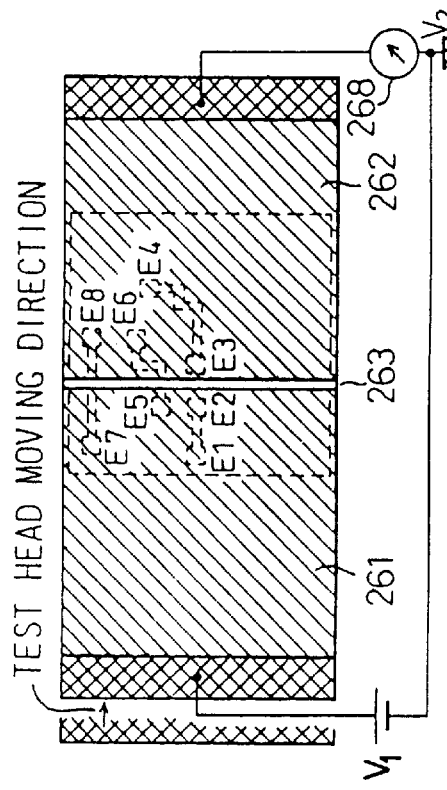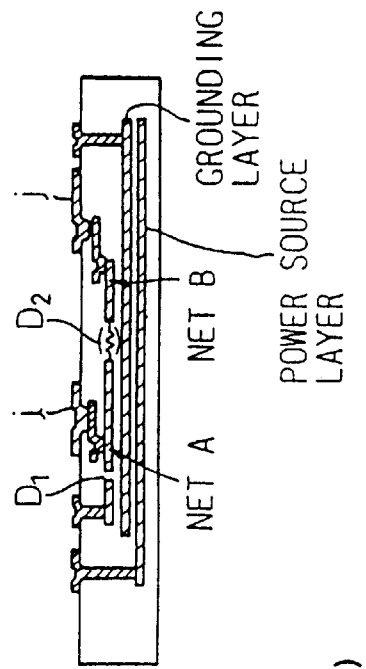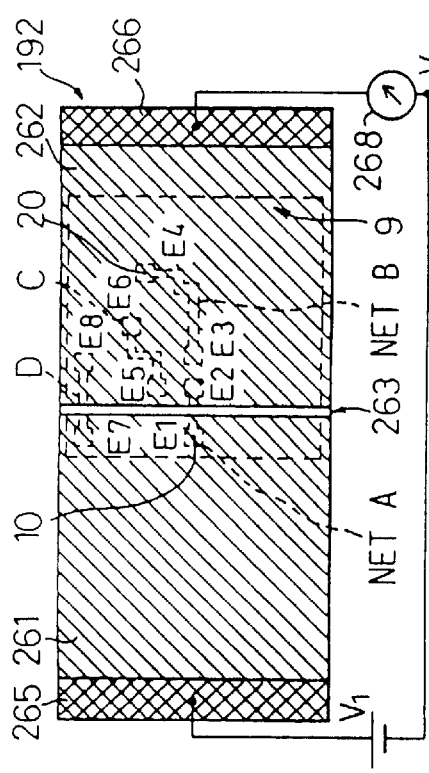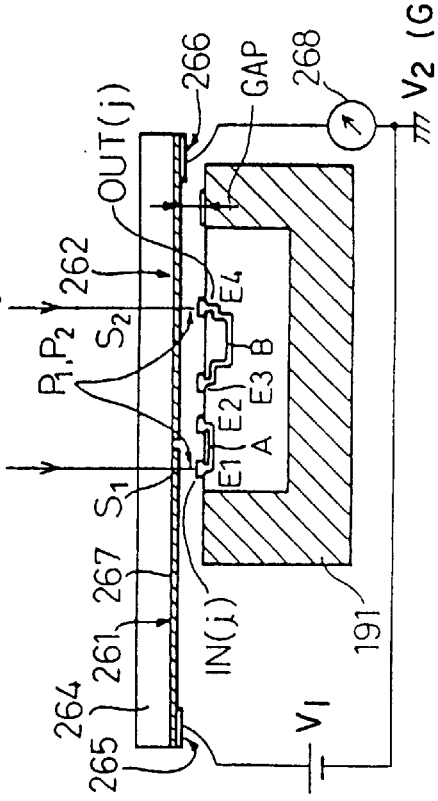

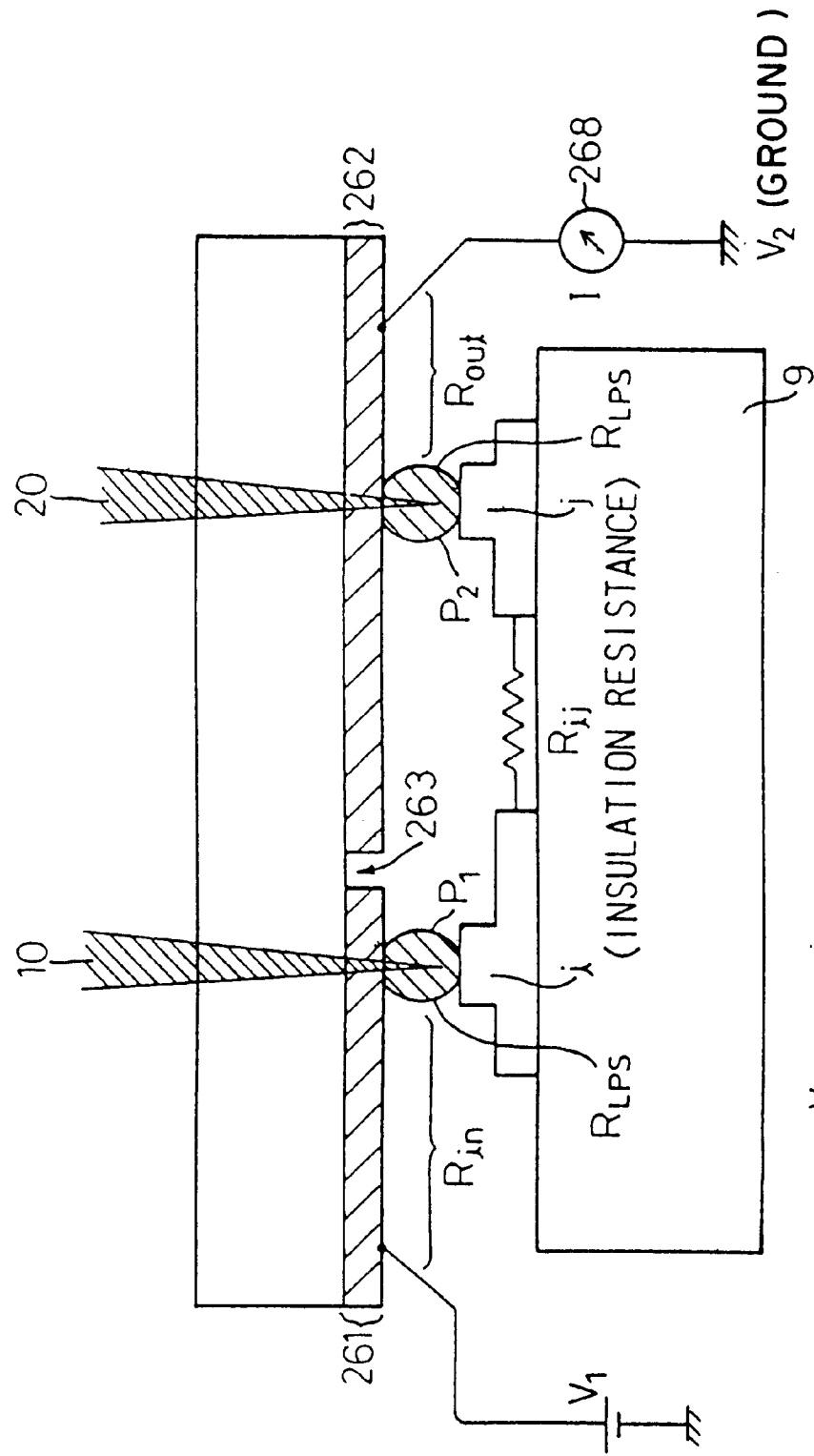

Fig.25B
| TEST BETWEEN i AND j | | |
|---|---|---|
| SLIT POSITION k | TEST PAD i | TEST PAD j |
| 1 | 1(E1) | 3(E3) |
|   | 1 | 4(E4) |
|   | 1 | 5(E5) |
|   | 1 | 6(E6) |
|   | 2(E2) | 3(E3) |
|   | 2 | 4(E4) |
|   | 2 | 5(E5) |
|   | 2 | 6(E6) |
| 2 | NONE | NONE |
| 3 | 3(E3) | 5(E5) |
|   | 3 | 6(E6) |
|   | 4(E4) | 5(E5) |
|   | 4 | 6(E6) |
| 4 | 5(E4) | 6(E6) |
| 5 ~ 9 | NONE | NONE |
90-DEGREE ROTATION OF TEST HEAD
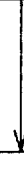
| TEST BETWEEN i AND j | | |
|---|---|---|
| SLIT POSITION $\ell$ | TEST PAD i | TEST PAD j |
| 1 ~ 3 | NONE | NONE |
| 4 | 4(E4) | 3(E3) |
| 5 | 2(E2) | 1(E1) |

Fig.29A

| PAD COMBINATION | | PAD DATA FILE NUMBER |
|---|---|---|
| i | j | |
| 1 | 2 | 1 |
|   | 3 | 1 |
|   | 4 | 2 |
|   | 5 | 1 |
|   | 6 | 1 |
|   | 7 | 2 |
|   | 8 | 1 |
| 2 | 3 | 2 |
|   | 4 | 2 |
|   | 5 | 2 |
|   | 6 | 1 |
|   | 7 | 2 |
|   | 8 | 2 |
| 3 | 4 | 1 |
|   | 5 | 2 |
|   | 6 | 1 |
|   | 7 | 1 |
|   | 8 | 2 |
| 4 | 5 | 1 |
|   | 6 | 1 |
|   | 7 | 2 |
|   | 8 | 2 |
| 5 | 6 | 1 |
|   | 7 | 1 |
|   | 8 | 2 |
| 6 | 7 | 1 |
|   | 8 | 1 |
| 7 | 8 | 1 |

DETERMINATION OF DATA FILE 1 OR 2 (LONGITUDINAL SLIT OR LATERAL SLIT)

Fig.29B

| SLIT COORDINATE (UNIT: P/2) | TEST PAD COMBINATION (i, j) |
|---|---|
| kx = 1 | NONE |
| kx = 2 | 1 , 2 |
|        | 1 , 3 |
|        | 1 , 5 |
|        | 1 , 6 |
|        | 1 , 8 |
| kx = 3 | 4 , 3 |
|        | 4 , 5 |
|        | 4 , 6 |
|        | 7 , 3 |
|        | 7 , 5 |
|        | 7 , 6 |
|        | 7 , 8 |
| kx = 4 | 2 , 6 |
| kx = 5 | 3 , 6 |
|        | 5 , 6 |
|        | 8 , 6 |
| kx = 6~11 | NONE |
| ky = 1 | NONE |
| ky = 2 | 1 , 4 |
|        | 1 , 7 |
|        | 2 , 3 |
|        | 2 , 4 |
|        | 2 , 5 |
|        | 2 , 7 |
|        | 2 , 8 |
| ky = 3 | NONE |
| ky = 4 | 3 , 5 |
|        | 3 , 8 |
| ky = 5 | 4 , 7 |
|        | 4 , 8 |
| ky = 6 | 5 , 8 |
|        | NONE |
| ky = 7~11 | |

DETERMINATION OF SLIT COORDINATE

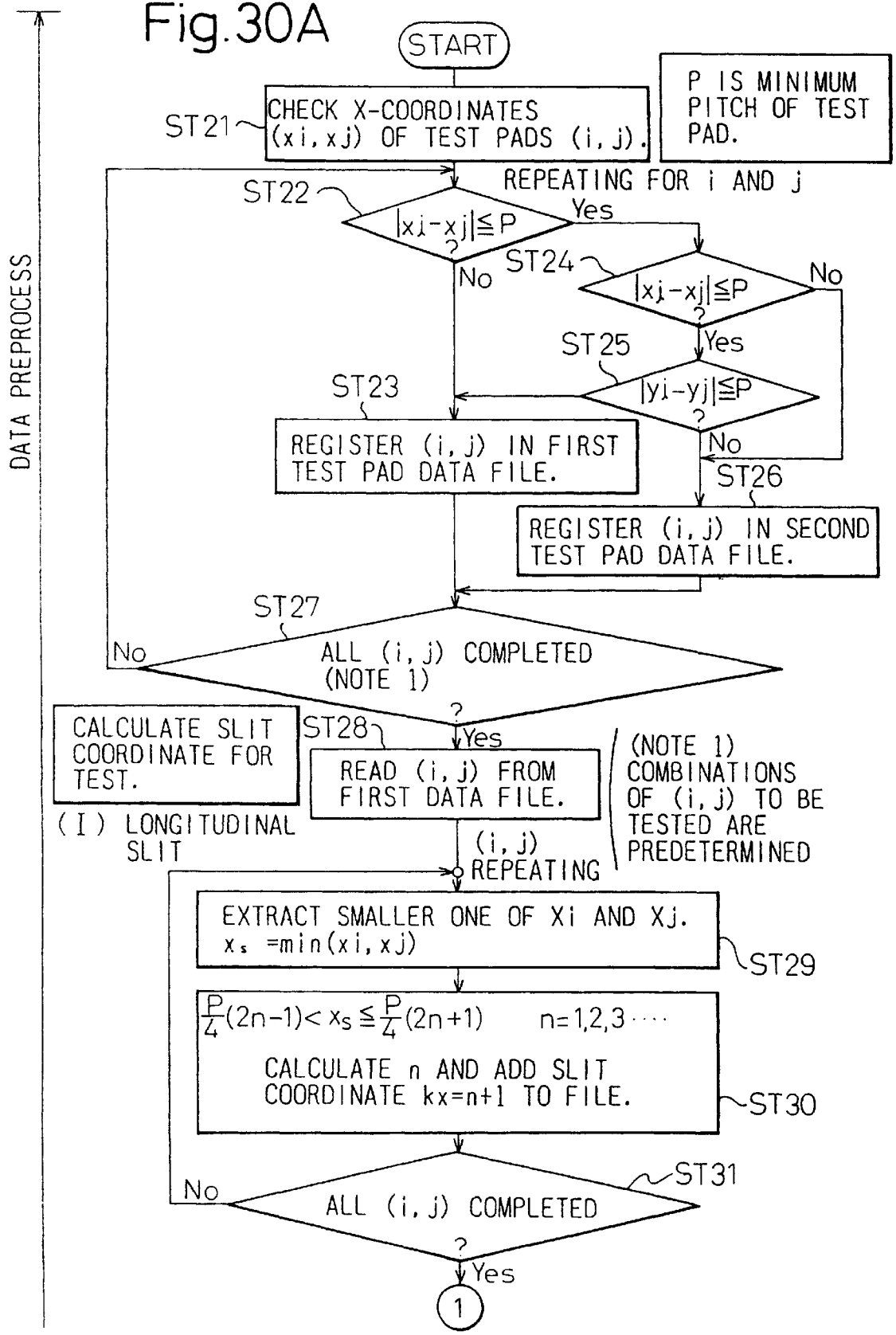

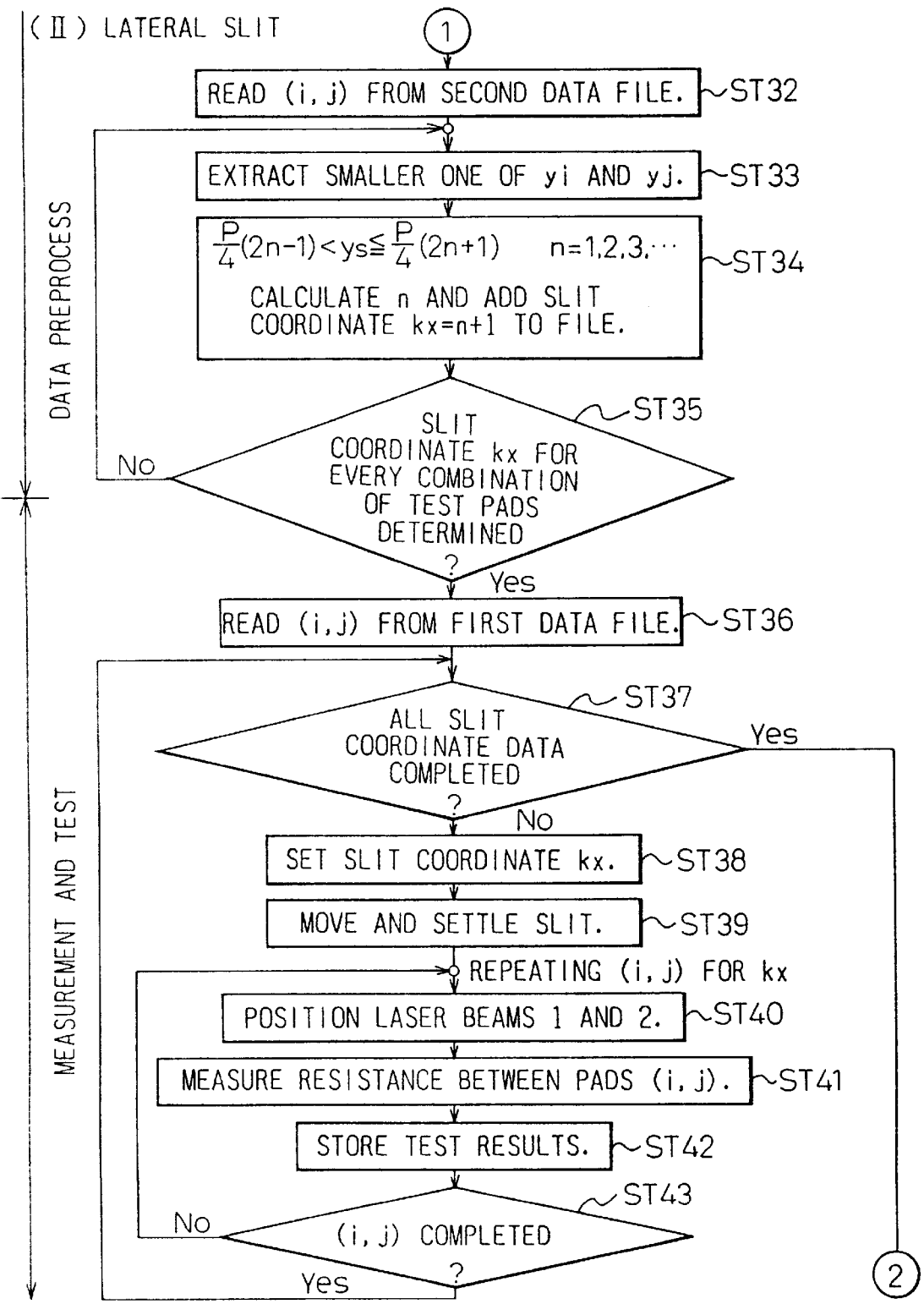

(STATE OF (M) OF FIG.31)

APPARATUS AND METHOD FOR TESTING CIRCUIT BOARD

This is a divisional of application Ser. No. 08/251,953 filed May 31, 1994, now U.S. Pat. No. 5,680,056.

BACKGROUND OF THE INVENTION

1. Field of the Invention

The present invention relates to a circuit board tester, and more particularly, to a tester for testing conduction and insulation between optional pads of a circuit board in a noncontact manner.

2. Description of the Related Art

Circuit boards increasingly have a large number of printed conductive wirings (which may be called as traces or nets, and hereinafter referred to as traces) and a large number of pads connected to the traces. This increases the time required for testing conduction and insulation among the pads. Contact testers must prepare contact probes suitable for a circuit board to be tested and control the contact probes on test pads of the circuit board. When the pads are very small, it is difficult to form an array of contact probes suitable for the pads and simultaneously and surely bring the probes in contact with the pads. It is necessary, therefore, to provide a noncontact tester to speedily test a circuit board for conduction and insulation among pads thereof. In particular, it is required to provide a tester for testing a high-density circuit board such as a multichip module (MCM) board for conduction and insulation among pads thereof.

Circuit board testing techniques are disclosed in, for example, Japanese Unexamined Patent Publication Nos. 3-295476, 3-118484, and 4-236367.

The Publication JUPP 3-295476 (first prior art) discloses a contact tester employing a test head in which many metal contact probes are embedded. The probes simultaneously come into contact with many pads on a circuit board. A signal is applied to two arbitrary pads through the corresponding probes, and a voltage or current between the probes is measured to calculate resistance between the two pads. According to the calculated resistance, it is determined whether or not conduction between the pads is allowable if the pads are on the same trace, or whether or not insulation between the pads is allowable if the pads are on different traces.

This technique is difficult to apply to circuit boards involving very fine wiring and pads, or a great number of pads. Accordingly, a flying probe technique and a two- or four-probe technique that separately move two to four metal probes to successively measure resistance between every pair of pads, have been developed.

The Publication JUPP 3-118484 (second prior art) discloses a noncontact tester. This tester emits an electron beam to charge an arbitrary pad and a trace connected to the pad to a given voltage, to see whether or not the voltage appears on another pad or trace. If the voltage appears on another pad on the same trace, it is determined that conduction is good. If pads on another trace maintain the same voltage level before and after the charging, it is determined that insulation is good.

The JUPP 4-236367 (third prior art) discloses a noncontact tester employing a laser beam and a photoconductive sheet having a transparent conductive film. The tester emits a laser beam so that the conductive film is electrically connected to a test pad through a part of the photoconductive sheet where the laser beam irradiates, to thereby charge the test pad. Thereafter, the tester emits a laser beam to measure charges at another pad through the conductive film, thereby determining the quality of conduction and insulation between the two pads.

These prior arts have problems, however, as described below.

According to the first prior art, it is nearly impossible to fabricate a test head having an array of probes to deal with several thousands to several tens of thousands of pads of a high-density circuit board with the pads each extending several tens of micrometers square and being arranged at pitches of about 10 micrometers. It is impossible to correctly bring the probes into contact with the pads. Instead of an array of probes, four discrete probes may be employed to surely make contact with pads and apply and measure voltages. This technique, however, takes a very long time for testing. When testing 2000 pads, approximately 500 hours will be needed to carry out 2000×2000 insulation tests because the probes need at least 0.5 seconds to measure resistance between each pair of the pads.

The second prior art employing electron beams may not have this kind of problem but it has another problem. The size of a circuit board is usually 10 to several tens of centimeters square, so that the tester must be three to four meters square to accommodate the circuit board in a vacuum chamber. In the vacuum chamber, the circuit board requires a long degassing time, so that it takes about one hour to start the test.

According to the third prior art, the photoconductive sheet and test pads must be completely in contact with each other. This is very difficult because the circuit board has irregularities of several micrometers.

The second and third prior arts charge an optional test pad and observe a charged state at another pad due to leakage from the charged pad. The second and third prior arts have a principle problem that it is difficult to measure correct resistance between the pads because charge and discharge time constants are affected not only by the resistance but also by the electrostatic capacitance of traces on which the pads are contained.

SUMMARY OF THE INVENTION

An object of the present invention is to provide an apparatus for carrying out conduction and insulation tests on arbitrary pads of a circuit board at high speed without employing contact probes, nor a vacuum degassing system, nor physical contact with pads. This apparatus is not affected by the electrostatic capacitance of traces of the circuit board. This apparatus reduces a delay in gate wiring and improves the operation speed of a semiconductor device.

According to the present invention, there is provided an apparatus for testing a circuit board having wiring patterns and traces with pads, comprising a unit for holding the circuit board; a unit for detecting the electrical characteristics of the circuit board, having a conductive path forming unit spaced apart from the circuit board by a predetermined gap, to form a first conductive path between a position corresponding to a first test pad on one of the traces and a first power source as well as a second conductive path between a position corresponding to a second test pad on another of the traces and a second power source; a unit for controlling a laser plasma switch in a first space between the first test pad and the first conductive path and a laser plasma switch in a second space between the second test pad and the second conductive. path, the laser plasma switches being activated with laser beams to make the first and second spaces conductive; and an electrical characteristic value sampling unit included in the electrical characteristics detection unit and connected to one of the first and second conductive paths.

The conductive path forming unit may be made from laser transmission material. The conductive path forming unit may be made from photoconductive material. The conductive path forming unit may be made from photoconductive material and has a unit for supporting the photoconductive material. The photoconductive material support unit may have a function of controlling light transmission. The photoconductive material support unit may be a liquid crystal mask. The photoconductive material support unit may have a unit for controlling patterns to transmit light.

The laser plasma switch control unit may have a unit for emitting laser beams and a unit for deflecting the laser beams. The electrical characteristics detection unit may have a unit for exciting the photoconductive material.

The laser plasma switch control unit may make the first and second spaces conductive, and a predetermined time thereafter, the electrical characteristics detection unit may drive the sampling unit to detect an electrical characteristic value in the conductive paths. The electrical characteristics detected by the electrical characteristics detection unit may include resistance, voltages, currents, and insulation resistance. The apparatus may further comprise a unit such as an O-ring to seal space between a photoconductive sheet or glass plate and the circuit board, and the sealed space may be filled with a pressurized or depressurized air or rare gas such as argon or xenon.

According to the present invention, there is also provided an apparatus for testing a circuit board having wiring patterns and traces with pads, comprising a photoconductive sheet positioned above the circuit board with a predetermined gap therebetween; a light transmission pattern control unit arranged above the photoconductive sheet, for controlling the shape of light emitted from a light source, to form a first conductive path and a second conductive path on the photoconductive sheet; a first laser plasma switch control unit for controlling conduction between a first test pad of the circuit board and an end of the first conductive path; a second laser plasma switch control unit for controlling conduction between a second test pad of the circuit board and an end of the second conductive path; and a first resistance measurement unit for measuring resistance between the other end of the first conductive path and the other end of the second conductive path.

Further, according to the present invention, there is provided an apparatus for testing a circuit board having metal wiring patterns and traces with pads, comprising a photoconductive sheet positioned above the circuit board with a predetermined gap therebetween; first and second transparent comb electrodes formed on the photoconductive sheet, the teeth of the comb electrodes alternating; a first light beam control unit for emitting and controlling a light beam of predetermined shape to form a first conductive path extending from the first comb electrode to a first test pad of the circuit board; a second light beam control unit for emitting and controlling a light beam of predetermined shape to form a second conductive path extending from the second comb electrode to a second test pad of the circuit board; a unit for controlling a first laser plasma switch that controls conduction between the first test pad and an end of the first conductive path; a unit for controlling a second laser plasma switch that controls conduction between the second test pad and an end of the second conductive path; and a unit for measuring a resistance value between the other end of the first conductive path and the other end of the second conductive path through the first and second comb electrodes.

According to the present invention, there is provided an apparatus for testing a circuit board having wiring patterns and traces with pads, comprising a unit for holding the circuit board; a unit for detecting the electrical characteristics of the circuit board, having a conductive path forming unit provided with a conductive area, the conductive area being spaced apart from the circuit board by a predetermined gap and facing an area of the circuit board where all test pads are positioned, the conductive area being composed of a plurality of conductive sections that are electrically isolated from one another, one of the conductive sections being connected to a first power source, and the other conductive sections being connected to a second power source whose potential is lower than that of the first power source, the conductive sections forming conductive paths between the test pad positions and the power sources; a unit for controlling laser plasma switches that are formed in at least two spaces between the test pads and the conductive sections, the laser plasma switches being activated when irradiated with laser beams; and an electrical characteristic value sampling unit contained in the electrical characteristics detection unit and connected to one of the conductive paths.

In addition, according to the present invention, there is provided an apparatus for testing a circuit board having wiring patterns and traces with pads, comprising a unit for holding the circuit board; a unit for detecting the electrical characteristics of the circuit board, having a unit for facing one face of the circuit board with a predetermined gap between them, for forming a first conductive path between a position corresponding to a first test pad on a trace of the circuit board and a first power source, and a unit for facing the other face of the circuit board with the predetermined gap therebetween, for forming a second conductive path between a position corresponding to a second test pad on a trace, which is the same or different from the trace containing the first test pad, and a second power source whose potential is lower than that of the first power source; a unit for controlling a laser plasma switch acting in a first space between the first test pad and the first conductive path as well as a laser plasma switch acting in a second space between the second test pad and the second conductive path, the first and second laser plasma switches being excited with laser beams, to make the first and second spaces conductive; and an electrical characteristic value sampling unit contained in the electrical characteristics detection unit and connected to one of the first and second conductive paths.

According to the present invention, there is provided a method of testing a circuit board having wiring patterns and traces with pads in an apparatus, having a unit for holding the circuit board, wherein the method comprises the steps of positioning the apparatus away from the circuit board held by the holding unit by a predetermined gap; forming a first conductive path between a position corresponding to a first test pad on a trace of the circuit board and a first power source; forming a second conductive path between a position corresponding to a second test pad on another trace of the circuit board and a second power source; emitting a laser beam toward a first space between the first test pad and the first conductive path and another laser beam toward a second space between the second test pad and the second conductive path, to make the first and second spaces conductive; and testing the electrical characteristics of the circuit board with a sampling unit connected to one of the first and second conductive paths.

According to the present invention, there is also provided a method of testing a circuit board having wiring patterns and traces with pads, wherein the method comprises the steps of positioning a photoconductive sheet above the circuit board with a predetermined gap therebetween; employing a light transmission pattern control unit arranged above the photoconductive sheet, to control the shape of light emitted from a light source and form a first conductive path and a second conductive path on the photoconductive sheet; employing a first laser plasma switch control unit to control conduction between a first test pad of the circuit board and an end of the first conductive path; employing a second laser plasma switch control unit to control conduction between a second test pad of the circuit board and an end of the second conductive path; and employing a resistance measurement unit to measure a resistance value between the other end of the first conductive path and the other end of the second conductive path.

Further, according to the present invention, there is provided a method of testing a circuit board having metal wiring patterns and traces with pads, wherein the method comprises the steps of positioning a photoconductive sheet above the circuit board with a predetermined gap therebetween; arranging first and second transparent comb electrodes on the photoconductive sheet, the teeth of the comb electrodes alternating; employing a first light beam control unit to emit and control a light beam having a predetermined shape to form a first conductive path extending from the first comb electrode to a first test pad of the circuit board; employing a second light beam control unit to emit and control a light beam having a predetermined shape to form a second conductive path between the second comb electrode and a second test pad of the circuit board; employing a first laser plasma switch control unit to control conduction between the first test pad and an end of the first conductive path; employing a second laser plasma switch control unit to control conductive between the second test pad and an end of the second conductive path; and employing a resistance measurement unit to measure a resistance value between the other end of the first conductive path involving the first comb electrode and the other end of the second conductive path involving the second comb electrode.

According to the present invention, there is provided a method of testing a circuit board having wiring patterns and traces with pads in an apparatus, having a unit for holding the circuit board, wherein the method comprises the steps of positioning a conductive area facing the circuit board with a predetermined gap therebetween, to cover an area of the circuit board where all test pads are disposed; dividing the conductive area into a plurality of conductive sections that are electrically isolated from one another; connecting at least one of the conductive sections to a first power source; connecting another of the conductive sections to a second power source whose potential is lower than that of the first power source; forming conductive paths between test pad positions and the power sources; employing a laser plasma switch control unit to emit laser beams toward spaces between at least two test pads and the conductive sections and make the spaces conductive; and employing an electrical characteristics detection unit to detect the electrical characteristics of the conductive paths.

Further, according to the present invention, there is also provided a method of testing a circuit board having wiring patterns and traces with pads in an apparatus, having a unit for holding the circuit board, wherein the method comprises the steps of arranging a first conductive section facing the circuit board held by the holding unit with a predetermined gap therebetween, to secure conduction between a position of a first test pad on a trace of the circuit board and a first power source; arranging a second conductive section facing the circuit board held by the holding unit with a predetermined gap therebetween, to secure conduction between a position of a second test pad on another trace of the circuit board and a second power source, the second conductive section being isolated from the first conductive section; employing a laser plasma switch control unit to emit a laser beam toward a first space between the first test pad and the first conductive section and another laser beam toward a second space between the second test pad and the second conductive section, to make the first and second spaces conductive; and employing an electrical characteristic value sampling unit connected to at least one of the first and second conductive sections, to test the electrical characteristics of the circuit board.

In addition, according to the present invention, there is provided a method of testing a circuit board having wiring patterns and traces with pads in an apparatus having a unit for holding the circuit board, wherein the method comprises the steps of forming a first conductive path between a position corresponding to a first test pad on a trace on one face of the circuit board and a first power source; forming a second conductive path between a position corresponding to a second test pad on a trace, which is the same or different from the trace containing the first test pad, on another face of the circuit board and a second power source whose potential is lower than that of the first power source; employing a laser plasma switch control unit to emit a laser beam to a first space between the first test pad and the first conductive path and another laser beam toward a second space between the second test pad and the second conductive path, to make the first and second spaces conductive; and employing an electrical characteristic value sampling unit connected to one of the first and second conductive paths, to measure electrical characteristic values of the circuit board.

BRIEF DESCRIPTION OF THE DRAWINGS

The present invention will be more clearly understood from the description of the preferred embodiments as set forth below with reference to the accompanying drawings, wherein:

FIGS. 17A and 17B show an apparatus for testing a circuit board according to an embodiment of the third aspect of the present invention;

FIG. 18 explains an operation of positioning a light beam according to the embodiment of FIGS. 17A and 17B;

FIG. 19 shows waveforms of test sequences according to the embodiment;

FIG. 20 explains a case requiring no light beam according to the embodiment;

FIGS. 22A and 22B are flowcharts showing steps of testing a circuit board according to the third aspect of the present invention;

FIGS. 23A to 23D show essential parts of an apparatus for testing a circuit board according to a fourth aspect of the present invention, wherein FIG. 23A is a plan view showing a path forming unit of the circuit board tester, FIG. 23B is a plan view showing a parallel shift of the path forming unit; and FIGS. 23C and 23D are sectional views showing the path forming unit;

FIG. 24 explains a principle of measuring electric characteristics according to the fourth aspect of the present invention;

FIGS. 25A to 25C explain a method of measuring insulation resistance between pads according to the fourth aspect of the present invention, wherein FIG. 25B shows pairs of test pads;

FIG. 29A shows relationships between the positions of a slit of the apparatus of the fourth aspect of the present invention and test pads;

FIG. 29B shows relationships between pairs of test pads and the positions of the slit;

FIGS. 30A to 30C are flowcharts showing steps of measuring the electric characteristics of a circuit board according to the fourth aspect of the present invention;

DESCRIPTION OF THE PREFERRED EMBODIMENTS

The embodiments of the present invention will be explained in detail with reference to the-drawings.

Figure 1:
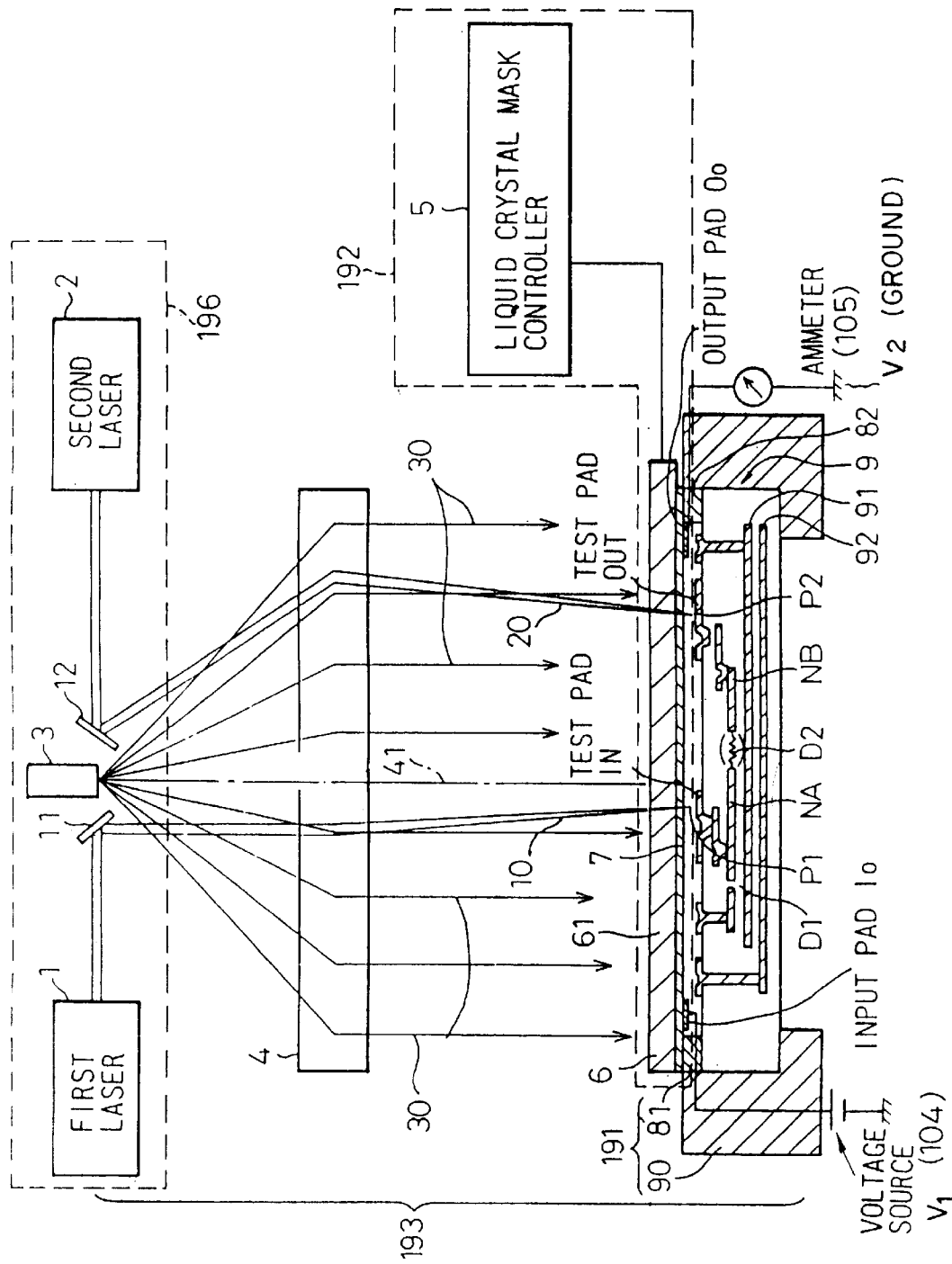
FIG. 1 shows a principle of an apparatus for testing a circuit board according to a first aspect of the present invention.

FIG. 1 shows a principle of an apparatus for testing a circuit board according to the first aspect of the present invention. The circuit board 9 has traces such as NA and NB each involving pads such as "TEST PAD IN" and "TEST PAD OUT".

The apparatus has a holder 191, a detector 193, and a laser plasma switch controller 196. The holder 191 has a casing 90 and spacers 81 and 82, to hold the circuit board 9.

The detector 193 has a path forming unit 192 spaced away from the circuit board 9 by a predetermined distance. The path forming unit 192 forms a first conductive path 71 between a position S1 corresponding to a first pad, e.g., the pad IN on a trace of the circuit board 9 and a high-potential first power source V1, as well as a second conductive path 72 between a position S2 corresponding to a second pad, e.g., the pad OUT on another trace of the circuit board 9 and a low potential level V2 that is at, for example, a ground level lower than the level of the first power source V1.

The laser plasma switch controller 196 emits laser beams 10 and 20 toward a first space 194 between the first pad IN and the first conductive path 71 and a second space 195 between the second pad OUT and the second conductive path 72, to make the first and second spaces 194 and 195 conductive.

The detector 193 has an ammeter or voltmeter voltmeter or an ammeter connected to one of the first and second conductive paths 71 and 72, for obtaining electrical characteristic values.

The apparatus involves first and second lasers 1 and 2, the first and second laser beams (pulse laser beams) 10 and 20, first and second deflection mirrors (galvanomirrors) 11 and 12, and deflection mirrors 11' and 12' cooperating with the first and second deflection mirrors 11 and 12. The apparatus also involves a light source 3, a scan lens 4, a liquid crystal mask controller 5, a liquid crystal mask 6, a photoconductive sheet 7, uniform light 30 provided by the light source 3 to excite the photoconductive sheet 7, an optical axis 41 of the scan lens 4, and the spacers 81 and 82.

The circuit board 9 includes a ground layer 91, a power source layer 92, a conduction defect D1, and an insulation defect D2. The laser beams 10 and 20 excite plasma switches P1 and P2 in the spaces 194 and 195.

The trace NA involves the pad IN and the trace NB involves the pad OUT. The circuit board 9 has the conduction defect D1 to be detected by a conduction test and the insulation defect D2 to be detected by an insulation test.

The photoconductive sheet 7 or a glass plate coated with a photoconductive film is arranged above the circuit board 9 with a gap of several tens of micrometers between them. The liquid crystal mask 6 for selectively passing light beams is fixed to the photoconductive sheet 7. The scan lens 4 and deflection mirrors 11 and 12 separately converge, deflect, and position the laser beams 10 and 20 in X and Y directions (the Y direction is not shown). The light source 3 is used to excite the photoconductive sheet 7. The lasers 1 and 2 emit pulse laser beams toward the deflection mirrors 11 and 12, respectively.

Figure 2:
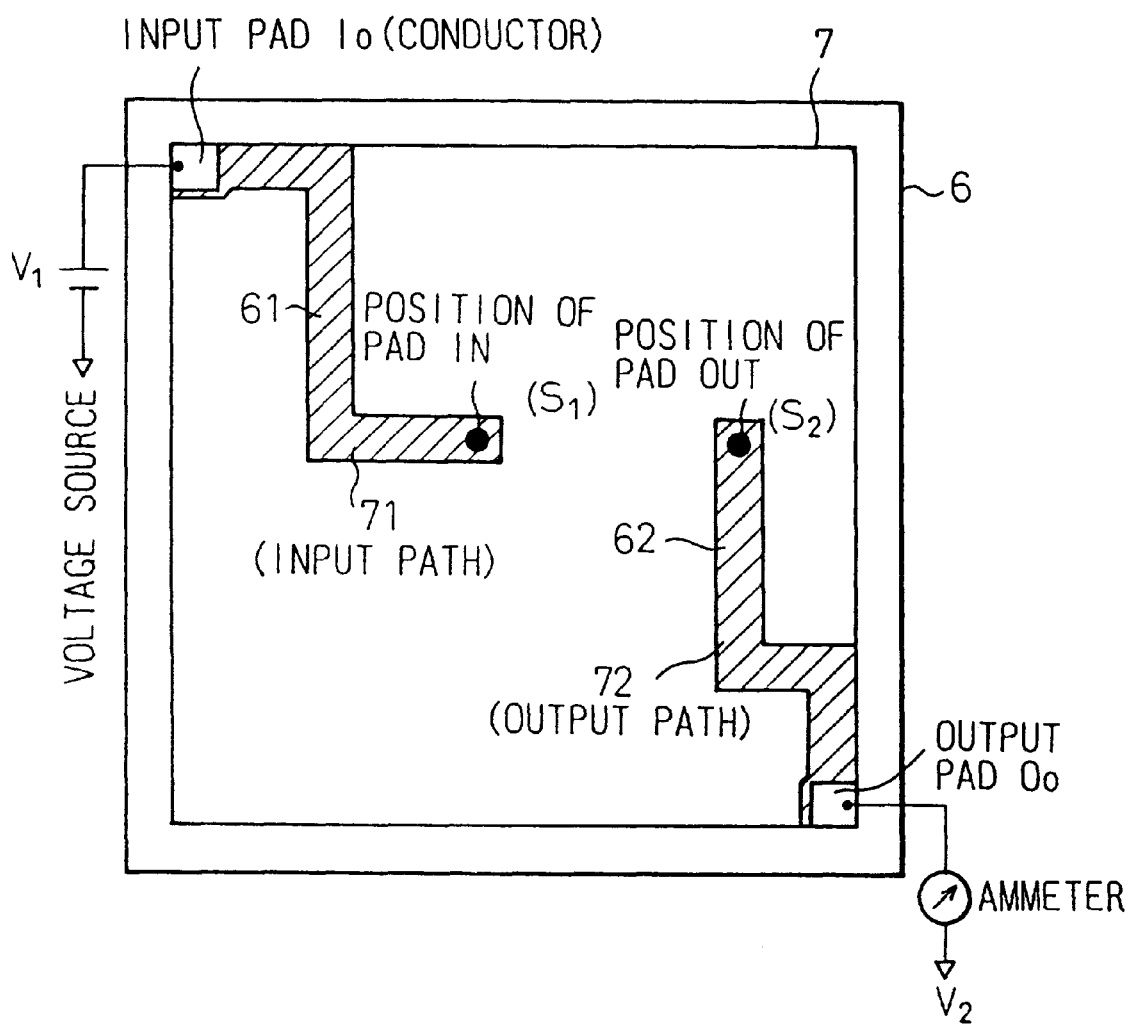
FIG. 2 explains operations of the apparatus of FIG. 1.
Figure 3:
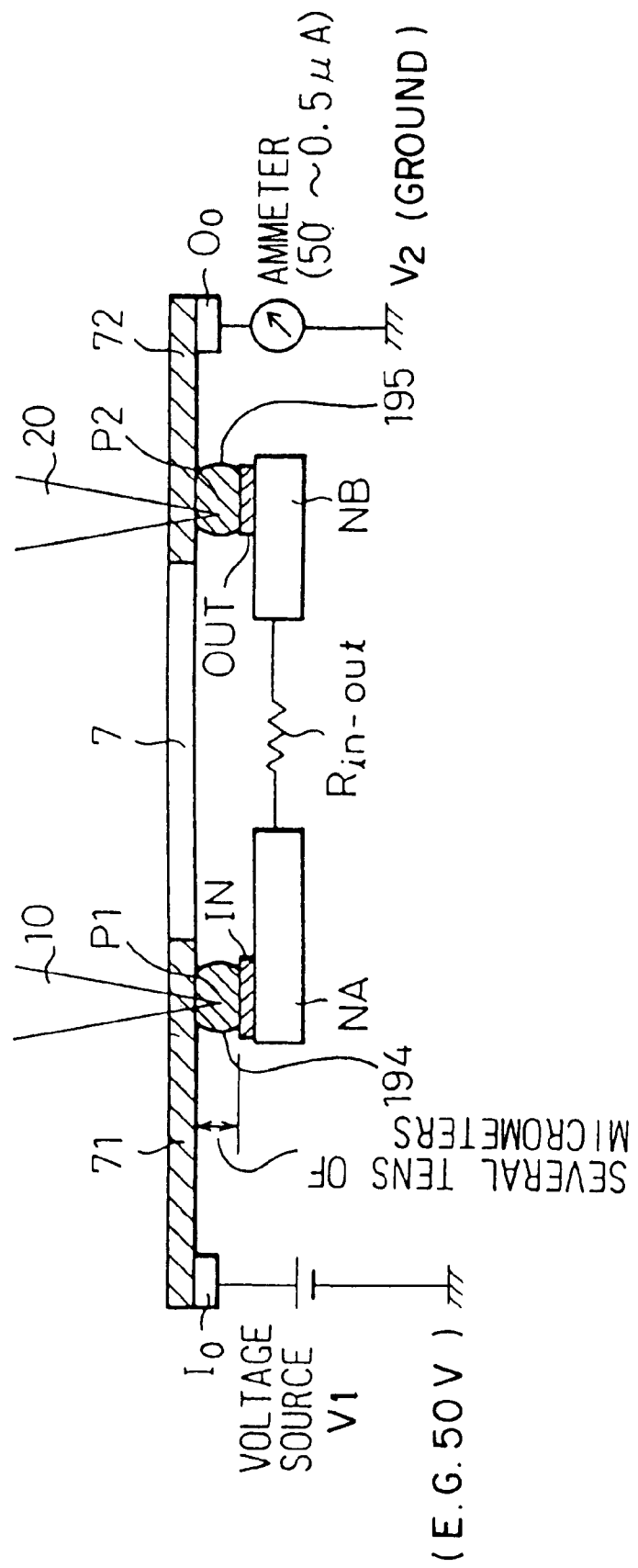
FIG. 3 explains operations of the apparatus of FIG. 1.

FIGS. 2 and 3 explain operations of the apparatus of FIG. 1 when measuring resistance between the pads IN and OUT and determining whether or not insulation between the pads is good.

The liquid crystal mask controller 5 forms light transmission patterns 61 and 62 in the liquid crystal mask 6, as shown in FIG. 2. The light 30 from the light source 3 transmits the patterns 61 and 62 and irradiates the photoconductive sheet 7. As a result, the conductive paths 71 and 72 corresponding to the patterns 61 and 62 are formed on the photoconductive sheet 7. The conductive path 71 extends from an input pad (a first electrode pad) Io to a position just above the pad IN. The conductive path 72 extends from a position just above the pad OUT to an output pad (a second electrode pad) Oo.

The pulse laser beams 10 and 20 are controlled to irradiate the pad positions indicated with black dots in FIG. 2. The laser beams 10 and 20 excite the plasma switches P1 and P2 in the spaces 194 and 195 as shown in FIG. 3, to momentarily make the input path 71 conductive with the pad IN, and the output path 72 conductive with the pad OUT. This forms an electrical path from the input pad Io to the pad IN and an electrical path from the pad OUT to the output pad Oo.

Accordingly, a current flows from a voltage source connected to the input pad Io, passes through the pads IN and OUT, and reaches the output pad Oo. This current is dependent on resistance (in this case, insulation resistance) between the pads IN and OUT. Accordingly, a resistance value Rmes between the pads Io and Oo is calculable by measuring the output current just after the application of the pulse laser beams. Then, an insulation resistance value Rin-out between the pads IN and OUT is calculable by subtracting resistance values Rin and Rout of the paths 71 and 72, and twice an ON resistance value Rlps of the laser plasma switch, from the resistance value Rmes.

Figure 4:
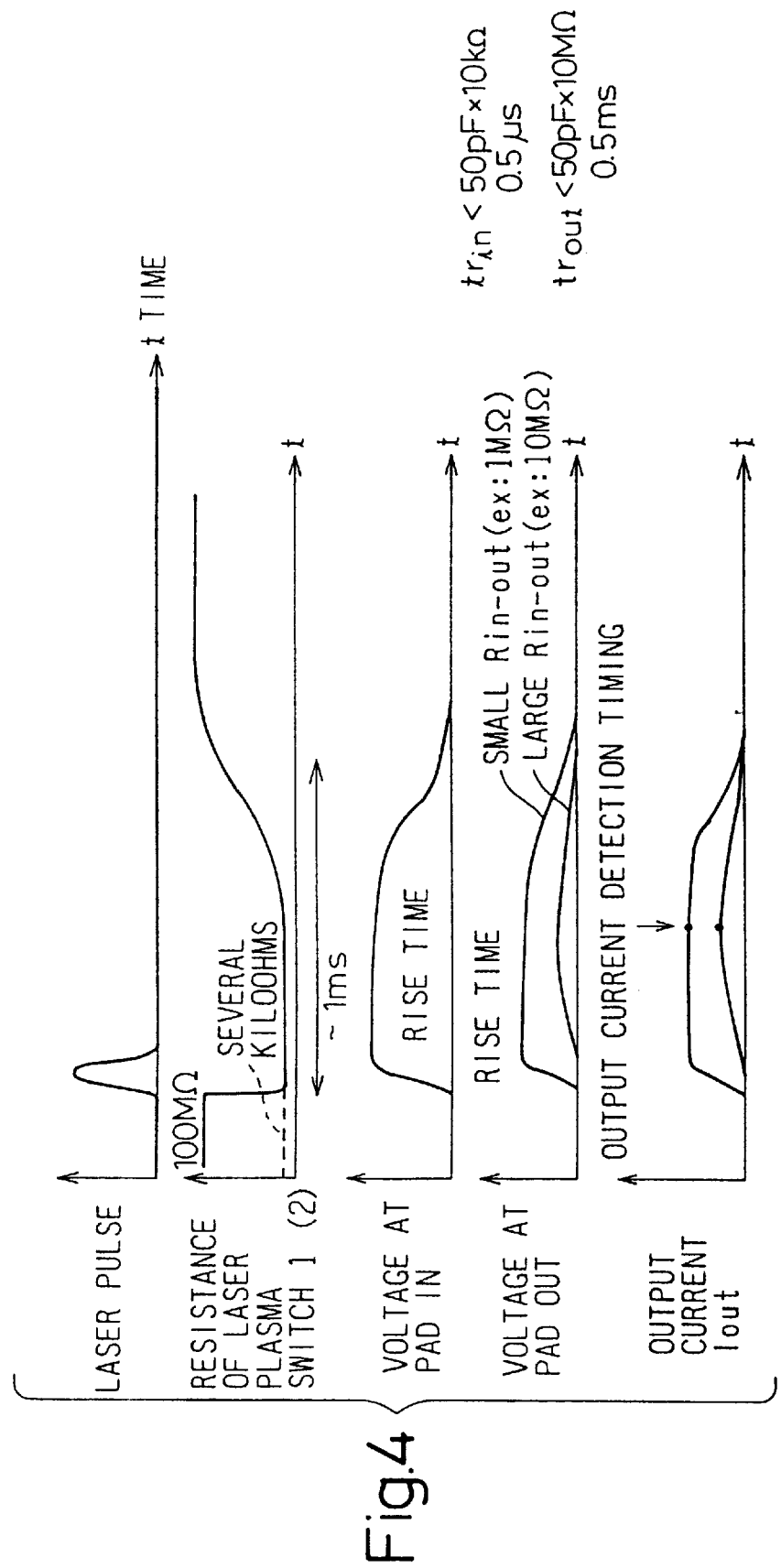
FIG. 4 explains a principle of measuring resistance between pads according to the present invention.
Figure 5:
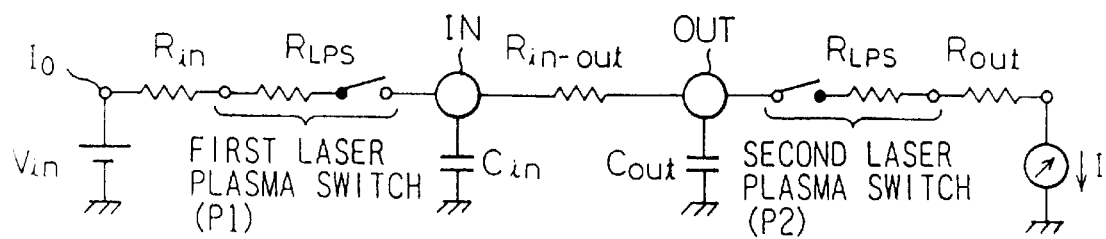
FIG. 5 explains a principle of measuring resistance between pads according to the present invention.

FIGS. 4 and 5 explain a principle of measuring resistance between pads of a circuit board by the apparatus of the present invention, in. which FIG. 4 shows changes in resistance values, voltages, and currents at various parts after forming input and output paths and emitting pulse laser beams, and FIG. 5 shows an equivalent circuit to measure an insulation resistance value between a pair of pads (IN and OUT). The laser beams 10 and 20 are simultaneously emitted toward the pads IN and OUT, to excite, i.e., to lower resistance values of the laser plasma switches P1 and P2.

When a laser is emitted toward two conductors, plasma is produced between the conductors, which are electrically connected to each other accordingly. This is a known ionization phenomenon of gas such as air, argon, and xenon due to a laser beam excitation. This phenomenon is described in, for example, "Laser Engineering," pp. 207 onward, December 1972, supervised by Yoshihiro Asami, Publishing Dept. of Tokyo Denki University. According to this document, the power of a laser beam of discharging a gas and generating plasma is dependent on the wavelength of the laser beam. With a wavelength in the range of 500 to 700 nanometers, the laser beam needs maximum power to produce plasma. Namely, this wavelength hardly produces enough plasma to turn on a laser plasma switch. With a wavelength over one micrometer or below 300 nanometers, the laser beam needs little power to produce plasma. In this case, the laser plasma switch is turned on with laser beam power of about $\frac{1}{5}$ to $\frac{1}{10}$ of the former case. Accordingly, the present invention employs a laser beam of one to two micrometers in wavelength, to provide large output power.

Don L. Millard et al. disclose a switch employing this phenomenon in "Noncontact Testing of Circuits Via a Laser-Induced Plasma Electrical Pathway," IEEE Design & Test of Computers, March 1992, p 55. This technique places an electrode having a center opening opposite to an electrode to be measured. A pulse laser beam is emitted through the opening of the electrode, to produce laser plasma to make the opening electrode conductive with the objective electrode. The voltage of the opening electrode, i.e., a waveform applied to the objective electrode is observed on an oscilloscope for several tens of microseconds to 100 microseconds.

The apparatus according to the first aspect of the present invention forms laser plasma switches on a photoconductive sheet and forms a closed circuit with optional conductive patterns in a noncontact manner. The closed circuit is employed to speedily and accurately measure resistance.

Referring to FIGS. 4 and 5, a problem of the noncontact measuring technique is that resistance to be measured is affected by electrostatic capacitance values Cin and Cout of traces. According to the first aspect of the present invention, the influence of the electrostatic capacitance is instantaneous on rise times "trin" and "trout." In a predetermined time after emitting pulse laser beams, voltage and current values become purely dependent on insulation resistance. If an ON period of the laser plasma switch is about one millisecond, the electrostatic capacitance will never influence the measurement of resistance if a current is sampled about 0.5 milliseconds after emitting pulse laser beams.

The resistance values Rin and Rout are easily calculable according to an experimentally obtained resistance value per unit length of the photoconductive sheet 7 and the length of the path 71 or 72 calculated from data used for forming the patterns 61 and 62 on the liquid crystal mask 6. The ON resistance Rlps of the laser plasma switch is experimentally obtained. The accuracy of measurement of the resistance between the pads IN and OUT is influenced by fluctuations in the resistance values Rin, Rout, and Rlps. These resistance values can be suppressed to several kilohms, to provide corresponding accuracy in measuring the resistance. Namely, the present invention is capable of carrying out a test with an accuracy of several kilohms, and this accuracy is quite sufficient to test whether or not insulation is good.

Figure 6A:
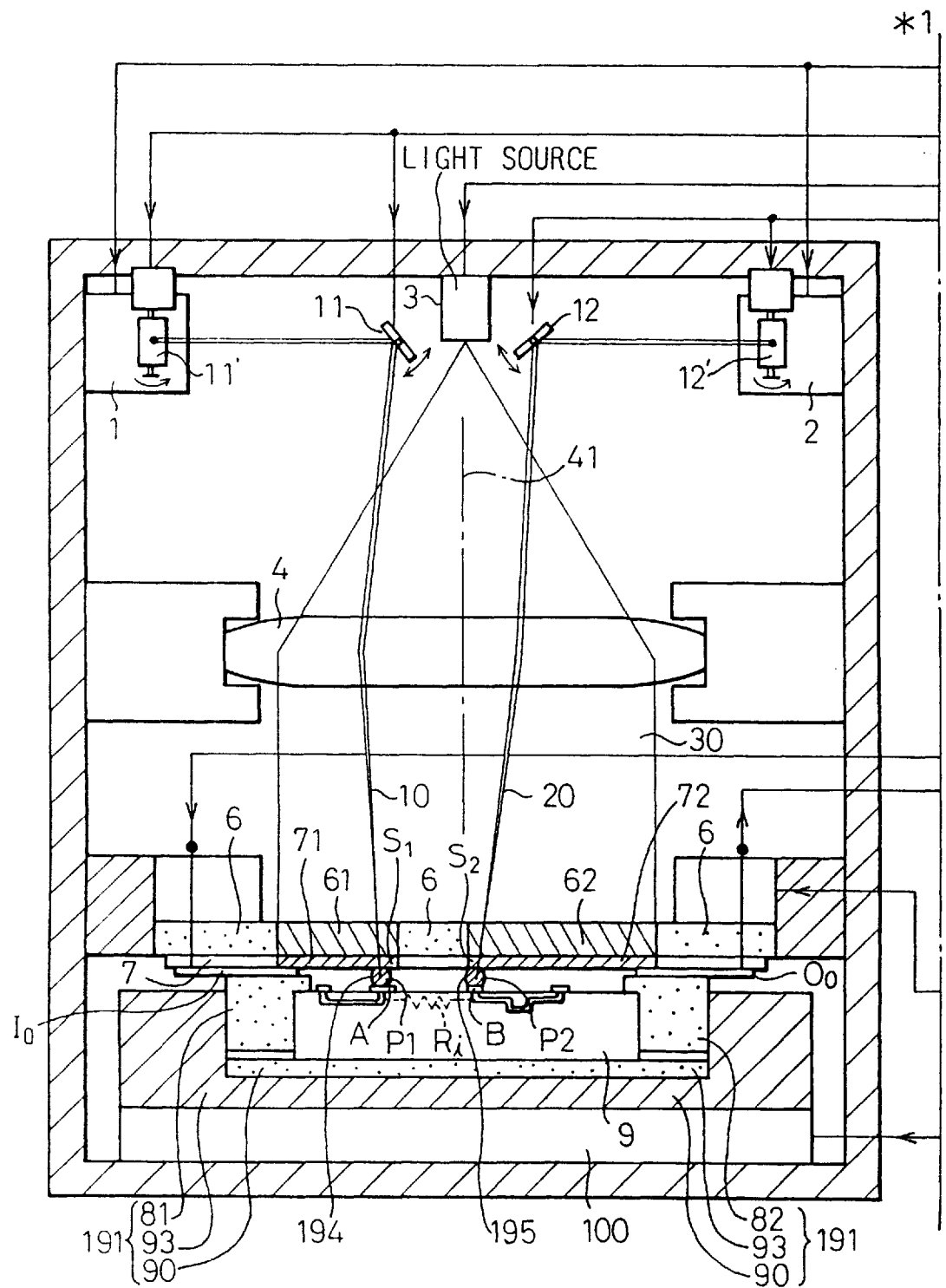
FIGS. 6A and 6B show an apparatus for testing a circuit board according to an embodiment of the first aspect of the present invention.
Figure 6B:
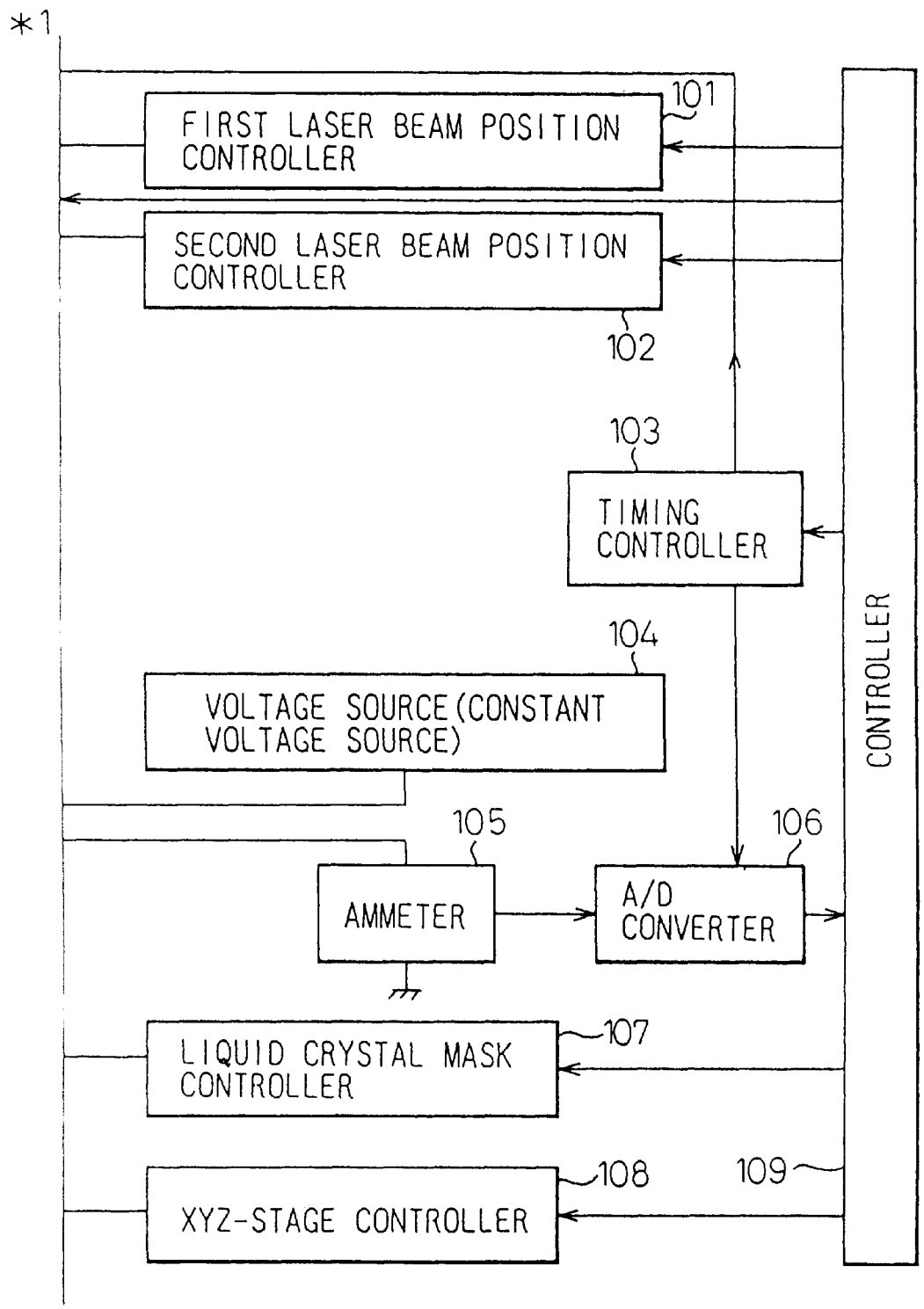

FIGS. 6A and 6B shows an apparatus for testing a circuit board according to an embodiment of the first aspect of the present invention. The apparatus involves a first laser 1, a second laser 2, first and second laser beams 10 and 20, galvanomirrors 11, 11', 12, and 12' for deflecting the laser beams 10 and 20, a light source 3, a scan lens 4, a liquid crystal mask 6, a photoconductive sheet 7, and a circuit board 9 to be tested. The light source 3 emits uniform light 30 to excite the photoconductive sheet 7. The apparatus also includes insulation spacers 81 and 82, a casing 90, and an insulation sheet 93, to form a holder for holding the circuit board 9.

The apparatus also involves an XYZ stage 100, a first laser position controller 101, a second laser position controller 102, a timing controller 103, a constant voltage source 104, an ammeter 105, an A/D converter 106, a liquid crystal mask controller 107, an XYZ stage controller 108, and a controller 109.

The galvanomirrors 11 and 12 deflect the laser beams 10 and 20, respectively. The galvanomirrors 11 and 12 are equally distanced from an optical axis 41 of the scan lens 4 on a plane orthogonal to the optical axis 41 and adjacent to a focus of the scan lens 4. The light source 3 is arranged between the galvanomirrors 11 and 12.

The controller 107 controls the liquid crystal mask 6 to form conductive paths 71 and 72 on the photoconductive sheet 7. The constant voltage source 104 is connected to an input pad Io of the sheet 7. The current detector (ammeter) 105 is connected to an output pad Oo of the sheet 7. The first pulse laser beam 10 is positioned on a first test pad A, and the second pulse laser beam 20 on a second test pad B. The pulse laser beams 10 and 20 are simultaneously emitted. Just after the emission of these beams, a current is measured. These processes are repeated to determine whether or not insulation of the circuit board 9 is good.

Operations of the embodiment of FIGS. 6A and 6B will be explained in connection with an insulation test.

The circuit board 9 is placed on the insulation sheet 93 in the casing 90. The insulation spacers 81 and 82 are placed on the circuit board 9. The casing 90 with the circuit board 9 is mounted on the XYZ stage 100. The coordinate systems of the liquid crystal mask 6 and deflectors are adjusted in relation to each other in advance. These coordinate systems are adjusted in relation to the coordinate system of the circuit board 9. The constant voltage source 104 is always connected to the input pad Io, and the ammeter 105 is connected to the output pad Oo. The light source 3 is turned on.

The liquid crystal mask controller 107 controls the transmissivity of each pixel of the liquid crystal mask 6, to form a light transmission pattern 61 extending from the input pad Io to the first test pad A and a light transmission pattern 62 extending from the second test pad B to the output pad Oo. These patterns are formed according to design data for the circuit board 9 stored in the controller 109. It is preferable to form the patterns to be as short as possible. The uniform light 30 transmits only the light transmission patterns 61 and 62 of the liquid crystal mask 6, to form the input path (first conductive path) 71 and output path (second conductive path) 72 on the photoconductive sheet 7. The photoconductive sheet 7 may be made from gallium arsenide (GaAs), amorphous silicon, or photoconductive material employed by electrophotography. The liquid crystal mask 6 may employ an optical system to condense or expand transmission light onto the photoconductive sheet 7.

According to the design data of the circuit board 9 stored in the controller 109, the first laser position controller 101 positions the first laser beam 10 on the test pad A, and the second laser position controller 102 positions the second laser beam 20 on the test pad B. The timing controller 103 provides a pulse signal for controlling the first and second laser beams 10 and 20, to make a space 194 between the input path 71 and the pad A and a space 195 between the pad B and the output path 72 conductive for a predetermined interval. This interval is, for example, about several hundreds of microseconds to one millisecond.

In the embodiment of FIGS. 6A and 6B, the laser beams 10 and 20 are emitted from the lasers 1 and 2, respectively. These beams may be provided by dividing a common laser beam using a beam splitter. Each of the lasers 1 and 2 emits a pulse laser beam of about one micrometer in wavelength. Each of the lasers 1 and 2 may be a mode lock laser, and a shutter for intermittently blocking a laser beam is provided by the mode lock laser. Alternatively, each of the lasers may be a Q-switch laser.

About 0.5 milliseconds after the emission of the laser beams 10 and 20, the timing controller 103 provides a sampling trigger signal. In response to this signal, the A/D converter 106 converts an output current value into digital data, which is transmitted to the controller 109. According to the data, the controller 109 calculates a resistance value between the test pads A and B. To compensate for the resistance of the input and output paths 71 and 72, the lengths of the paths 71 and 72 are calculated. To measure resistance between the input and output pads Io and Oo of the photoconductive sheet 7, an AC signal of sine wave or pulse wave is applied to the input pad Io, and the maximum amplitude of an output current waveform provided by the output pad Oo relative to ground is detected. The resistance between the input and output pads Io and Oo is calculated according to a ratio between the input voltage, or the amplitude of the input voltage waveform and the detected output current value.

This completes the insulation test between the test pads A and B. In practice, the pad A is successively tested with respect to pads C, D, and so on on other traces. The liquid crystal mask 6 is controlled to change only the output path pattern 62. At the same time, only the position of the second laser beam 20 is changed to, for example, the pad C, and the processes mentioned above are repeated.

Figure 7:
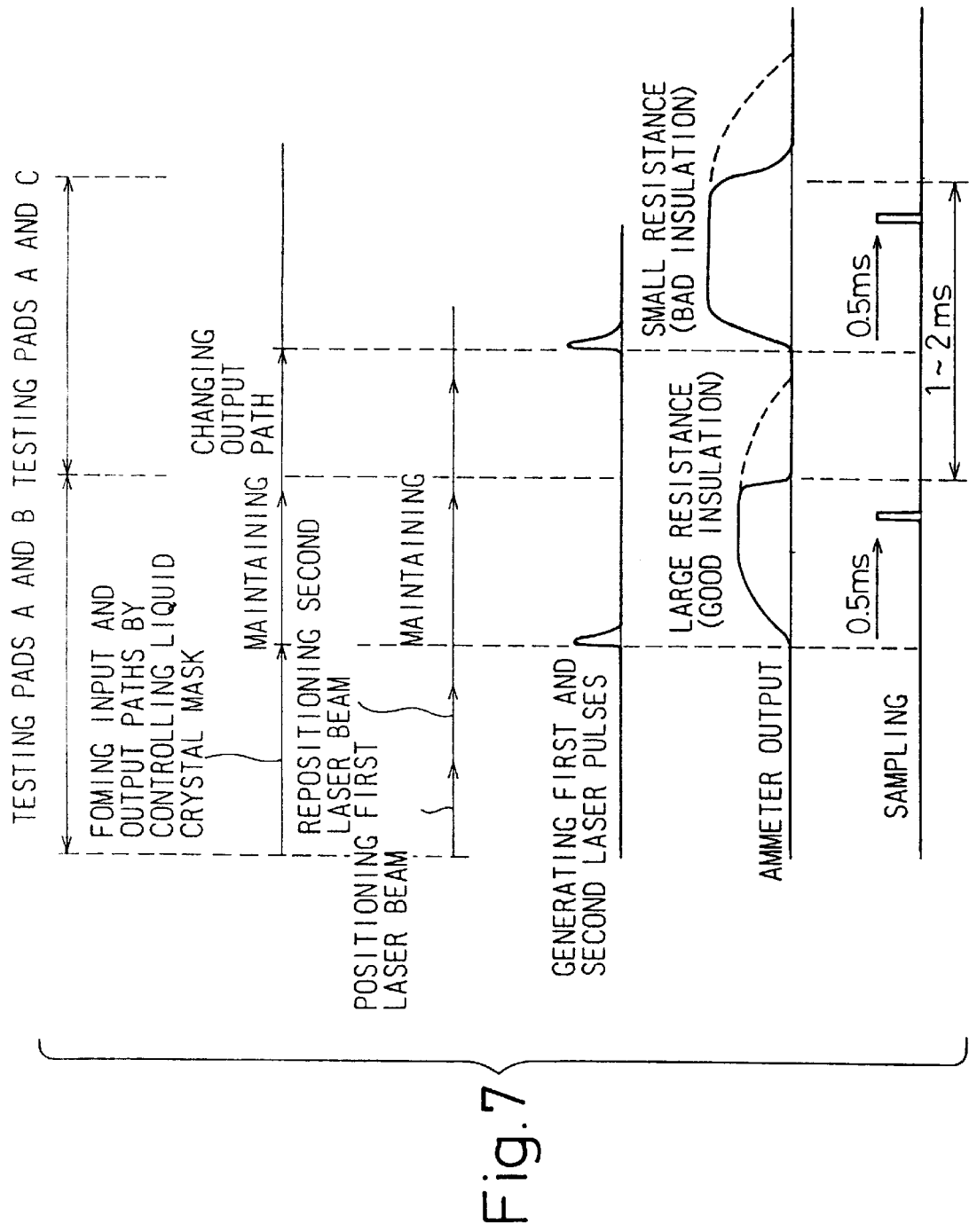
FIG. 7 shows waveforms of test sequences carried out by the apparatus of the present invention.

FIG. 7 shows waveforms showing test sequences according to the first aspect of the present invention. These sequences are only models. In practice, the output path 72 is changed to deal with the next test pad C after sampling an output current related to the present test pad. In this case, a value detected by the ammeter suddenly drops to zero when the output path 72 is changed. Each cycle of the sequences for measuring a resistance value between a pair of test pads requires about one to two milliseconds. After all pairs involving the pad A are tested, the first laser beam 10 is shifted to the next pad, and the sequences mentioned above are repeated.

This embodiment arranges the lasers, scan mirrors (galvanomirrors), and scan lens in this order. It is possible to arrange the lasers, convergent lenses, and scan mirrors in this order.

As explained above, the apparatus according to the first aspect of the present invention employs the electrically controllable liquid crystal mask to form input and output paths. Laser beams are emitted, simultaneously or one after another, toward two test pads on a circuit board, to electrically connect the input path to one of the pads and the output path to the other pad. Then, conduction or insulation between the pads is tested in a noncontact manner.

Namely, the apparatus according to the first aspect of the present invention employs the technique of freely forming input and output paths on a photoconductive sheet to connect input and output pads to test pads of a circuit board, and the technique of activating laser plasma switches with laser beams, to make spaces between the input and output paths and the test pads conductive. With the combination of these techniques, the first aspect of the present invention instantaneously measures resistance between the input and output pads and calculates resistance between the test pads.

Accordingly, the first aspect of the present invention shortens an insulation test time, eliminates contact probes that are difficult to fabricate and unreliable in contact performance, and needs no vacuum degassing system. This aspect of the present invention involves no physical contact with test pads and measures resistance between the test pads with no influence of the electrostatic capacitance of the traces that contain the test pads. It is easy to narrow a laser beam to ten-odd micrometers and make the spatial resolution of a plasma switch equal to the length of a gap between a test pad and a conductive path. Accordingly, this aspect is capable of carrying out the insulation test on pads each of several tens of micrometers that are difficult to test by the multiple-probe tester of the prior art. The two- or four-probe tester according to the prior art requires mechanical movement for every test, to consume at least several hundreds of milliseconds per insulation test. On the other hand, the first aspect of the present invention completes the test within several milliseconds, to speed up the testing time at least by one order of magnitude compared with the prior art.

The apparatus according to the first aspect of the present invention basically requires no contact probes, nor vacuum degassing system, nor physical contact between test pads and a test head including transparent electrodes. The first aspect forms a closed circuit with a voltage source, power supplying input pad, photoconductive input path, first test pad, second test pad, photoconductive output path, output pad, and grounding electrode. According to a voltage applied to the circuit and a current flowing through the circuit, the first aspect measures a resistance value between the test pads with no influence of the electrostatic capacitance of the traces that contain the test pads.

A testing time is influenced by a laser plasma switching time, laser deflection time, and the S/N ratio of detected signals. The laser plasma switching time, i.e., the ON time of a laser plasma switch is in the range of 10 microseconds to one millisecond, and the settling time of a deflected laser beam is several hundred microseconds. Accordingly, a measurement of the resistance of a pair of test pads will be finished within one to two milliseconds, which is about 1/200 of 0.5 seconds required by the four-probe tester of the prior art.

The conductive path forming unit 192 preferably employs laser beam transmitting material, more preferably, photoconductive material.

The conductive path forming unit 192 preferably employs the photoconductive sheet 7 and a support 6' for supporting the sheet 7. The support 6' is preferably the liquid crystal mask 6 having a light transmission control function.

In this case, it is preferable to provide the support 6' with the light transmission pattern controller 5.

The detector 193 cooperates with the laser plasma switch controller 196, which involves the lasers 1 and 2 and deflectors 11 and 12.

The detector 193 includes the light source 3 for exciting the photoconductive sheet 7.

The detector 193 drives the laser plasma switch controller 196 to make the first and second spaces 194 and 195 conductive, and after a predetermined time, drives the sampler 197 to detect an electrical characteristic value in the conductive paths 71 and 72. The electrical characteristics detected by the detector 193 will be at least one of resistance, voltage, current, and insulation resistance.

An apparatus for testing a circuit board according to the second aspect of the present invention will now be explained.

The first aspect of the present invention explained above has some disadvantages. The ON resistance of the photoconductive sheet irradiated with light is relatively high and reaches from several hundred kilohms to several megohms when the length of a path formed on the photoconductive sheet extends for several tens of millimeters to several hundred millimeters. This ON resistance is an obstacle in the conductive path. When the photoconductive sheet is made from erbium (Er) doped GaAs, the ON resistance of a conductive path of one micrometer in length is about 100 ohms. According to a simple proportional calculation, it will reach several hundred kilohms if the length is several millimeters, and several megohms if the length is several tens of millimeters. When the ON resistance is several megohms, it widely fluctuates in the range of several hundred kilohms. This ON resistance is connected in series with resistance to be tested, to fluctuate the accuracy of the test by about several hundreds of kilohms.

Accordingly, the second aspect of the present invention forms a photoconductive sheet 7 with a plurality of transparent conductive film patterns. This shortens the actual length of a conductive path to be formed and reduces the ON resistance thereof.

Figure 8:
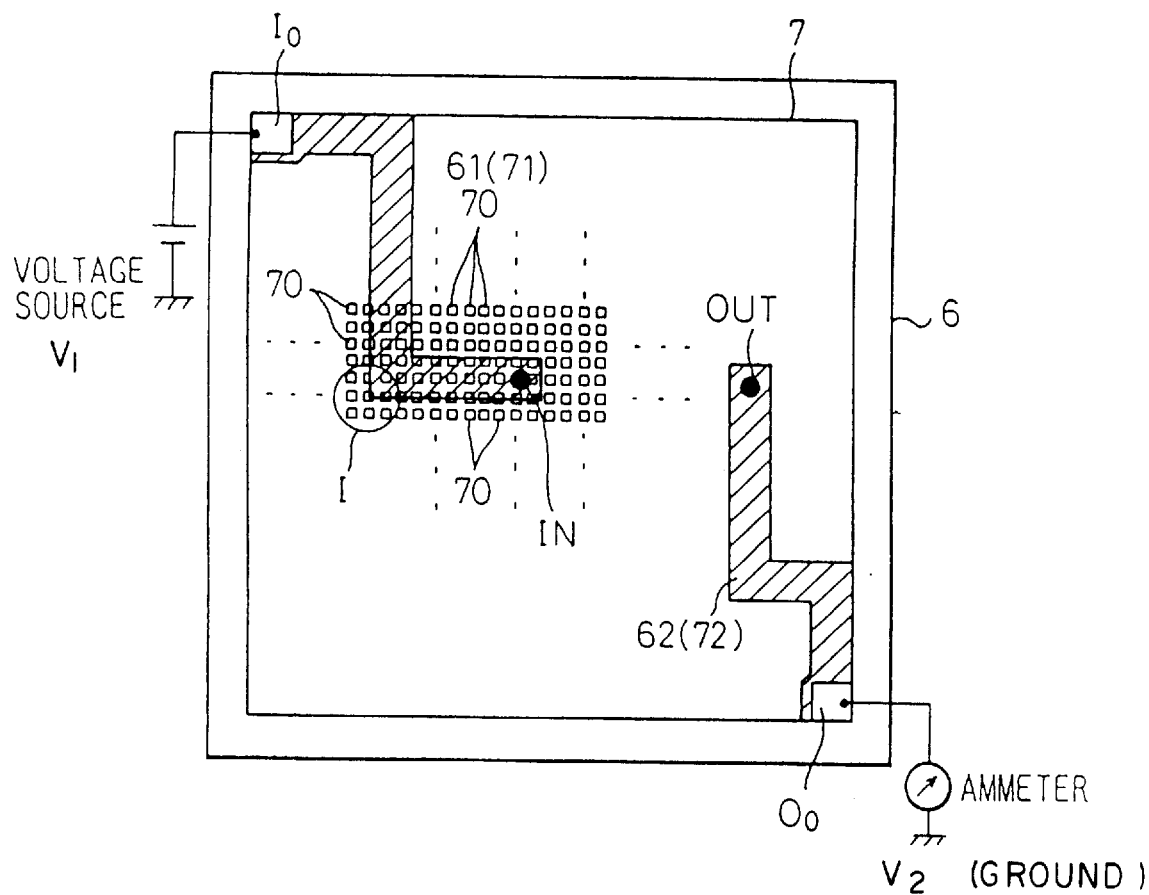
FIG. 8 shows a principle of an apparatus for testing a circuit board according to a second aspect of the present invention.
Figure 9:
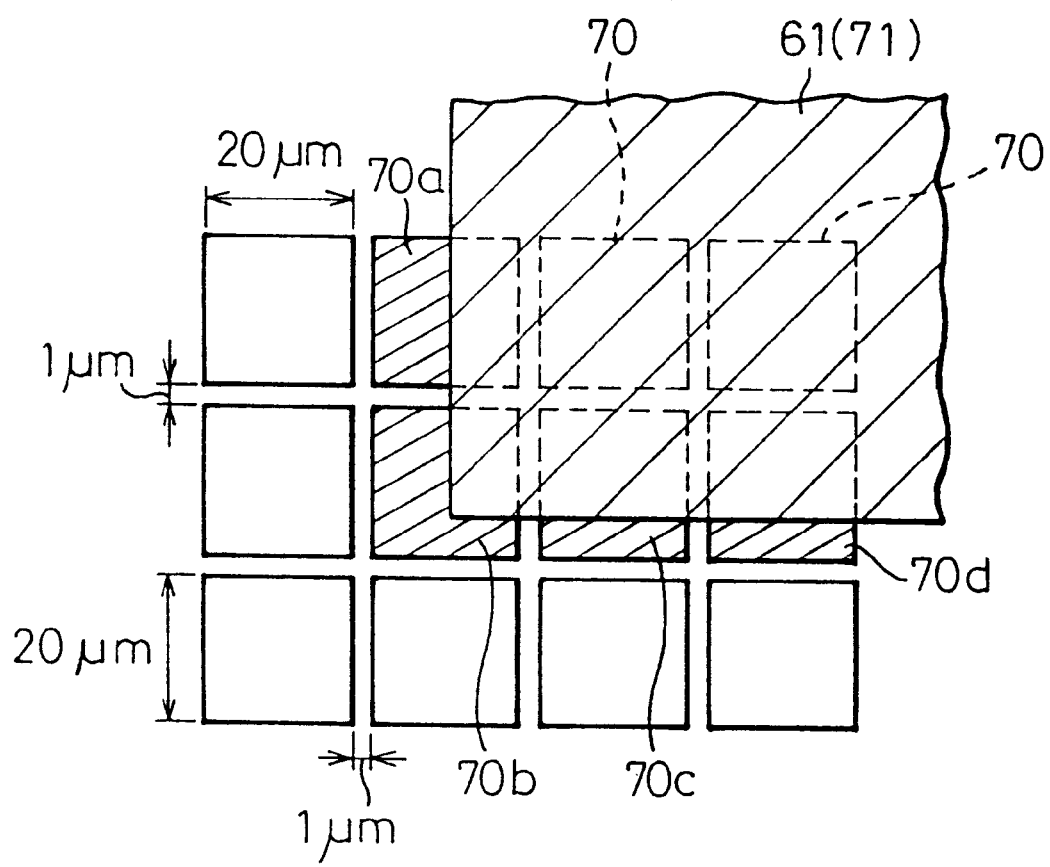
FIG. 9 is an enlarged view showing part of FIG. 8.

FIG. 8 corresponds to FIG. 2 and explains the principle of the second aspect of the present invention. FIG. 9 is an enlarged view showing part of FIG. 8.

In FIG. 8, the photoconductive sheet 7 according to the second aspect of the present invention is made from ITO (In2O3:Sn). Discrete transparent conductive film patterns 70 are formed at intervals of about one micrometer over the sheet 7. The size of each of the patterns 70 is, for example, 20 micrometers square. This arrangement reduces the actual length of a conductive path by the ratio of each pattern 70 to a space between the patterns 70.

In FIGS. 8 and 9, light transmission patterns 61 and 62 are formed on a liquid crystal mask 6, and conductive patterns 71 and 72 corresponding to the patterns 61 and 62 are formed on the photoconductive sheet 7. The film patterns 70 contained at least partly in the conductive paths 71 and 72 form the paths. More precisely, film patterns 70a, 70b, 70c, and 70d of FIG. 9 around the conductive path 71 have substantially the same potential as that of the conductive path 71. However, they cause no problem. The conductive path 71 extends from an input pad Io to a position just above a first test pad IN, and the conductive path 72 from a position just above a second test pad OUT to an output pad Oo.

In each of the conductive paths 71 and 72, the transparent conductive film patterns 70 have low resistance, and the photoconductive sheet 7 having relatively large resistance exists only between the film patterns 70. As a result, the ON resistance of the conductive paths 71 and 72 is reduced to 100 kilohms to several kilohms, i.e., one several tenths to several hundredths of that of the first aspect.

Similar to the first aspect, resistance values Rin and Rout of the paths 71 and 72 are easily obtained by experimentally finding the resistance of the conductive paths per unit length and by calculating the length of the paths 71 and 72 according to control data of the mask 6. When the paths 71 and 72 are made of Er-doped GaAs film patterns, the values Rin and Rout are reduced to several hundred kilohms or smaller due to the effect of the discrete film patterns 70 formed over the photoconductive sheet 7. The ON resistance Rlps of a laser plasma switch is experimentally obtained.

The accuracy of measurement of a resistance value between test pads is influenced by fluctuations in the resistance values Rin, Rout, and Rlps. Each of these resistance values is about several tens of kilohms, and a fluctuation in the resistance value is estimated as several tens of kilohms, that is about 10% of the resistance value. Accordingly, a conduction test may be carried out at an accuracy of about several tens of kilohms, which is sufficient for an insulation test.

Figure 10:
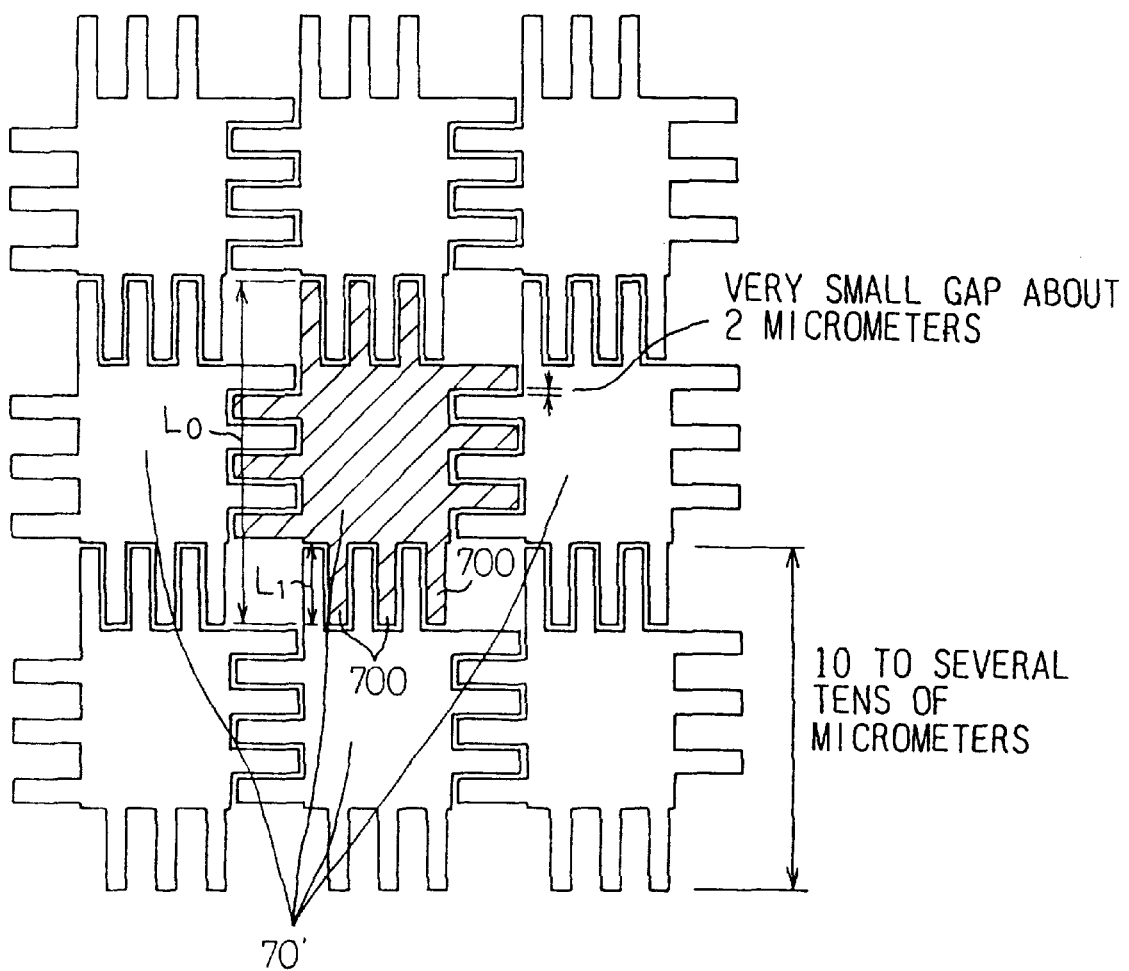
FIG. 10 shows transparent conductive film patterns of an apparatus for testing a circuit board according to an embodiment of the second aspect of the present invention.
Figure 11:
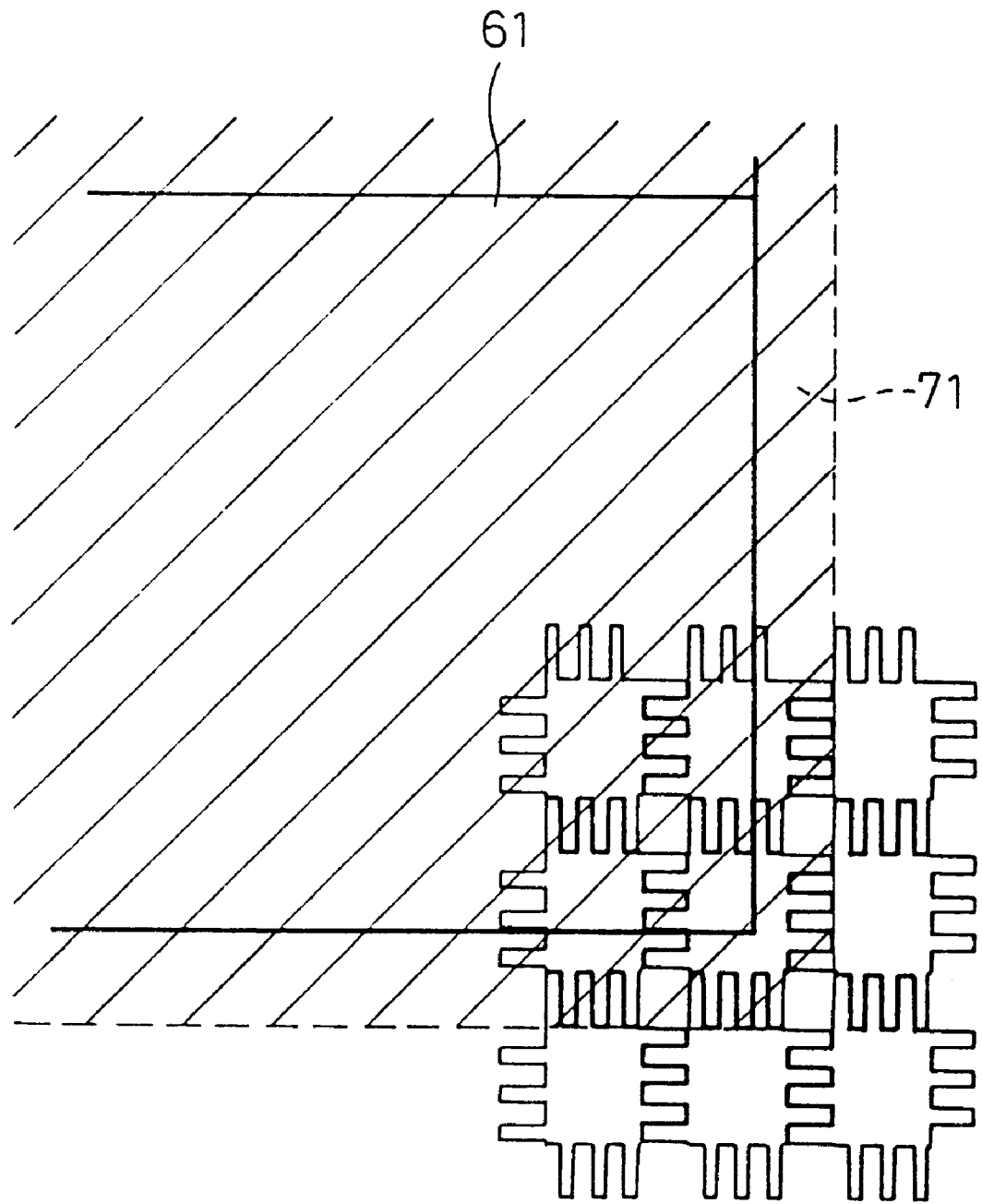
FIG. 11 shows the transparent conductive film patterns of FIG. 10 in use.

FIG. 10 shows transparent conductive film patterns 70' according to another embodiment of the second aspect of the present invention, and FIG. 11 shows an application of the film patterns of FIG. 10.

In FIG. 10, the discrete film patterns 70' are formed at predetermined pitches over a photoconductive sheet 7. The patterns 70' are made from ITO (In2O3:Sn). Each of the patterns 70' has a comb shape to mesh with four adjacent patterns 70'. The length L1 of a tooth 700 is, for example, one fourth the length Lo of the pattern 70'. The length Lo is, for example, ten micrometers to several tens of micrometers. This arrangement increases the effective width of a conductive path between the adjacent patterns 70' by several times that of the rectangular patterns 70 of FIG. 8. This results in decreasing ON resistance to a fraction of that of the patterns 70.

In FIG. 11, a light transmission mask (liquid crystal mask) 6 forms a light pattern 61, which forms a conductive path 71.

The spatial accuracy of the conductive path 71 is determined by the size of each pattern 70'. Accordingly, this embodiment causes an error of about ½ of the size of the pattern 70' in the accuracy of the path 71. If the size of the pattern 70' is 20 micrometers, the accuracy of the path 71 is within 10 micrometers. This provides sufficient spatial resolution because even a high-density circuit board involves a wiring width of about 50 micrometers and a pad of about 50 micrometers.

In this way, the apparatus according to the second aspect of the present invention employs a photoconductive sheet covered with transparent conductive film patterns, to reduce the actual length of a conductive path to be formed on the photoconductive sheet and lower the ON resistance of the path. More precisely, the second aspect of the present invention reduces the ON resistance by one to two orders of magnitude compared with that of the first aspect of the present invention. The second aspect, therefore, improves the accuracy of the insulation resistance test.

An apparatus for testing a circuit board according to the third aspect of the present invention will now be explained.

Figure 12:
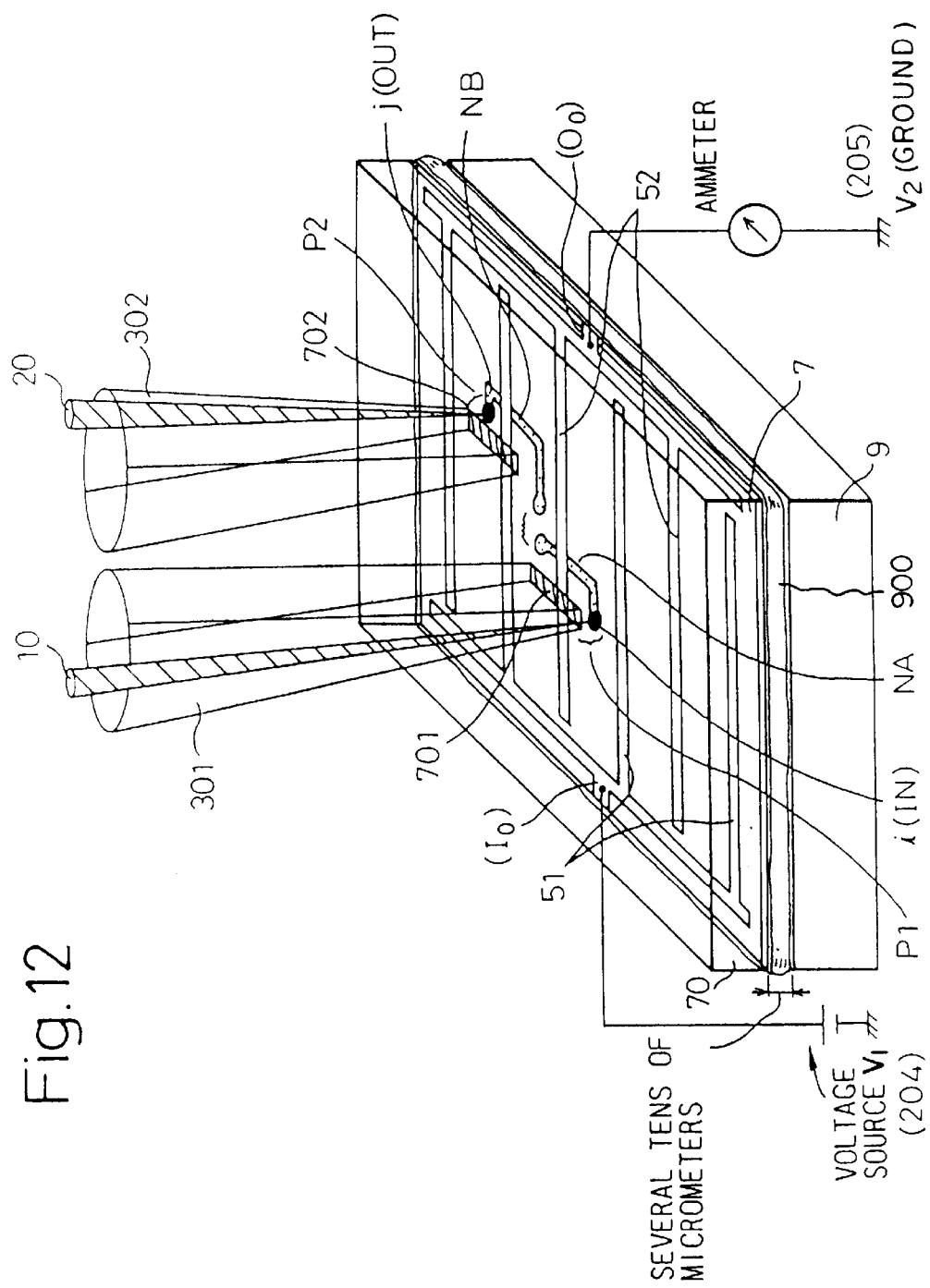
FIG. 12 shows a principle of an apparatus for testing a circuit board according to a third aspect of the present invention.
Figure 13:
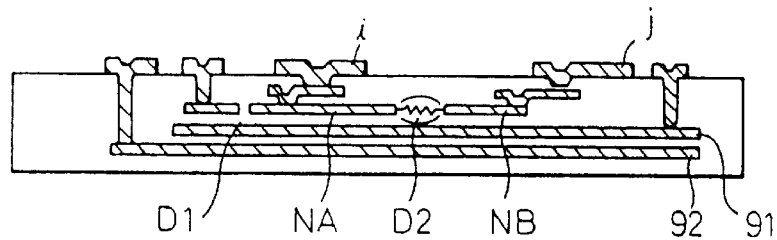
FIG. 13 is a sectional view showing a circuit board tested by the apparatus of FIG. 12.
Figure 14:
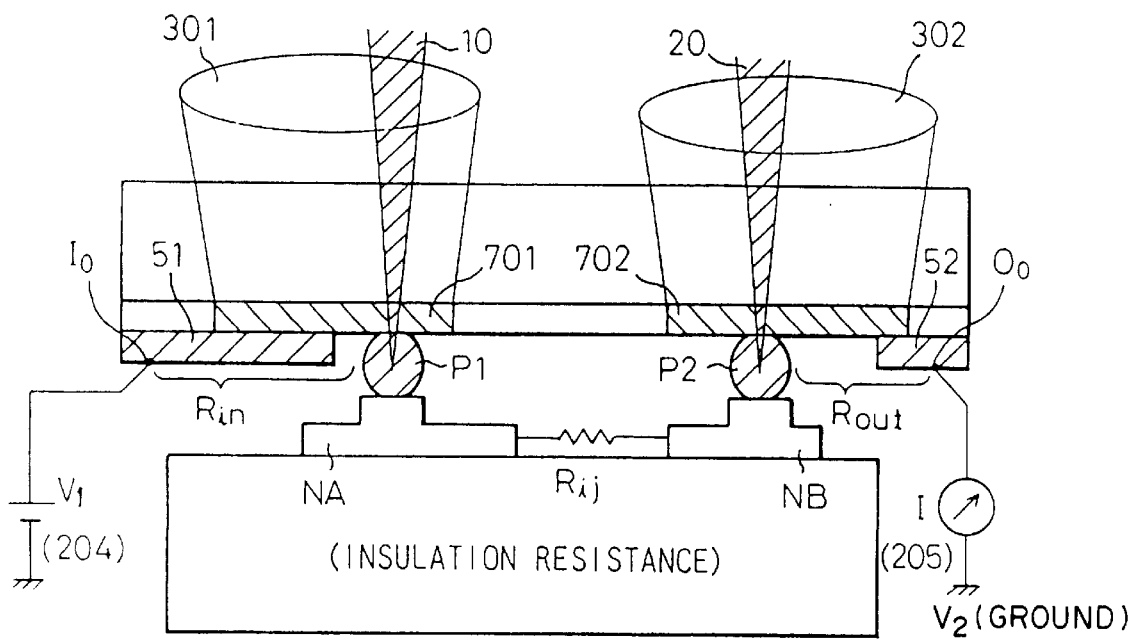
FIG. 14 explains operations of the apparatus of FIG. 12.

FIG. 12 shows a principle of the apparatus according to the third aspect of the present invention, FIG. 13 is a sectional view showing a circuit board to be tested, and FIG. 14 explains operations of the apparatus of FIG. 12.

The apparatus involves first and second laser beams (pulse laser beams) 10 and 20, first and second light beams 301 and 302 for exciting a photoconductive sheet 7, first and second transparent comb electrodes 51 and 52, first and second photoconductive patterns 701 and 702, and a circuit board 9 to be tested. The circuit board 9 includes a ground layer 91, a power source layer 92, a conduction defect D1, and an insulation defect D2. Marks P1 and P2 indicate plasma zones (laser plasma switches) excited by the laser beams 10 and 20, respectively.

FIG. 13 shows a first trace NA including a test pad i (IN) and a second trace NB including a test pad j (OUT). The conduction defect D1 will be found by a conduction test, and the insulation defect D2 will be found by an insulation test. A space between a glass plate 70 and the circuit board 9 may be sealed airtight with O-rings and filled with air or a rare gas such as argon or xenon under increased or decreased pressure.

The glass plate, i.e., test head 70 is coated with the photoconductive sheet 7 on which the first transparent comb electrode 51 serving as a power supply electrode and the second transparent comb electrode 52 serving as a detection electrode are formed. The test head 70 is positioned above the circuit board 9 and is spaced away from it by several tens of micrometers. The first light beam 301 irradiates the test head 70, to form the first photoconductive pattern 701, and the second light beam 302 irradiates the test head 70, to form the second photoconductive pattern 702. The first and second laser beams 10 and 20 also irradiate the test head 70, to activate the laser plasma switches P1 and P2.

Principle operations of measuring resistance between the first and second test pads i and j, to determine whether or not the test pads i and j are well insulated from each other will be explained next.

The first light beam 301 is emitted to cover the first test pad i and part of the first transparent comb electrode 51 nearest to the first test pad i, to form the first photoconductive pattern 701. At the same time, the second light beam 302 is emitted to cover the second test pad j and a part of the second transparent comb electrode 52 nearest to the second test pad j, to form the second photoconductive pattern 702. This forms a conductive path extending from a power supply pad Io to a position just above the first test pad i, and a conductive path extending from a position just above the second test pad j to a detection pad Oo.

The pulse laser beams 10 and 20 are simultaneously emitted to the pad positions indicated with large black dots in FIG. 12. The pulse laser beams 10 and 20 excite the laser plasma switches P1 and P2 between the test head 70 and the circuit board 9. As a result, the comb electrodes 51 and 52 become momentarily conductive to the test pads i and j, respectively, to form an electrical path extending from the power supply pad Io, passing through the test pads i and j, and reaching the detection pad Oo.

Each of the lasers 1 and 2 may comprise a mode lock laser for carrying out a continuous pulse operation and a shutter for intermittently blocking a laser beam provided by the laser. Alternatively, each of the lasers 1 and 2 may be a Q-switch laser.

A current from a voltage source 204 connected to the power supply pad Io flows through the test pads i and j and detection pad Oo and reaches ground. This current is dependent on an insulation resistance value Rij between the test pads i and j. A resistance value Rmes between the power supply pad Io and the detection pad Oo is calculable by measuring the output current when the pulse laser beams are emitted or at predetermined timing after the emission of the pulse laser beams. The insulation resistance value Rij is calculable by subtracting resistance values Rin and Rout of the electrodes and conductive paths and double the ON resistance Rlps of the laser plasma switch, from the resistance value Rmes. Namely, the insulation resistance value Rij is calculable according to the following formula:

Rij=Rmes−Rin−Rout−2×Rlps

Figure 15:
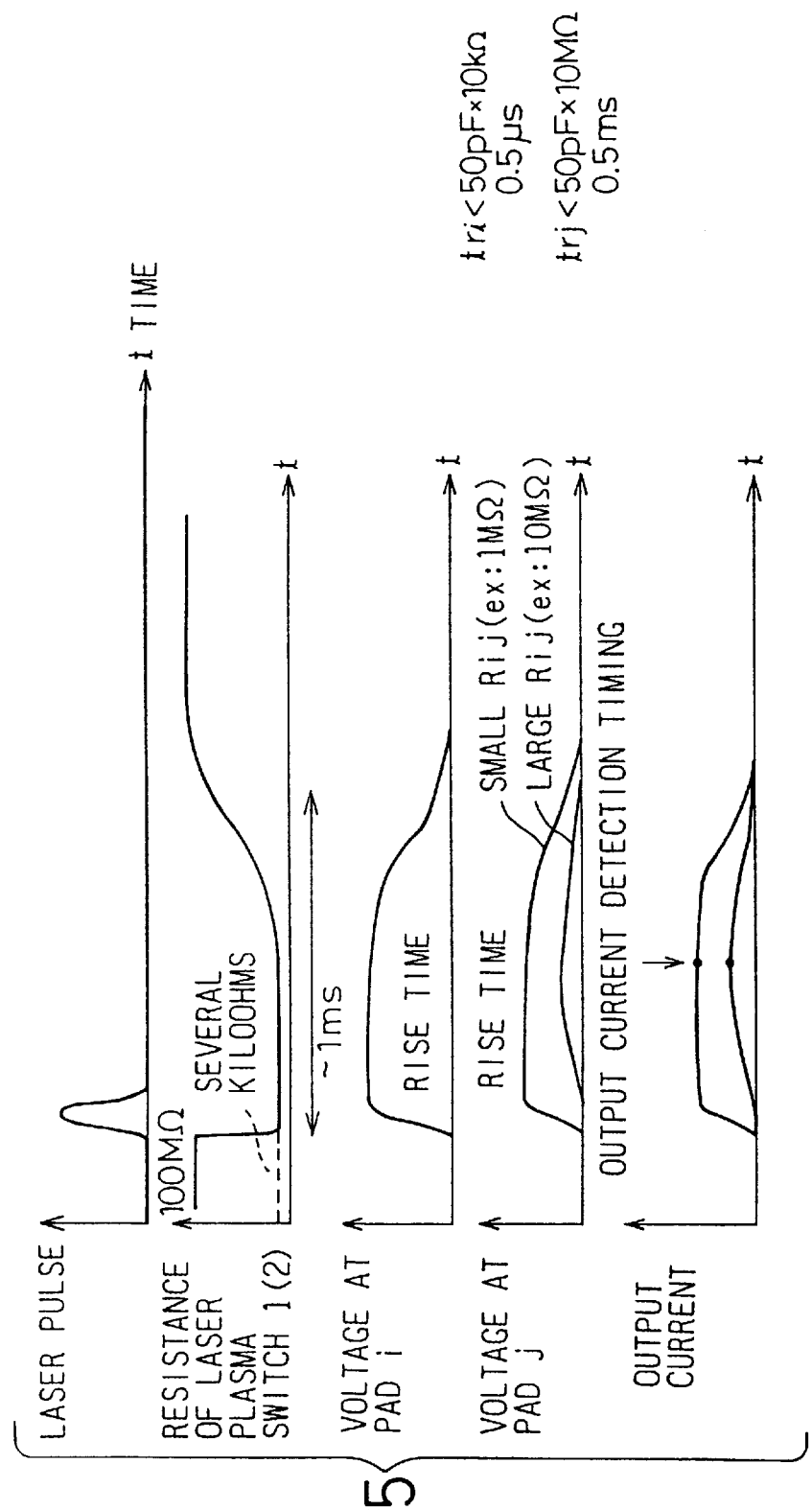
FIG. 15 explains a principle of measuring resistance between pads by the apparatus of FIG. 12.
Figure 16:
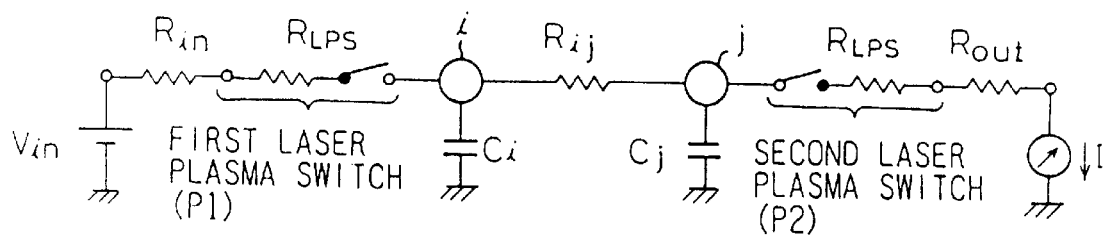
FIG. 16 explains a principle of measuring resistance between pads by the apparatus of FIG. 12.

FIGS. 15 and 16 explain a principle of measuring resistance between test pads according to the third aspect of the present invention. These figures correspond to FIGS. 4 and 5. Namely, the test pads IN and OUT, rise times "trin" and "trout," insulation resistance Rin-out, and the electrostatic capacitances Cin and Cout of the pads IN and OUT of FIGS. 4 and 5 correspond to the test pads i and j, rise times "tri" and "trj," insulation resistance Rij, and the electrostatic capacitances Ci and Cj of the pads i and J. Accordingly, the explanations of these elements will not be repeated.

The third aspect of the present invention combines the laser plasma switch technique with the technique of forming rectangular photoconductive patterns on a photoconductive sheet, to form a closed circuit in a noncontact manner, as shown in FIG. 16. With this closed circuit, the third aspect accurately measures resistance between test pads at high speed. The conventional noncontact technique has a problem that the measurement of resistance is influenced by the electrostatic capacitances Ci and Cj of traces. According to the present invention, the influence of the electrostatic capacitances occurs only during the rise times tri and trj, as shown in FIG. 15. In a predetermined time after emitting pulse laser beams, a voltage value and a current value become purely dependent on insulation resistance. The rise time tri is about 0.5 microseconds when Rin+Rlps is about 10 kilohms and the electrostatic capacitance Ci is about 50 picofarads at the most. The rise time trj is about 0.5 milliseconds when the resistance Rij is 10 megohms in the case of good insulation. Accordingly, a measurement will not be affected by the electrostatic capacitances, if the measurement is done about 0.5 milliseconds after emitting pulse laser beams and if the ON time of the laser plasma switch is about one millisecond.

The resistance values Rin and Rout are simply obtainable according to the experimentally obtained resistance values of the comb electrodes and conductive paths per unit length and the lengths of the comb electrodes and conductive paths calculated according to control data for positioning the beam patterns and the coordinates of the test pads. The typical values of the Rin and Rout employing Er-doped GaAs as the photoconductive sheet are each several kilohms to several tens of kilohms for a length of several hundred micrometers. The Rlps is also experimentally obtained and is typically several kilohms. Accuracy of measuring resistance between test pads is mainly influenced by fluctuations in Rin, Rout, and Rlps. Each of these resistance values is about several tens of kiloohms and a fluctuation therein is about several kilohms, that is about 10% of the resistance value. Accordingly, a conduction test may be carried out at an accuracy of several kilohms, which is sufficient for an insulation test.

Figure 17A:
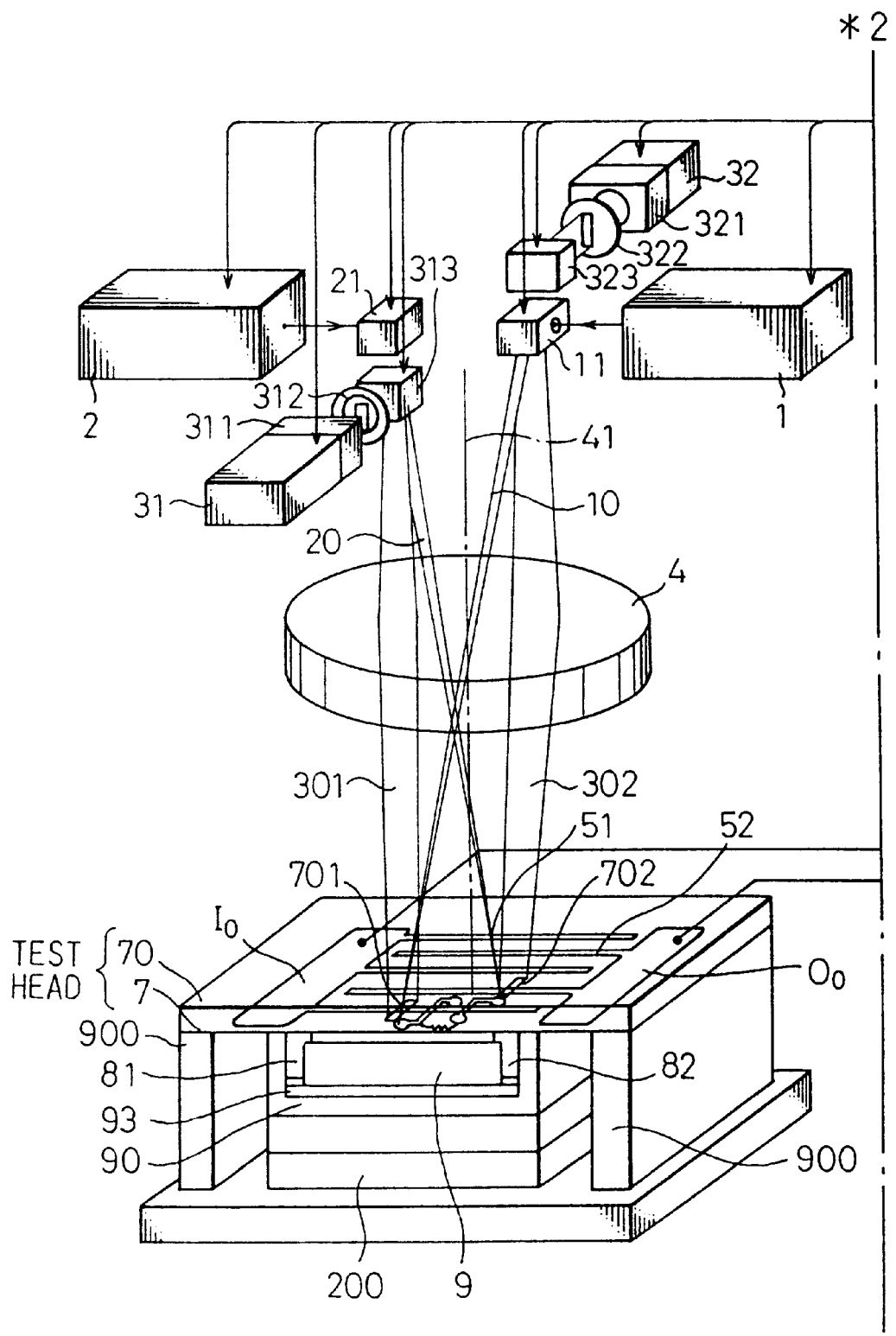

FIGS. 17A and 17B show an apparatus for testing a circuit board according to another embodiment of the third aspect of the present invention. The apparatus involves a first laser 1, a second laser 2, a laser beam 10 emitted from the laser 1, a laser beam 20 emitted from the laser 2, a two-dimensional deflector 11 for deflecting the first laser beam 10, a two-dimensional deflector 21 for deflecting the second laser beam 20, a first light source 31 for exciting a photoconductive sheet 7, and a second light source 32 for exciting the photoconductive sheet 7. The apparatus also involves filter lens systems 311 and 321, rectangle slits 312 and 322, two-dimensional deflectors 313 and 323, a scan lens 4, the photoconductive sheet 7, a glass plate 70, and a circuit board 9 to be tested. The apparatus also involves insulation spacers 81 and 82, a casing 90, an insulation sheet 93, and a test head support 900. The apparatus also involves an XYZ stage 200, a first laser position controller 201, a second laser position controller 202, a timing controller 203, a constant voltage source 204, an ammeter 205, an A/D converter 206, a laser pulse generation controller 207, an XYZ stage controller 208, and a controller 209. The apparatus also involves a first light beam position controller 210 for controlling a first light beam 301 to excite the photoconductive sheet 7, a second light beam position controller 211 for controlling a second light beam 302 to excite the photoconductive sheet 7, a first test pad data file 212, and a second test pad data file 213.

The elements 311, 312, 313, 321, 322, and 323 form, project, and deflect the two rectangular beams 301 and 302 to form conductive paths. The elements 11 and 21 deflect the two laser beams 10 and 20 to activate laser plasma switches. The constant voltage source 204 is connected to a power supply pad Io, and the ammeter 205 is connected to a detection pad Oo. The first pulse laser beam 10 is positioned at a first test pad i, and the second pulse laser beam 20 is positioned at a second test pad j. The laser beams 10 and 20 are simultaneously emitted. A current is measured just after the emission of the laser beams. These processes are repeated to carry out an insulation test.

The insulation test carried out by the apparatus according to the third aspect of the present invention will be explained next. The elements related to the laser beam 10 and 10 and light beams 301 and 302 are arranged above the test head 70 and are fixed to a frame (not shown). The circuit board 9 is placed on the insulation sheet 93 in the casing 90. The insulation spacers 81 and 82 are placed on the circuit board 9 so that it is spaced apart from the test head 70 by several tens of micrometers. The casing 90 with the circuit board 9 is mounted on the XYZ stage 200. The coordinate systems of the test head and deflectors are adjusted in relation to each other in advance. These coordinate systems are adjusted in relation to the coordinate system of the circuit board 9. The voltage source 204 is always connected to the power supply pad Io, and the ammeter 205 is connected to the detection pad Oo.

The rectangular light beam 301 forms a rectangular conductive pattern 701 extending from part of a power supplying transparent conductive film comb pattern 51 to the test pad i. The rectangular light beam 302 forms a rectangular conductive pattern 702 extending from the test pad j to part of a detection transparent conductive film comb pattern 52. Each of the light sources 31 and 32 is, for example, a tungsten lamp that generates white light. The white light is filtered by the filter lens systems 311 and 321 into light of about 800 nanometers in wavelength. The filtered light is shaped by the rectangular slits 312 and 322. The positioning of the conductive patterns 701 and 702 is controlled according to design data of the circuit board 9 stored in the controller 209 and data related to the combinations and coordinates of test pads stored in the files 212 and 213, so that the patterns 701 and 702 cover parts of the comb patterns 51 and 52 nearest to the test pads i and J.

FIG. 18 explains the positioning of the light beams 301 and 302 and shows an essential part of the test head 70. The width (Yk, u–Yk, l) of each of the comb patterns 51 and 52 is several tens of micrometers, similar to the size of each of the test pads i and j. A pitch P of the teeth of the comb patterns 51 and 52 is several times the width and preferably several hundreds of micrometers so as not to excessively increase the resistance of the conductive patterns 701 and 702. In FIG. 18, the width of each of the comb patterns 51 and 52 is 40 micrometers and the pitch P thereof is 240 micrometers.

As is apparent in FIG. 18, a conductive path to a position just above a given pad is not unique. When the first and second test pads i and j are distanced away from each other, the rectangular conductive pattern 701 is positioned such that the comb pattern 51 to be connected to the test pad i (xi, yi) comes to approximately the center of the pattern 701. When the two test pads i and j are close to each other, it is necessary to position the two conductive patterns 701 and 702 so that they do not overlap each other. If the length of each of the conductive patterns 701 and 702 is equal to the pitch P of the comb patterns 51 and 52, the conductive pattern 701 or 702 is able to cover all pads between adjacent teeth of the comb patterns 51 and 52.

In this way, the rectangular light beams 301 and 302 to form the conductive patterns 701 and 702 are positioned and irradiate the test head 70, to form power supply and detection paths extending from the comb patterns 51 and 52 to the test pads i and j. The photoconductive films 7, 51, and 52 may be made from GaAs, Cr- or Er-doped GaAs, amorphous silicon, or phthalocyanine-based photoconductive material used by electrophotography.

Referring again to FIGS. 17A and 17B, the first and second laser position controllers 201 and. 202 refer to design data of the circuit board 9 stored in the controller 209, to position the first laser beam 10 at the test pad i and the second laser beam 20 at the test pad j. The timing controller 203 provides a pulse signal to generate the pulse laser beams 10 and 20, so that a space between a power supply path formed of the comb pattern 51 and conductive pattern 701 and the test pad i and a space between the test pad j and a detection path formed of the comb pattern 52 and conductive pattern 702 become conductive for a predetermined time. This time is usually in the range of several hundreds of microseconds to one millisecond.

The timing controller 203 provides a sampling trigger signal about 0.5 milliseconds after the emission of the laser beams 10 and 20. According to the trigger signal, the A/D converter 206 converts an output current value into digital data, which is transferred to the controller 209. According to the data, the controller 209 calculates a resistance value Rij between the test pads i and j. At this time, the resistance of the power supply and detection paths must be compensated by calculating the lengths of the comb patterns 51 and 52 and conductive patterns 701 and 702 involved.

The insulation test between the test pads i and j is thus completed. In practice, the first test pad i is successively tested with respect to other test pads j+1, j+2, and so on, to improve test efficiency. For this purpose, the position of the rectangular light beam 302 for forming a detection path and the position of the laser beam 20 for activating the laser plasma switch for the second test pad are changed, and the above steps are repeated.

It is possible to apply an AC signal to the input pad Io, detect the maximum amplitude of an output current waveform provided by the output pad Oo to ground, and calculate resistance between the pads Io and Oo according to a ratio between the amplitude of the input voltage waveform and the maximum amplitude of the output current waveform.

FIG. 19 shows model waveforms of test sequences according to the third aspect of the present invention.

In practice, the pad j is changed to the next pad j+1 just after the sampling of an output current for the pad j. In this case, a detection value of the ammeter 205 suddenly drops to zero. Resistance between a pair of pads is measured within one to two milliseconds. After all insulation tests for the test pad i are completed, the first laser beam 10 is shifted to the next test pad i+1, and the same sequences are repeated. This embodiment arranges the lasers, two-dimensional deflectors such as galvanomirrors, and scan lens (convergent lens) in this order. They may also be arranged in order of the lasers, convergent lens, and two-dimensional deflectors. According to the embodiment, the light beam sources 31 and 32 emit white light, and the filters 311 and 321 provide light of required wavelength. It is possible to employ lasers.

Figure 21:
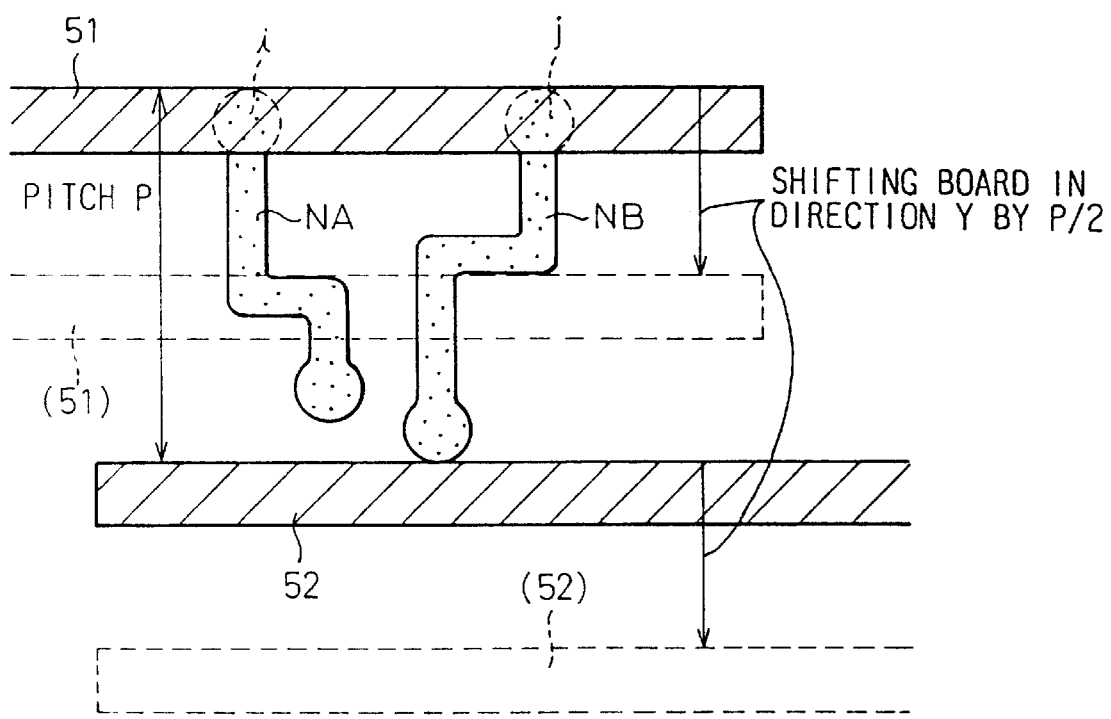
FIG. 21 explains a measuring technique according to the embodiment.

In practice, the third aspect of the present invention must consider special positional relationships between test pads and the comb patterns 51 and 52, as shown in FIGS. 20 and 21.

FIG. 20 shows a case that requires no light beam and FIG. 21 shows a case that requires a special measure.

In FIG. 20, test pads i and j are positioned just below the comb patterns 51 and 52, respectively. Accordingly, it is not necessary to emit the rectangular light beams 301 and 302. Only emitting the first and second laser beams 10 and 20 toward the test pads i and j will do. In this case, a voltage must be applied to the test pad i and the ammeter must be connected to the test pad J. These connections are irreversible.

The case of FIG. 21 is impossible to test as it is. Test pads i and j are both positioned just under the comb pattern 51, so that power supply and detection paths are not separately formed. This kind of special combination of test pads is stored as separate test data in a file. At first, normal combinations of test pads are tested, and then, the circuit board 9 is shifted in a direction Y by half the pitch P of the teeth of the comb patterns 51 and 52. As a result, the test pads i and j come out from under the comb pattern 51, and the test pads i and j are normally tested.

Figure 22B:
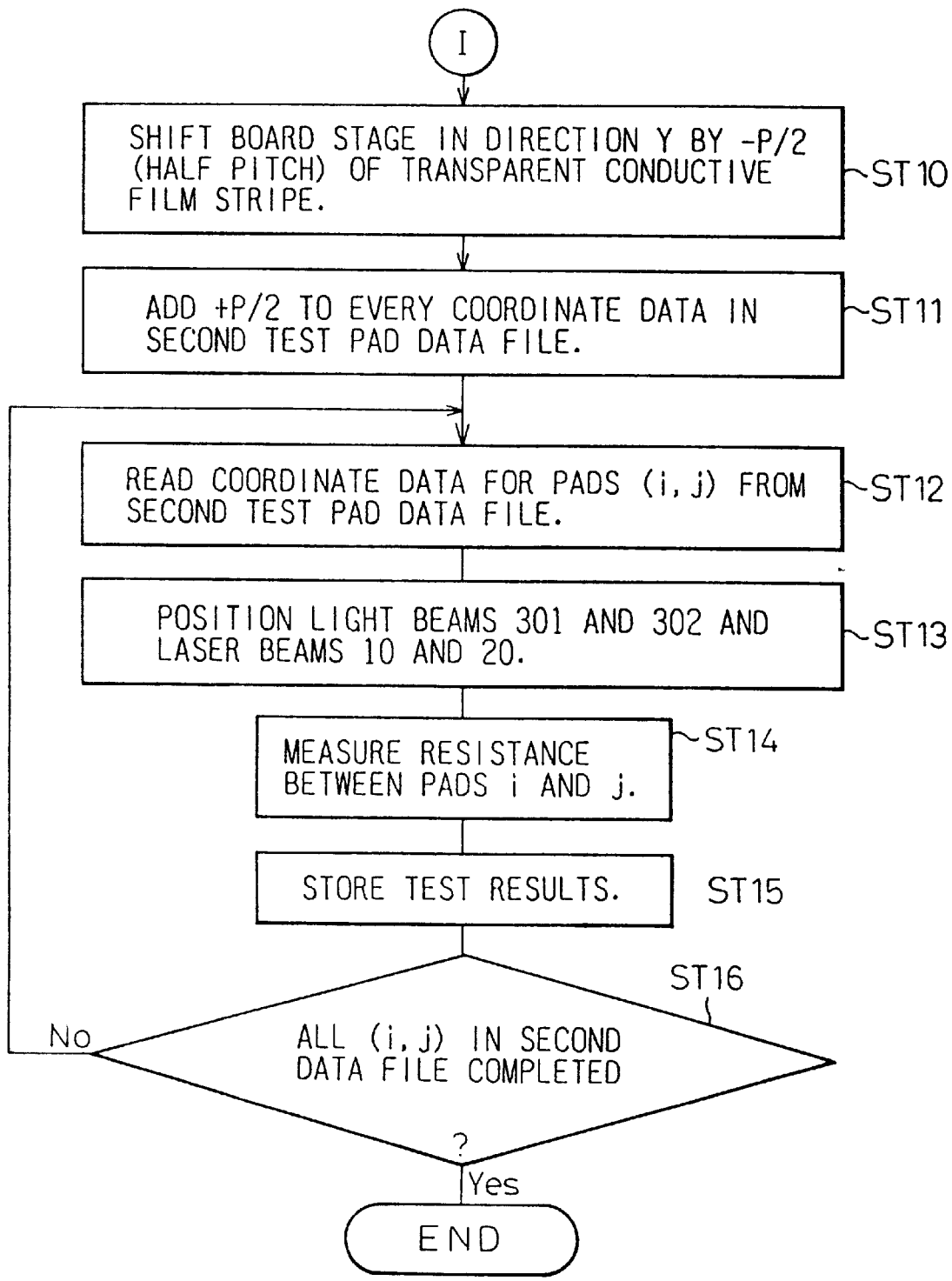

FIGS. 22A and 22B are flowcharts showing steps of testing the circuit board 9 according to the third aspect of the present invention.

Step ST1 determines whether or not coordinates yi and yj of test pads i and j are just under one of the comb patterns 51 and 52. Namely, the step ST1 checks to see whether or not Yku<=yi<=Yk1 and Yku<=yj<=Yk1 (k=1, 2, ... N).

If the step ST1 provides YES, step ST3 registers the pads i and j in the second test pad data file 213, and if NO, step ST2 registers the pads i and j in the first test pad data file 212. Step ST4 determines whether or not all test pads have been checked. If NO, the flow returns to the step ST1, and if YES, step ST5 is carried out. For the step ST4, all combinations of the test pads must be registered in advance.

The step ST5 successively reads test data such as the coordinates of test pads pair by pair out of the first file 212. Step ST6 positions the rectangular light beams 301 and 302 and the pulse laser beams 10 and 20. Step ST7 measures resistance between the test pads i and j. Step ST8 stores a result of the measurement. Step ST9 determines whether or not all test pads in the first file 212 have been tested. If NO, the flow returns to the step ST5, and if YES, the flow goes to step ST10.

To deal with the unmeasurable case of FIG. 21, the step ST10 shifts the circuit board 9 in the direction Y by half the pitch P of the teeth of the comb patterns 51 and 52. Step ST11 adds P/2 to the y-coordinate data of the test pads stored in the second file 213. Step ST12 reads the coordinates of the pads pair by pair out of the second file 213. Step ST13 positions the rectangular light beams 301 and 302 and the pulse laser beams 10 and 20. Step ST14 measures resistance between the test pads i and j. Step ST15 stores a result of the measurement. Step ST16 determines whether or not all pads stored in the second file 213 have been tested. If NO, the flow returns to the step ST12, and if YES, the test flow ends.

In this way, the third aspect of the present invention arranges the two transparent conductive film comb patterns 51 and 52 with their teeth alternating each other on the photoconductive sheet 7. A power supply pad is formed on the periphery of one of the comb patterns, and a detection pad on the periphery of the other. Power supply and detection paths extending from the power supply and detection pads to test pads of a circuit board are optionally electrically formed and changed with use of the comb patterns 51 and 52 and the photoconductive effect of the rectangular beams 301 and 302. The pulse laser beams 10 and 20 are emitted to turn on laser plasma switches in spaces between the power supply and detection paths and the test pads, to make the spaces conductive. Then, resistance between the power supply and detection pads is quickly measured to calculate resistance between the test pads.

Next, circuit board detector according to the fourth aspect of the present invention will be explained in detail with reference to the drawings.

According to the first to third aspects of the present invention, the path forming unit 192 employs a photoconductive film and a patterned mask or a liquid crystal shutter for forming proper patterns. The laser controller 196 emits light, which transmits the patterns formed on the mask or shutter, to form first and second conductive paths on the photoconductive film.

Namely, the first to third aspects must prepare conductive paths for each pair of test pads, and for this purpose, must have the mask or liquid crystal shutter and a driver for driving the shutter. This results in extending a testing time and increasing costs.

The apparatus according to the fourth aspect of the present invention solves this problem by employing a simple path forming unit to efficiently and speedily test a circuit board having wiring patterns and traces with pads.

The apparatus has a holder for holding the circuit board, a detector for detecting the electric characteristics of the circuit board, and a laser plasma switch controller. The detector has the path forming unit positioned away from the circuit board by a predetermined distance. The path forming unit has a conductive area facing an area of the circuit board where all test pads are positioned. The conductive area is formed of conductive sections electrically isolated from one another. At least one of the conductive sections is connected to a first power source, and another to a second power source whose potential is lower than that of the first power source. The path forming unit forms conductive paths between predetermined test pad positions and the power sources. The laser plasma switch controller emits laser beams toward spaces between the two test pads and the conductive sections, to make the spaces conductive. The detector has an electrical characteristic value sampler connected to the conductive paths.

The arrangement of this apparatus is basically the same as that of any one of the first to third aspects except for the path forming unit 192.

Namely, the path forming unit 192 of the fourth aspect is made of the flat conductive area. Unlike the first to third aspects of the present invention that individually form conductive paths having required shapes, the fourth aspect employs the conductive area as the conductive paths.

The conductive area of the fourth aspect of the present invention is flat to entirely cover a circuit board to be tested. The conductive area is made of at least two conductive sections that are electrically isolated from each other. Separation of the conductive sections is not particularly limited. For example, they may be separated with a slit. When the conductive area is made from photoconductive material, the conductive sections may be separated with a light blocking material.

FIGS. 23A to 23D explain the path forming unit 192 of the apparatus for testing a circuit board according to the fourth aspect of the present invention. The path forming unit 192 employs a conductive area divided into two conductive sections with a slit.

Except the path forming unit 192, the apparatus of the fourth aspect is the same as that of the first aspect of FIG. 1. The circuit board 9 tested by the apparatus has traces with pads. The path forming unit 192 is included in a detector 193 for detecting the electric characteristics of the circuit board 9. The path forming unit 192 is spaced apart, by a predetermined distance, from the circuit board 9 held by a holder 191. The path forming unit 192 involves first and second conductive sections 261 and 262 that are isolated from each other with a slit 263. The first conductive section 261 conducts a position S1 corresponding to a first test pad IN on a trace A of the circuit board 9 to a first power source V1. The second conductive section 262 conducts a position S2 corresponding to a second test pad OUT on a trace B of the circuit board 9 to a second power source V2.

Other arrangements of this apparatus are the same as those of FIG. 1. When the first and second conductive sections 261 and 262 are formed from conductive material, the light source 3 of FIG. 1 is not required. In this case, only the laser plasma switch controller involving the lasers 1 and 2, and deflectors are needed, and the conductive sections 261 and 262 must transmit laser beams.

When the conductive sections 261 and 262 are made from photoconductive material, the light source unit 3 to excite the material and the laser plasma switch controller are needed, similarly to the arrangement of FIG. 1.

The fourth aspect of the present invention will be explained next in more detail with reference to FIGS. 23A to 23D.

A glass plate 264 and a transparent conductive film 267 form a test head. The narrow center slit 263 divides the conductive film 267 into the first and second conductive sections 261 and 262. The periphery of the first conductive section 261 has a power supply pad 265, and the periphery of the second conductive section 262 has a detection pad 266. The test head is placed such that the conductive film 267 faces the circuit board 9 with a predetermined gap between them. The first conductive section 261 is connected to the first voltage source V1, and the second conductive section 262 is connected to an ammeter 268, which is connected to the second voltage source V2. The conductive sections 261 and 262 are mechanically moved orthogonal to the slit 263 so that one of two optional test pads IN and OUT (i and j) is positioned under the first conductive section 261 and the other is positioned under the second conductive section 262, to form a power supply path and a detection path to the pads IN and OUT. Laser plasma switches P1 and P2 to be excited with pulse laser beams are employed to conduct the power supply and detection paths to the test pads. With these techniques, the fourth aspect of the present invention instantaneously measures resistance between the power supply and detection pads 265 and 266 and calculates resistance between the two test pads IN and OUT.

FIG. 23D is a sectional view showing the circuit board 9. The circuit board 9 includes the trace A with the first test pad i and the trace B with the second test pad j. This board 9 involves a conduction defect D1 to be tested by a conduction test and an insulation defect D2 to be tested by an insulation test.

FIGS. 23A and 23B are front views showing the test head and circuit board, and FIGS. 23C and 23D are sectional views showing the same. The circuit board 9 has traces A to D and test pads E1 to E8. The size of the glass plate 264 is double the size of the circuit board 9. The transparent conductive sections 261 and 262 separated by the center slit 263 cover the lower face of the glass plate 264. The conductive sections 261 and 262 are above the circuit board 9 and are spaced away from the circuit board 9 by a gap of several micrometers to several tens of micrometers. The first conductive section 261 is connected to the voltage source V1 through the power supply pad 265, and the second conductive section 262 is connected to the second power source V2, i.e., is grounded through the detection pad 266 and ammeter 268.

The pulse laser beams 10 and 20 are simultaneously emitted, the beam 10 being emitted toward the test pad i, i.e., E1 in the trace A, and the beam 20 being emitted toward the test pad j, i.e., E4 in the trace B, to excite the laser plasma switch P1 in the space between the first conductive section 261 and the pad i and the laser plasma switch P2 in the space between the second conductive section 262 and the pad j. As a result, the conductive section 261 momentarily becomes conductive with the pad i, and the conductive section 262 becomes conductive with the pad j, to form an electrical path passing through the power supply pad 265, test pads i and j, and detection pad 266. In this state, a current from the voltage source V1 flows through the power supply pad 265, test pads i and j, and detection pad 266 and reaches the grounding power source V2. This current is dependent on resistance (insulation resistance) between the test pads i and j. The output current is measured when or after the pulse laser beams are emitted, to find resistance Rmes between the power supply and detection pads 265 and 266. Then, insulation resistance Rij between the test pads i and j is obtained by subtracting resistance values Rin and Rout of the conductive sections 261 and 262, and double the ON resistance Rlps of the laser plasma switch, from the resistance value Rmes. Namely, the insulation resistance Rij is obtained as follows:

Rij=Rmes−Rin−Rout−2×Rlps

FIG. 24 is an enlarged section showing the operations of the fourth aspect of the present invention.

Measuring operations of the fourth aspect of the present invention are the same as those of FIG. 4, and an equivalent circuit of the fourth aspect is the same as that of FIG. 5. Accordingly, their explanations will not be repeated.

A method of testing a circuit board according to the fourth aspect of the present invention will be explained next.

This method is a combination of the laser plasma switch technique and the technique of moving the test head with the conductive sections 261 and 262 relative to the circuit board 9, to select an optional pair of test pads positioned under the two conductive sections 261 and 262, respectively, thereby forming a closed circuit in a noncontact manner as shown in FIG. 24. Then, the resistance between the test pads is accurately and speedily measured.

The first to third aspects of the present invention employ a predetermined mask or a liquid crystal shutter, to test insulation resistance between test pads i and j. When light is emitted, the mask or shutter forms conductive paths of predetermined patterns on a photoconductive film.

Namely, the first to third aspects of the present invention must form a conductive path between the first power source V1 and the first test pad i and another conductive path between the second power source V2 and the second test pad j. This may complicate the apparatus and increase the cost thereof. In addition, the process of forming such conductive paths elongates a testing time.

In addition, for every pair of test pads, conductive paths having different lengths, widths, and shapes must be prepared and the resistance of each path must be measured. Even if the conductive paths are formed in the same shape, they will involve fluctuations in resistance. Accordingly, it is necessary to check the fluctuations. This involves additional operations which deteriorate operability.

Accordingly, the fourth aspect of the present invention does not form individual conductive paths for every pair of test pads. Instead, the fourth aspect employs the conductive area 270 formed of the conductive sections 261 and 262 each having a predetermined resistance value. The conductive sections 261 and 262 serve as conductive paths.

The conductive sections 261 and 262 are electrically separated from each other with the slit or light blocking material 263. When measuring insulation resistance between two test pads i and j, one of the test pads is positioned under the conductive section 261, and the other test pad under the conductive section 262.

After the insulation resistance between the test pads is measured, the conductive area 270 is shifted along the circuit board 9, to cover another pair of test pads. Once the slit 263 is properly positioned for the test pads, insulation resistance between the test pads is measured.

The conduction area 270 is configured to be moved relative to the circuit board 9 along the-surface of the circuit board 9 orthogonal to the slit 263.

Some pairs of test pads will not be covered with the unidirectional movement of the slit 263. Accordingly, it is preferable to arrange at least one of the conductive area 270 and circuit board 9 to be turnable by 90 degrees while keeping them in parallel.

The testing method according to the fourth aspect of the present invention will be explained with reference to FIGS. 25A to 25C.

The slit 263 of the conductive area, i.e., test head 270 is moved to test every pair of pads on the circuit board 9. In FIG. 25A, the slit 263 is longitudinal between the conductive sections 261 and 262. The circuit board 9 has test pads E1 to E6 any one of which will be represented as a test pad i or j. The power supply pad, detection pad, and laser beams are not shown in the figures. A minimum pitch of the pads on the circuit board 9 is P. The slit 263 is laterally shifted and positioned at one of positions k=1 to k=9 that are plotted at intervals of P/2. When the slit 263 is at the position k=1, the slit 263 divides the pads into a left group of E1 and E2 and a right group of E3 to E6. One of the pads in the left group is paired with any one of the pads in the right group and tested. Namely, as shown in FIG. 25B, the pad i (=1), i.e., E1 is tested with respect to the pad j (=3 to 6), and the pad i (=2), i.e., E2 is tested with respect to the pad j (=3 to 6). When the slit 263 is shifted to the position k=3, the pads i=3 and i=4 are tested with respect to the pads j=5 and j=6. In this way, the slit 263 is shifted up to the position k=9. The pads such as E1 and E2, and E3 and E4 linearly arranged along the slit 263 must be tested with respect to each other.

Figure 25A:
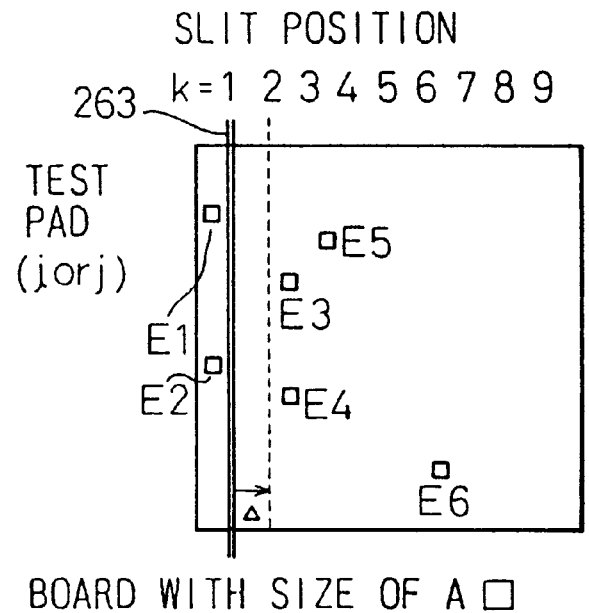
Figure 25C:
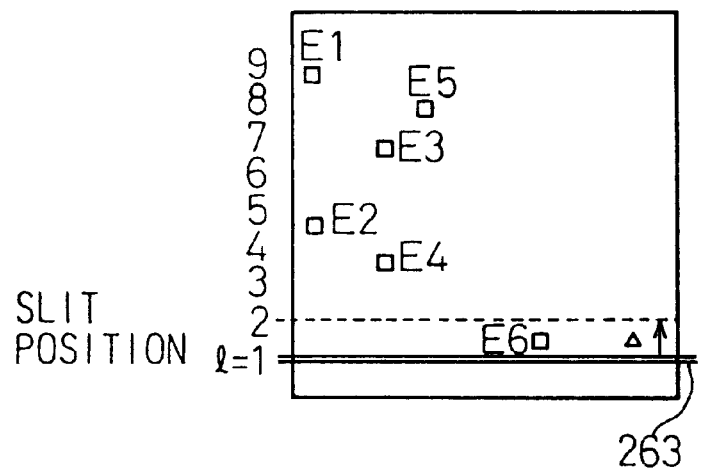

Accordingly, the slit 263 is turned by 90 degrees as shown in FIG. 25C, to test the pads that are not testable with the longitudinal slit 263 of FIG. 25A. Namely, pairs of the pads shown in the bottom table of FIG. 25B are tested with lateral slit positions. In this case, the slit 263 is mechanically moved linearly two times. This may take a little time. This time, however, is short compared with that needed for two-dimensional movements of the conventional flying prober.

For example, with a circuit board of 100 millimeters square, a minimum pitch P of test pads of 0.04 millimeters, each shift of the test head 270 of 0.02 millimeters, and a shift time of the test head 270 of 0.2 seconds, the total time for moving the test head 270 10000 times is about 33 minutes.

Figure 26:
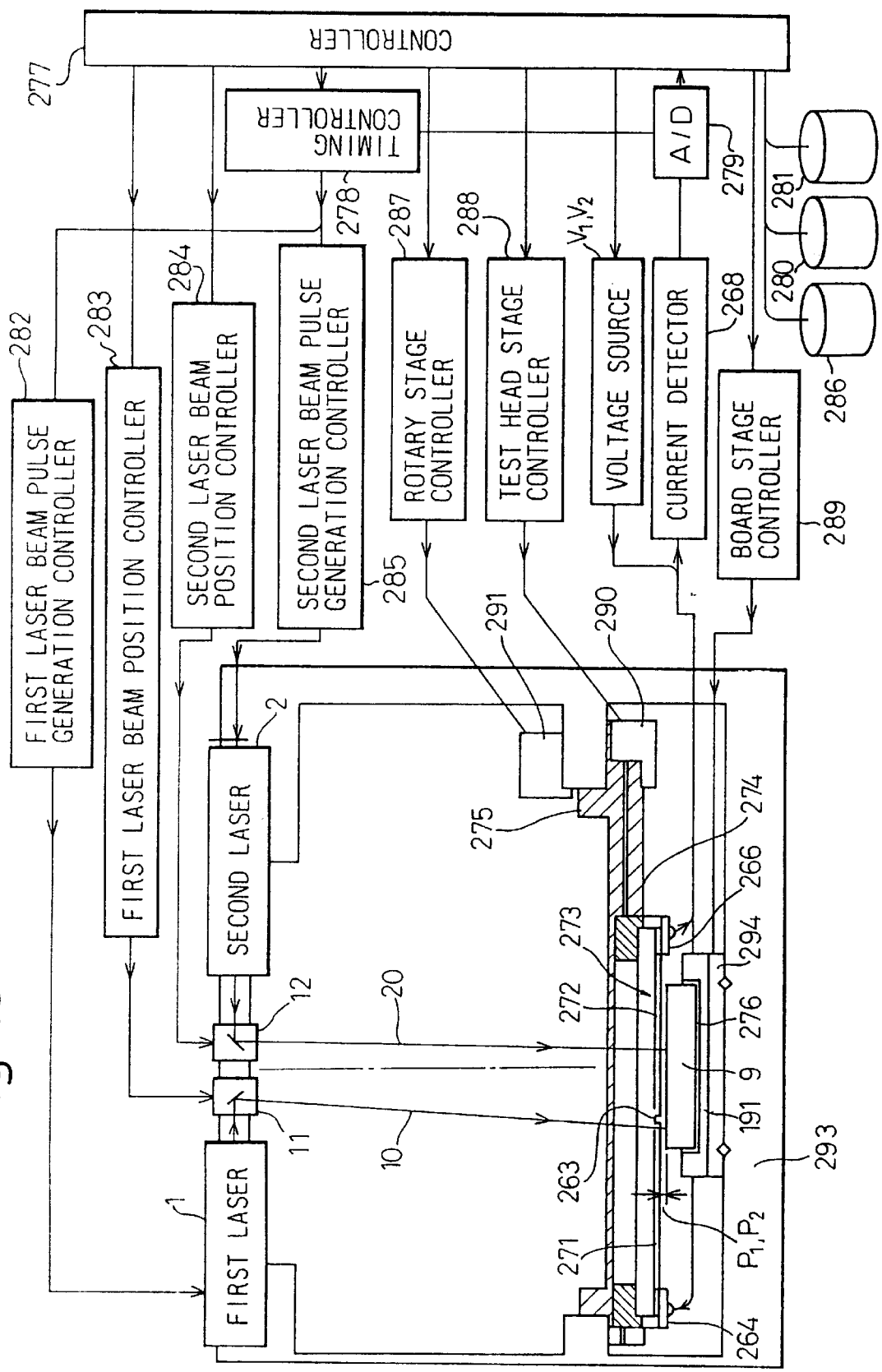
FIG. 26 is a block diagram showing the apparatus according to the fourth aspect of the present invention.

FIG. 26 shows an apparatus for testing a circuit board according to an embodiment of the fourth aspect of the present invention.

A path forming unit 192 serving as a test head is made of a glass plate 273, which is coated with transparent conductive films 271 and 272 such as ITO films. The films 271 and 272 are separated from each other with a center slit 263. The test head is mounted on a test head stage 274 that is movable in left and right directions in the figure. The test head stage 274 is mounted on a rotary stage 275 that it turnable by 90 degrees. Namely, the slit 263 is moved by mechanically moving the test head.

The width of the slit 263 must be as small as possible, preferably 1/10 to 1/20 of a minimum pitch P of the test pads, i.e., about 5 micrometers or less. The slit 263 is moved step by step at fixed intervals of about P/2. Left and right ends of the test head are provided with power supply and detection pads, respectively, through which first and second conductive sections 261 and 262 made of the conductive films 271 and 272 are connected to a voltage source and an ammeter 268, respectively.

An insulation sheet 276 is placed on a board stage 191 on which the circuit board 9 is placed. The board stage 191 is positioned under the test head 192. Gaps P1 and P2 are formed between the circuit board 9 and the test head 192. The gaps P1 and P2 must be as small as possible to secure spatial resolution and reduce the ON resistance of a plasma switch. The gaps P1 and P2, however, must be as large as possible to reduce fluctuations in the ON resistance of the plasma switch due to irregularities of the surface of the circuit board 9. When the circuit board 9 has irregularities of several micrometers and when the irregularities must be less than 10% of the true size of the gaps P1 and P2, the gaps must be more than several tens of micrometers. On the other hand, the gaps P1 and P2 must not be more than several tens of micrometers, in order to measure a pad whose size is several tens of micrometers. Accordingly, the size of the gaps is determined to be several tens of micrometers, typically 30 micrometers.

In FIG. 26, two lasers 1 and 2 simultaneously emit two pulse beams 10 and 20. Laser deflection systems 11 and 12 arranged above the test head 192 are capable of positioning the laser beams 10 and 20 at any positions on the test head 192. The timing of emitting the laser beams is controlled by a timing controller 278 according to an instruction from a controller 277. The timing controller 278 provides an A/D converter 279 with a trigger signal that is behind the laser emission trigger signal by a predetermined delay time. In response to the trigger signal, an instantaneous value of a detected current signal is fetched as digital data by the controller 277.

The controller 277 has two test pad data files 280 and 281 for storing combinations of test pads and the coordinate data thereof. The controller 277 reads the data out of the files 280 and 281, to control the laser emission and deflection systems 282 to 285 and emit pulse laser beams toward the test pads i and j. The files 280 and 281 store not only data related to the test pads but also results of preprocesses to be explained later.

A data file 286 stores design data of wiring of the circuit board 9. The file 286 may serve as the files 280 and 281.

This embodiment moves and turns the test head, i.e., the path forming unit 192 relative to the circuit board 9 while maintaining parallelism between them. For this purpose, the test head 192 is set on the stage 274 that is horizontally movable in parallel with the circuit board 9. The stage 274 is set on the rotary stage 275 that rotatably holds the stage 274, to at least turn the test head 192 relative to the circuit board 9 by 90 degrees.

The horizontally moving stage 274 is driven by a motor 290, which is controlled by an output signal of a motor controller 288.

The rotary stage 275 is driven by a motor 291, which is controlled by an output signal of a motor controller 287.

The circuit board 9 may be moved by moving the holder 191 through a proper moving unit controlled by a board stage controller 289.

The apparatus has a frame 293.

An insulation test for measuring resistance between test pads i and j will be explained next.

The holder 191 and lasers 1 and 2 are fixed to the frame 293. The casing 294 accommodates the insulation sheet 276 on which the circuit board 9 is placed. The casing 294 with the circuit board 9 is set on the holder 191. The coordinate systems of the laser deflection systems 1 and 2 and board 9 are adjusted in relation to each other (the adjusting means are omitted). The test head stage 274 moves the slit 263 to a first position. The coordinate values of the test pads i and j are read out of the files 280 and 281. According to the data, the first and second laser position controllers 283 and 284 position the first laser beam 10 to the pad i and the second laser beam 20 to the pad J. The timing controller 278 provides the first and second laser beam generation controllers 282 and 285 with a pulse signal for controlling the generation of the first and second pulse laser beams 10 and 20. As a result, a power supply path between the power supply pad 265 and the first conductive section 261 becomes conductive with the pad i, and the pad j becomes conductive with a detection path between the second conductive section 262 and the detection pad 266, for a certain period. This period is usually in the range of several hundred microseconds to one millisecond.

About 0.5 milliseconds after the laser emission timing, the timing controller provides a sampling trigger signal. In response to this signal, the A/D converter 279 converts an output current value into digital data, which is transferred to the controller 277. According to the data, the controller 277 calculates resistance between the pads i and j. At this time, the lengths of the paths in the conductive area 270 are calculated to correct the resistance of the power supply and detection paths.

Figure 27:
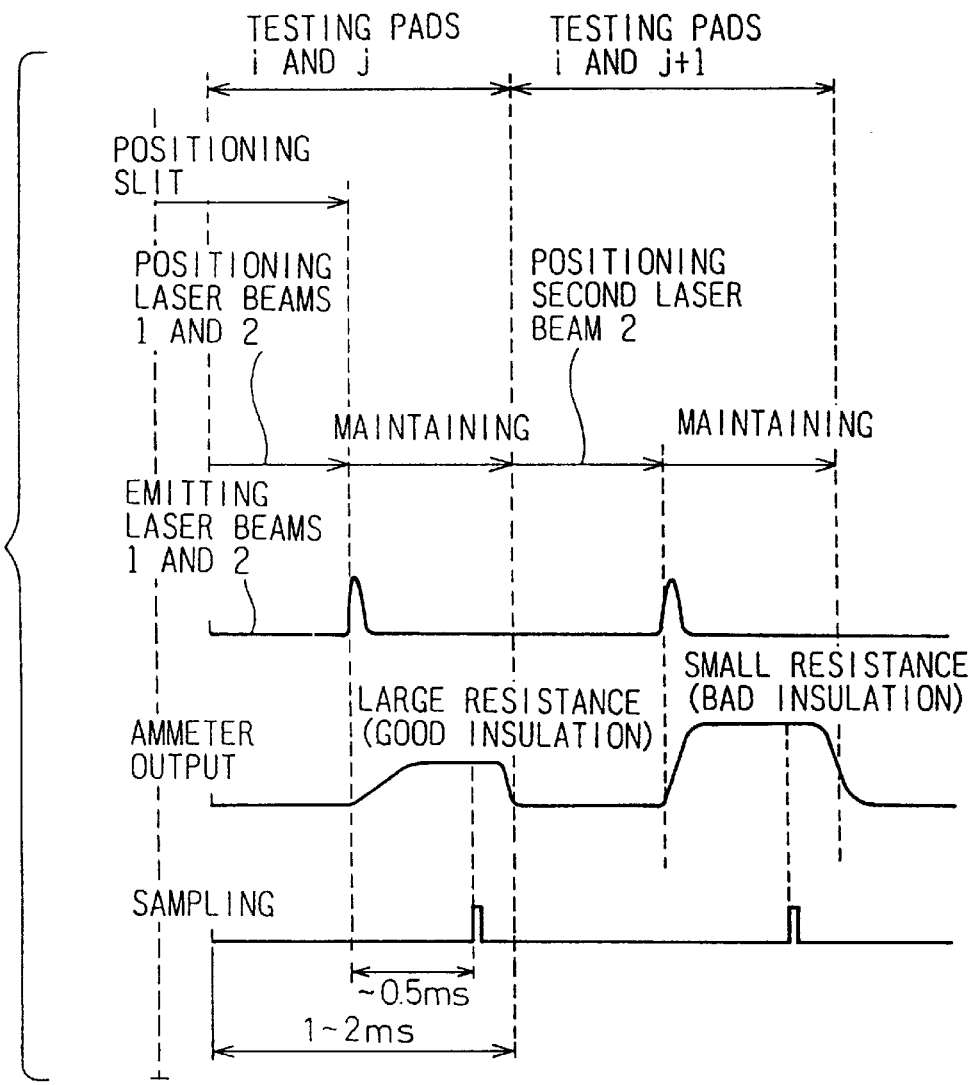
FIG. 27 shows waveforms of test sequences according to the fourth aspect of the present invention.

These processes complete the insulation test on the pads i and j. FIG. 27 shows the sequences of the insulation test. A cycle of the sequences for measuring resistance between a pair of pads takes about one to two milliseconds. After the pad i is tested with respect to all other test pads, the first laser beam is shifted to the next pad i+1, to repeat the test sequences.

Although the laser optical systems of this embodiment have no lenses, lenses such as a scan lens may be inserted as and when required.

Figure 28:
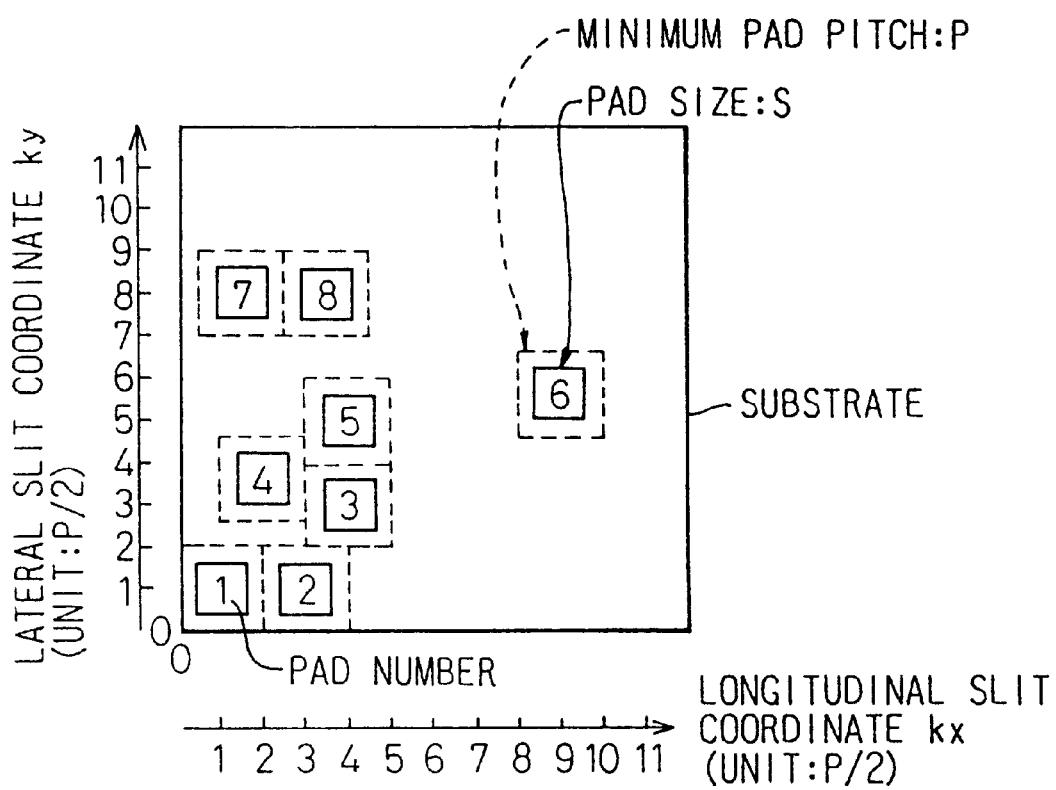
FIG. 28 is a plan view showing a circuit board tested according to the fourth aspect of the present invention.

Pads on an actual circuit board are usually complicated and irregular in arrangement, as shown in FIG. 28. To test such pads, it is necessary to preprocess slit positions and combinations of the test pads. The preprocess includes (1) extracting pairs of pads that are theoretically impossible to test with a longitudinal slit and (2) extracting pairs of test pads for each slit position.

Figure 30C:
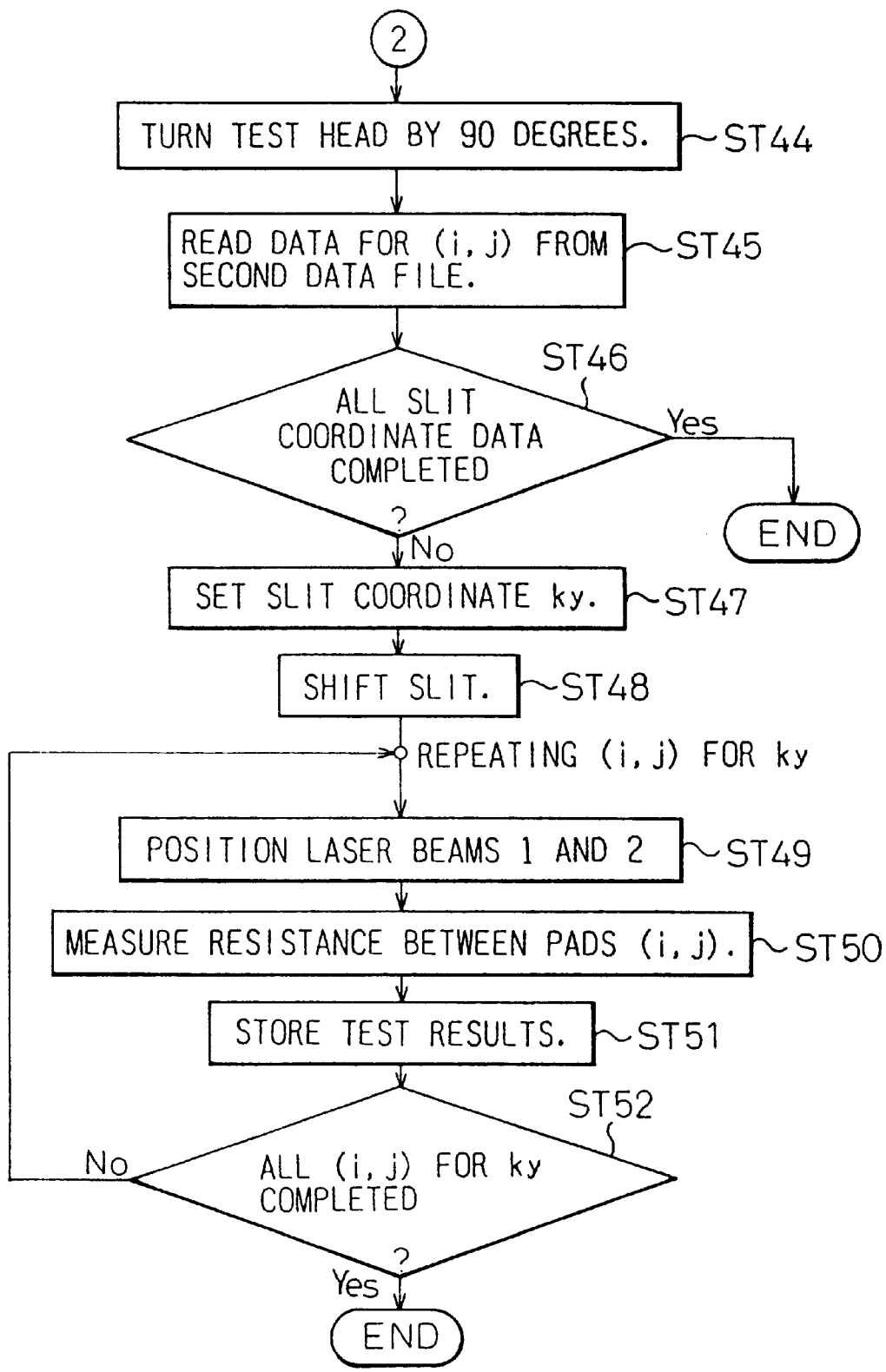

The preprocess carried out on eight pads shown in FIG. 28 will be explained with reference to FIGS. 30A to 30C. In FIG. 28, dotted squares indicate minimum pitches P of the pads arranged on the circuit board, and continuous squares indicate the size S of each pad. The ratio S/P is smaller than 1 and is usually about 0.6. Accordingly, the dotted squares will never overlap one another.

The first process (1) is considered hereinafter. When the absolute value of a difference of x-coordinates of every pair of pads is greater than the minimum pitch P, all pad pairs are testable with a longitudinal slit. If the absolute value of a difference between x-coordinates of a pair of pads is smaller than the minimum pitch P, the absolute value of a difference between y-coordinates is greater than the minimum pitch P, as is apparent in FIG. 28. In FIG. 30A, pairs of pads that are testable with the longitudinal slit are stored in the data file 280, and pairs of test pads that are testable with a lateral slit are stored in the data file 281. FIGS. 29A and 29B show a result of grouping of pad pairs to be tested with the longitudinal and lateral slits.

The testing process will now be explained step by step with reference to FIGS. 30A to 30C.

Step ST21 obtains x-coordinates xi and xj of a pair of test pads i and j. Step ST22 determines whether or not the absolute value of a difference xi–xj is smaller than the minimum pitch P of pads. If NO, step ST23 stores the test pads i and j in the first file 280, and if YES, step ST24 determines whether or not the absolute difference xi–xj is equal to the minimum pitch P. If YES, step ST25 obtains y-coordinates yi and yj of the test pads i and j and determines whether or not the absolute value of a difference yi–yj is smaller than the minimum pitch P. If YES, the step ST23 is carried out, and if NO, step ST26 stores the test pads i and j in the second file 281. The stored data are used when the slit is turned to a lateral position to test the pads.

If NO in the step ST24, the step ST26 is carried out.

Step ST27 determines whether or not the coordinates of all pairs of test pads have been checked. If NO, the step ST22 is repeated, and if YES, step ST28 detects the electrical characteristics such as insulation resistance and wiring breakage of the circuit board.

Namely, the steps up to the step ST27 determine whether or not the longitudinal slit is sufficient to measure the electric characteristics of all test pads arranged on the circuit board 9 and whether or not it is necessary to turn the slit to a lateral position to measure the electric characteristics of the pads.

For the step ST27, pad pairs to be tested are predetermined.

Steps following step ST28 calculate slit coordinates. The step ST28 reads data related to a pair of test pads i and j out of the first file 280. Step ST29 selects the smaller one of the x-coordinates xi and xj of the test pads i and j and represents it as xs.

Step ST30 finds "n" that satisfies the following:

$$P/4(2n-1) < xs < P/4(2n-1)$$

n=1, 2, 3, . . .
Then, a slit coordinate kx=n+1 is stored in the data file.

Step ST31 determines whether or not slit coordinates kx have been set for every pair of test pads. If NO, the step ST29 is repeated, and if YES, step ST32 carries out the same processes for the lateral slit.

Namely, the step ST32 reads data related to a pair of test pads i and j out of the second file 281. Step ST33 selects, as ys, a smaller one of the y-coordinates yi and yj of the pads i and j.

Step ST34 finds "n" that satisfies the following:

$$P/4(2n-1) < ys < P/4(2n-1)$$

n=p1, 2, 3, . . .
Then, a slit coordinate ky=n+1 is stored in the data file.

Step ST35 determines whether or not slit coordinates ky have been set for every pair of test pads. If NO, the step ST33 is repeated, and if YES, step ST36 starts to measure, for example, insulation resistance.

The step ST36 reads data related to a pair of test pads out of the first file 280. Step ST37 determines whether or not slit coordinates have been completely read. If NO, step ST38 sets a slit coordinate kx, and step ST39 shifts the slit to the coordinate and sets the slit.

Step ST40 positions the lasers 1 and 2, and step ST41 measures resistance between the test pads.

Step ST42 stores the result of the measurement in a proper storage unit. Step ST43 determines whether or not all pairs of test pads have been tested. If NO, the step ST40 is repeated, and if YES, the step ST37 is repeated.

If YES in the step ST37, step ST44 turns the slit by 90 degrees. Step ST45 reads data related to a pair of test pads i and j out of the second file 281. Step ST46 determines whether or not all slit coordinates have been read. If YES, the flow ends.

If NO in the step ST46, step ST47 sets a slit coordinate ky, and step ST48 shifts the slit to the coordinate and sets the slit.

Step ST49 positions the lasers 1 and 2, and step ST50 measures resistance between the test pads.

Step ST51 stores the result of the measurement in the storage unit. Step ST52 determines whether or not all test pad pairs related to the slit coordinate ky have been tested. If NO, the step ST49 is repeated, and if YES, the flow ends. Thereafter, electrical characteristics such as insulation resistance are detected, and the state of wire breakage is confirmed.

FIGS. 29A and 29B show combinations of test pads to be tested with the longitudinal and lateral slits.

Returning to FIG. 28, the process (2) will be explained. Design rules of pads on a circuit board specify minimum pitches but freely allow the absolute positions of the pads or specify the absolute positions in very small order, for example, one micrometer. Strictly, the slit must be positioned at the left end of each pad when carrying out a test. This greatly increases the number of movements of the slit, to deteriorate the merit of high-speed testing with laser beams. In practice, many pads are testable with one slit position.

Figure 31:
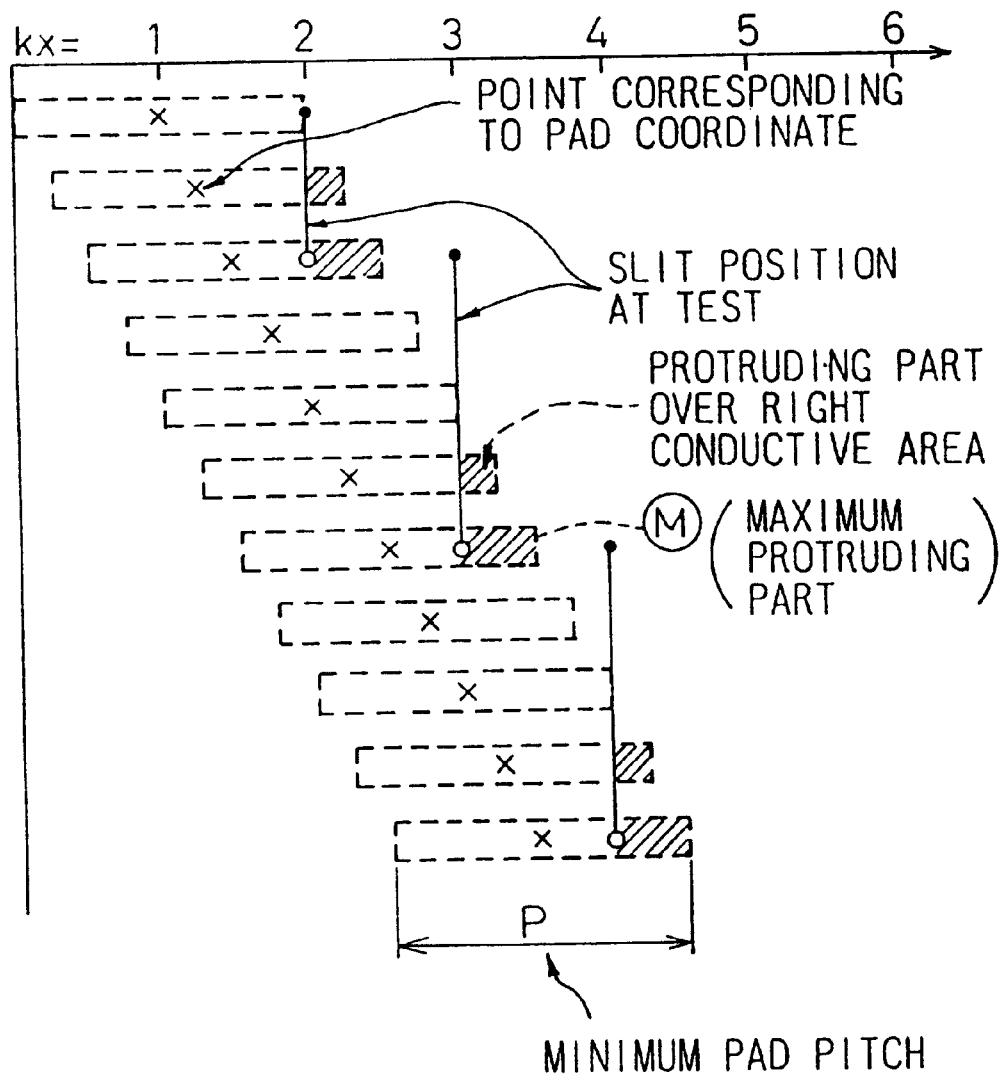
FIG. 31 shows relationships between the positions of pads and the coordinates of a slit according to the fourth aspect of the present invention.
Figure 32:
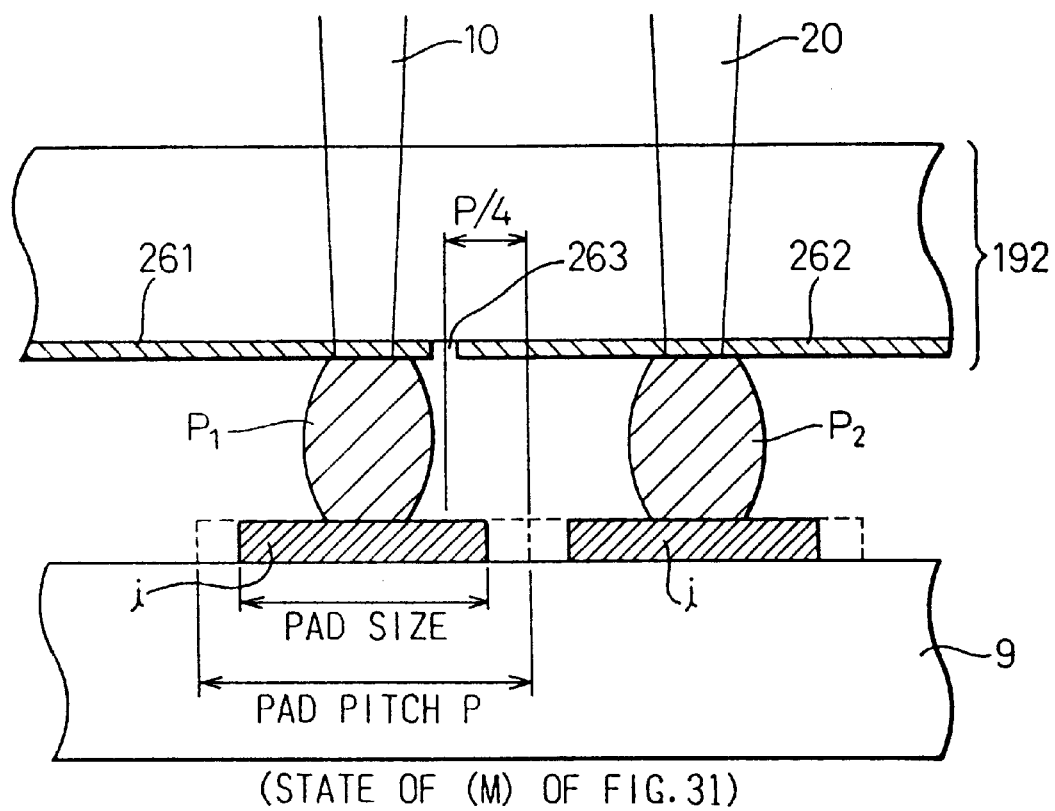
FIG. 32 explains a relationship between the moving range of a slit and the pitches of pads according to the fourth aspect of the present invention.

According to this embodiment, each movement of the slit is half the minimum pad pitch P. The reason for this will be explained with reference to FIGS. 31 and 32. FIG. 31 shows optimum slit positions for pads continuously arranged in the direction x. A dotted square indicates the minimum pad pitch P. Vertical lines with white and black dots indicate slit positions. When the slit coordinates change at intervals of P/2, part of a pad corresponding to P/4 at the maximum protrudes over the slit into the other conductive section as shown in FIG. 32. This is only about 8% of the pad with a space/pitch ratio of 0.6. This is why this embodiment shifts the slit at intervals of P/2.

A process of finding an optimum slit coordinate with respect to a given pad coordinate x corresponds to the steps ST28 to ST35 of FIGS. 30A and 30B. Slit coordinates at intervals of P/2 are first obtained for pairs of pads to be tested with the longitudinal slit and are stored in the data file. Then, slit coordinates are obtained for pairs of pads to be tested with the lateral slit and are stored in the data file.

In practice, pairs of pads are related to corresponding slit coordinates and stored as shown in FIGS. 29A and 29B. Actual measurement and test sequences are shown in FIGS. 30A to 30C. Namely, a pair of pads i and j are read out of the first file 280. The slit is shifted according to a slit coordinate corresponding to the pads i and j. The laser beams are positioned at the pads i and j, and a current is measured. According to the current, a resistance value between the pads i and j is calculated to determine whether or not conduction or insulation between the pads i and j is good. The result is then recorded. These processes are repeated until all pairs of pads for the same slit position are tested. Then, the slit is shifted to the next slit coordinate. After all pads testable on the longitudinal slit are tested, the slit is turned to the lateral position, to repeat the tests.

According to the embodiment explained above, the test head is linearly moved only twice so that the tests are completed with a very short stage moving time compared with the conventional flying prober that mechanically moves the probes two-dimensionally.

When testing a circuit board of 100 millimeters square with a pad minimum pitch P of 40 micrometers and a unit movement time of the stage of 0.2 seconds, it takes about 30 minutes to move the stage 10000 times. If the pads are irregularly arranged on the circuit board, the slit may be shifted in variable steps instead of fixed steps. This will further reduce the number of stage movements.

Figure 33A:
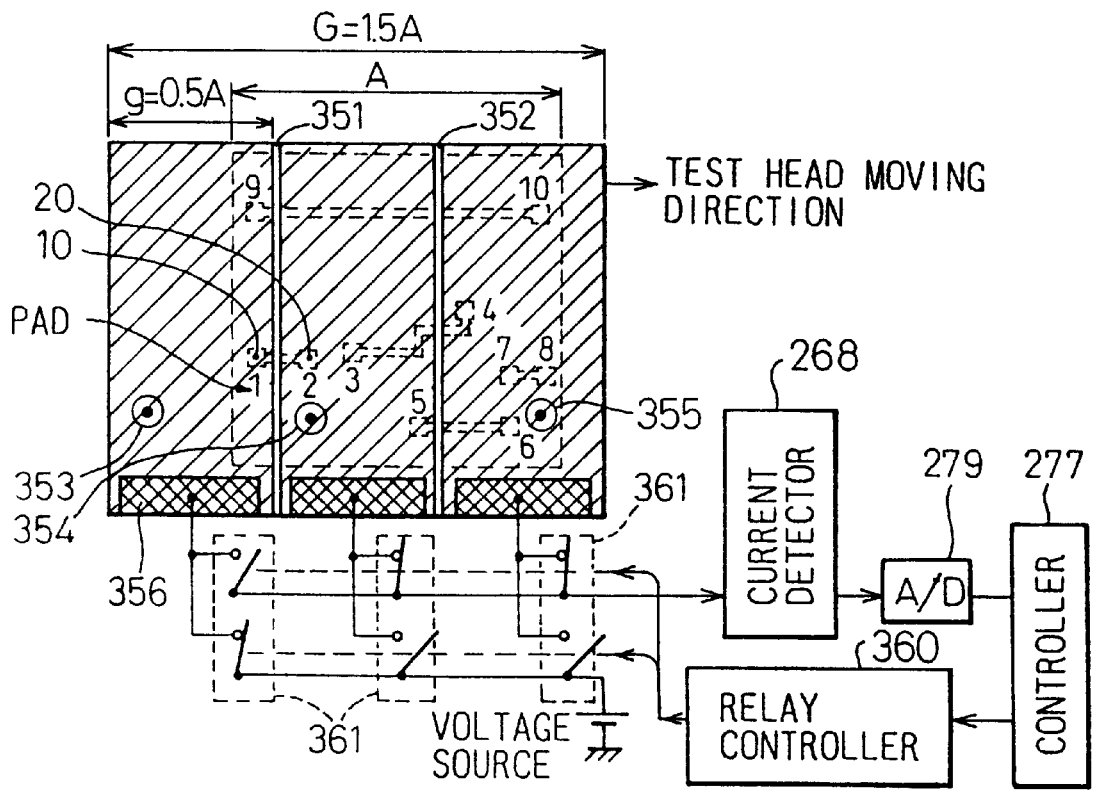
FIG. 33A is a plan view showing a path forming unit of an apparatus for testing a circuit board according to a fifth aspect of the present invention.

FIG. 33A shows the fifth aspect of the present invention. The fourth aspect of the present invention involves a relatively large number of slit movements which take several tens of minutes to move a slit stage to test all pads. This time is relatively large. The fifth aspect further reduces the number of slit movements.

The fifth aspect of the present invention divides a conductive area of a test head 192 into three sections 353, 354, and 355 with two slits 351 and 352. The sections are provided with power supply and detection pads 356, 357, and 358, respectively. A relay circuit 361 and a relay controller 360 are provided to optionally change connections among these pads and a voltage source V1 and a current detector 268. The minimum required conductive area of the test head is G×H that is provided by the following equation:

$$G = NA/(N-1)$$

$$H = A$$

where A is the size of a circuit board. In the example of FIG. 33A, the number of conductive sections N is 3 so that G is 1.5 A.

Figure 33B:
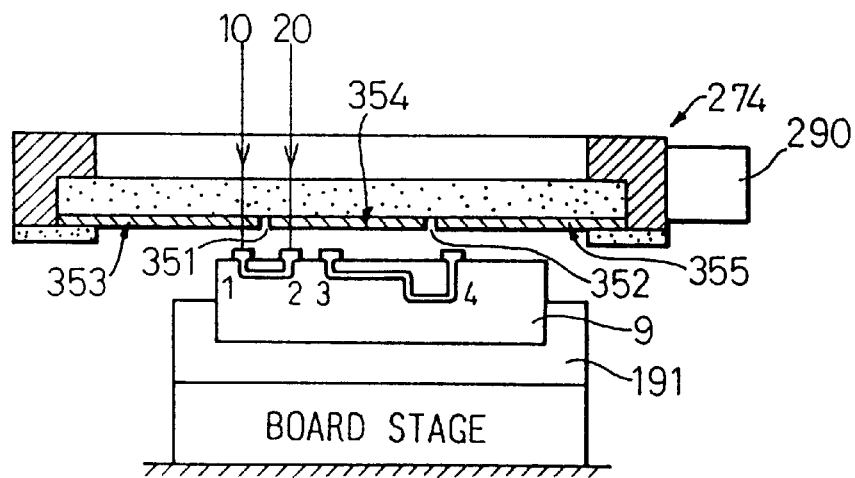
FIG. 33B is a sectional view showing the path forming unit of FIG. 33A.

FIG. 33B is a sectional view showing the arrangement of FIG. 33A.

Figures 34A, 34B:
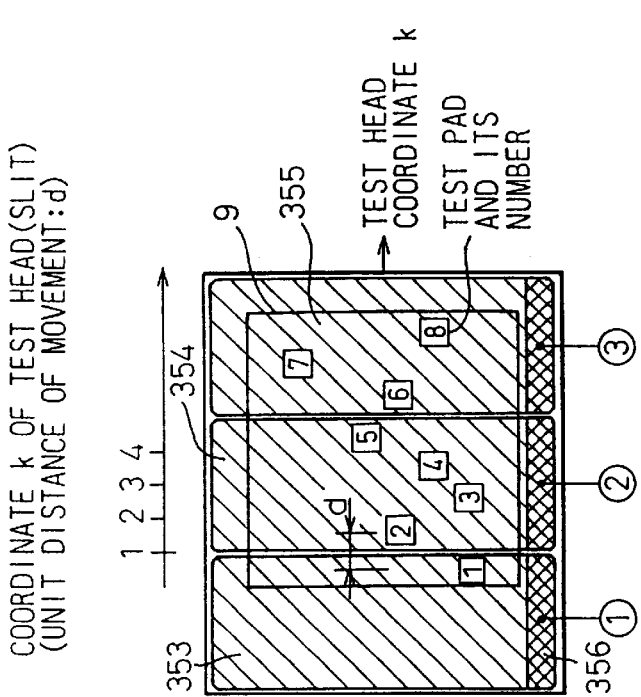
FIG. 34A is a plan view showing a positional relationship between the path forming unit and a circuit board according to the fifth aspect of the present invention.
FIG. 34B shows relationships between the positions of the path forming unit of FIG. 33A and power supply and detection pads and test pads.

FIGS. 34A and 34B show operation sequences according to the fifth aspect of the present invention. Pads are distributed over the circuit board 9, as shown in FIG. 34A. For the sake of simplicity of explanation, the test head is moved at intervals of pitch P of the pads. At a slit coordinate k=1, the pad 1 is connected to the voltage source PS, and the pads 2 and 3 are connected to the current detector CD. In this case, the pad i=1 is tested with respect to the pads j=2 to 8. When the pad 2 is connected to the voltage source PS and the pads 1 and 3 are connected to the current detector CD, the pads i=2 to 5 are tested with respect to the pad j=6 to 8. Namely, 12 pairs of pads are tested with one slit coordinate as shown in FIG. 34B. Accordingly, the movement of the slit is equal to the length g of one of the conductive sections at the maximum, which is ½ that of the fourth aspect. Namely, the number of shifts of the slit of the fifth aspect is ½ of that of the fourth aspect.

When the transparent conductive film is divided into more sections, the number of shifts is further reduced, and the size of the test head may be reduced. If N=11 for example, the number of shifts becomes 1/10 of the former example. Namely, the number of shifts becomes 1000 times and the moving time becomes 3 minutes.

Figure 35:
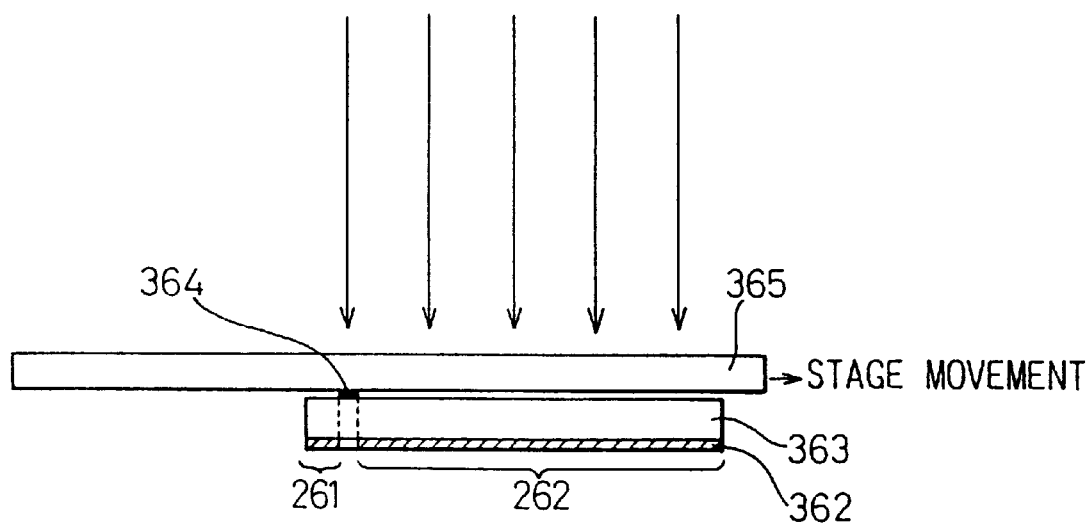
FIG. 35 is a side view showing another path forming unit according to the fifth aspect of the present invention.

FIG. 35 shows the sixth aspect of the present invention. This aspect employs another means to divide a conductive area into sections. A test head is provided made of a glass plate 363 coated with a photoconductive film 362. A glass plate 365 having a thin linear light blocking pattern 364, is positioned on the glass plate 363. Uniform coherent light irradiates the glass plates 363 and 365. The wavelength of the light is about 0.5 to one micrometer which is appropriate to induce photoconductivity. The light blocking pattern 364 forms a shadow on the photoconductive film 362, and the shadow acts as a slit in a photoconductive area 270. The slit is movable by horizontally moving the glass plate 365.

Similarly to the first to third aspects of the present invention, the fourth and fifth aspects easily condense a laser beam to ten and several micrometers, to make the spatial resolution of a plasma switch substantially equal to the length of a gap between a test pad and a conductive path. Accordingly, these aspects are capable of carrying out an insulation test on pads each of several tens of micrometers that cannot be tested by a conventional multiple-probe tester.

The conventional two- or four-probe tester must two-dimensionally move a stage, so that it takes several hundreds of milliseconds for testing a pair of pads. On the other hand, the present invention takes several milliseconds for testing a pair of pads with the stage being linearly moved. When testing pairs of 1000 pads arranged at minimum pitches of 40 micrometers on a circuit board of 100 millimeters square, the conventional tester takes about 40 hours, while the present invention takes one hour (the former example) to 30 minutes (the latter example). Namely, the present invention reduces the testing time to at least 1/40 of the prior art.

These figures are obtained with a testing speed of 0.3 seconds per pair of pads according to the prior art and a stage moving speed of 0.2 seconds per step and a measuring speed of 3 milliseconds per pair of pads according to the present invention.

According to the fourth and fifth aspects of the present invention, the laser plasma switch controller makes the spaces conductive, and a predetermined time after that, the sampler detects the electrical characteristic values of conductive paths including the conductive sections.

According to the fourth and fifth aspects of the present invention, the slit is moved in one direction to detect the electric characteristics of every pair of test pads located on each side of the slit. If there are any pairs of test pads that have not been tested with the one-direction movement of the slit, their addresses are stored in a proper storage unit. The slit is turned by 90 degrees and the conductive area is moved orthogonal to the slit, to detect the electrical characteristics of the pairs of test pads stored in the storage unit.

Namely, the apparatus according to any one of the fourth and fifth aspects of the present invention tests a circuit board having metal wiring patterns and traces with pads for insulation among the traces and conduction among the pads on each trace.

The apparatus has a transparent test head having at least two conductive sections that are electrically separated from each other with a slit. Each of the conductive sections has at least a metal pad, i.e., a power supply pad or a detection pad. The test head is spaced apart from the circuit board by a predetermined gap, so that the two conductive sections face the circuit board.

The apparatus has two laser beam emitters for emitting laser beams having a wavelength to transmit through the conductive sections of the test head to make conductive paths for supplying power and detecting electrical characteristics, and units for separately converging and deflecting the laser beams to discrete positions on the circuit board.

The apparatus also has a unit for measuring resistance between the power supply pad and the detection pad.

The laser beams are positioned at two test pads under the two conductive sections of the test head. The laser beams excite plasma to cause a gas conduction phenomena (laser plasma switches) to electrically connect the power supply pad of the test head to one of the test pads and the detection pad of the test head to the other pad.

Resistance between the power supply pad and the detection pad is measured, and accordingly, it is determined whether or not conduction or insulation between the two test pads is good.

The unit for measuring resistance between the power supply pad and the detection pad includes a unit for applying a constant voltage to the power supply pad and a detector for detecting an output current flowing from the detection pad to ground. Alternatively, the unit may include a unit for applying an AC signal (a sine wave or a pulse wave) to the power supply pad and a detector for detecting the amplitude of an output current waveform flowing from the detection pad to ground. The resistance between the power supply pad and the detection pad is calculated according to a ratio between the input voltage or the amplitude of the input voltage waveform and the output current or the amplitude of the output current waveform.

The conductive sections may be made of a photoconductive film. The film is formed on the surface of a transparent support such as a glass plate that faces a circuit board to be tested. A thin linear light blocking stripe is formed on the transparent plate opposite to the circuit board. The glass plate is provided with a unit for horizontally moving the glass plate orthogonally to the blocking stripe. Above the test head, an emitter is arranged for emitting coherent light for uniformly irradiating the photoconductive film. The coherent light has a wavelength of 0.5 to 1 micrometer. The light blocking stripe forms at least two isolated sections on the photoconductive film.

The test head is moved relative to the circuit board. In this case, some pairs of test pads may come only under the same conductive section. This will happen when such a pair of test pads is arranged on a straight line that runs in parallel with the slit or stripe. These kinds of pairs of test pads are extracted before starting measurements. The numbers and coordinates of such pairs are registered in a second test pad data file. Other normal test pads are registered in a first test pad data file. Each pair of test pads stored in the first file is read out, and the two laser beams are emitted toward the test pads, to apply a voltage to the test pads, detect a current, and measure resistance between the pads. The slit is shifted to test every pair of the pads stored in the first file.

The circuit board or the test head (slit) is then turned by 90 degrees. At the same time, the coordinates of the test pads stored in the second file, or the laser beam deflection coordinate system is alto turned by 90 degrees. The same test is carried out on every pair of the test pads stored in the second file.

When the test head involves at least three conductive sections, it is possible to provide a unit for optionally changing connections of the power supply and detection pads, which are connected to the conductive sections, to the resistance measuring voltage source and current detector.

The length g of the conductive section of the test head orthogonal to the slit, the width H thereof along the slit, and the total length G of the test head are obtained as follows:

g>=A/(N-1)
H>=A
G>=N×g=N×A/(N-1)

where A is the size of the square circuit board and N is the number of the conductive sections (N=2, 3, . . . ).

The at least three conductive sections of the test head are electrically insulated from one another. One of the three conductive sections, i.e., the first conductive section is connected to the voltage source or to the current detector, and the others are connected to the current detector or to the voltage source. A conduction test or an insulation test is carried out on pairs of test pads with one pad in each pair being under the first section and the other pad under one of the other sections. Thereafter, the second conductive section is connected to the voltage source or to the current detector, and the others are connected to the current detector or to the voltage source. The conduction test or insulation test is carried out on pairs of test pads with one pad in each pair being under the second conductive section and the other pad under one of the other conductive sections. In this way, the test with applying a voltage and measuring a current is repeated through different combinations of the conductive sections.

The test head is horizontally shifted relative to the circuit board by a predetermined distance orthogonal to the slit. This shift causes new pairs of pads to come under the conductive sections. The conduction or insulation test is carried out on these pairs of pads.

The test processes are repeated until the test head is shifted relative to the circuit board by the length g of the conductive section. In this way, the conduction or insulation test is carried out on all pairs of test pads on the whole face of the circuit board, to thereby complete the test of the electric characteristics of the circuit board.

Some pairs of test pads will always come under the same conductive section even if the test head is shifted relative to and in parallel with the circuit board. This will happen when a pair of test pads is arranged on a straight line that runs in parallel with the slit. These kinds of pairs of pads are extracted before starting the test, and the numbers (i, j) and coordinates of the pads are stored in the second file. The numbers (i, j) and coordinates of normal pairs of test pads are stored in the first file. The conduction or insulation test is first carried out on the pairs of test pads stored in the first file. Namely, the two laser beams are emitted to the pads pair by pair, to apply a voltage to the pads, a current is detected, and resistance between the pads is measured. The test is repeated until the slit is shifted for the length g of any one of the conductive sections.

Thereafter, the circuit board or the test head with the slit is turned by 90 degrees. At the same time, the coordinates of the test pads stored in the second file or the laser beam deflection coordinate system is also turned by 90 degrees. Then, the same test is carried out on every pair of test pads stored in the second file.

The slit of the test head is moved step by step at intervals of 1/n (n being 1, or 2, or 3, or . . . ) of the minimum pitch P of the pads on the circuit board.

Alternatively, the coordinates of all pads are checked at first and the slit is moved so that it may not come on top of the test pads.

The two lasers may be two independent pulse lasers, or a pulse laser and a beam splitter that divides a laser beam emitted from the laser into two beams. The laser beam may be a pulse laser beam of 1 to 2 micrometers in wavelength.

An apparatus for testing a circuit board according to the sixth aspect of the present invention will be explained next in detail with reference to the drawings.

The first to fifth aspects of the present invention test a circuit board having pads on a main face thereof. Namely, only for pads disposed on one face of A circuit board, do the first to fifth aspects measure a current or a voltage in conductive paths and calculate resistance, current, or voltage between test pads, thereby testing the insulation resistance or wiring breakage between the pads.

Some circuit boards have traces on each face thereof. To improve integration of circuits and workability of wiring connections in assembling circuit boards, more circuit boards have traces on each face thereof. In this case, the first to fifth aspects of the present invention are incapable of efficiently and speedily testing the electric characteristics between test pads.

Accordingly, the sixth aspect of the present invention provides an apparatus for easily and efficiently testing the electric characteristics of a circuit board having traces on each face thereof.

The arrangement of the apparatus of this aspect is basically the same as that of FIG. 1. To test the circuit board having test pads on each face thereof, the apparatus according to the sixth aspect of the present invention arranges a path forming unit and laser plasma switch controller on each side of the circuit board.

Figure 36:
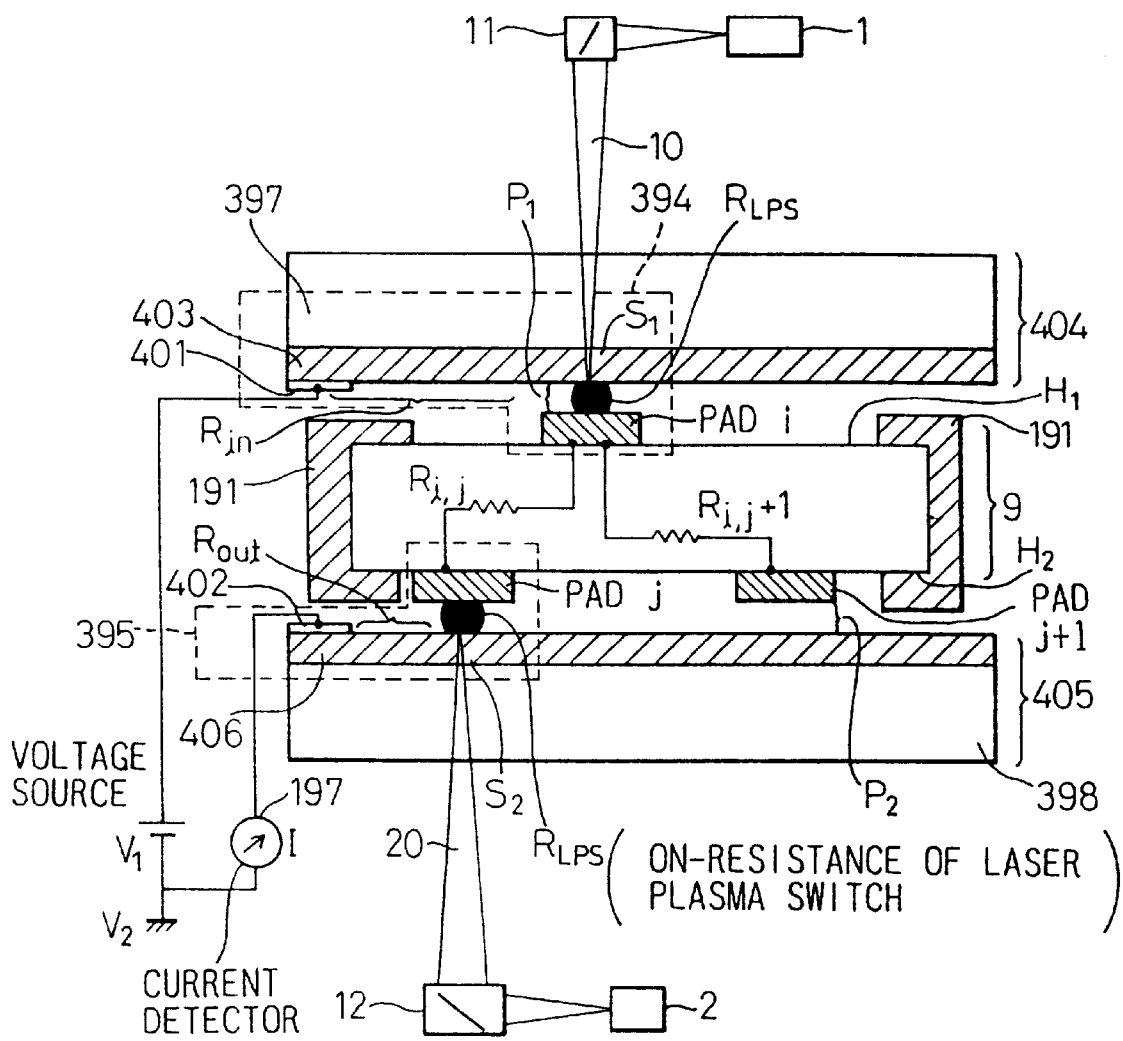
FIG. 36 is a sectional view showing essential part of an apparatus for testing a circuit board according to a sixth aspect of the present invention.

FIG. 36 is a sectional view showing the apparatus according to the sixth aspect of the present invention. The apparatus has a holder 191 for holding the circuit board, a detector 393 for measuring the electric characteristics of the circuit board, and a laser plasma switch controller 395. The detector 393 has a first path forming unit 394 and a second path forming unit 395. The first and second path forming units 394 and 395 are arranged along opposite faces of the circuit board 9 and are spaced apart from the faces by a predetermined gap. The first path forming unit 394 forms a first conductive path 391 between a position S1 corresponding to a first test pad i on a trace on a face H1 of the circuit board 9 and a first power source V1. The second path forming unit 395 forms a second conductive path 392 between a position S2 corresponding to a second test pad j on a trace that is the same as or different from the trace containing the first test pad i, on the other face H2 of the circuit board 9 and a second power source GND whose potential is lower than that of the first power source V1. The laser plasma switch controller 395 emits a laser beam 10 to a first space P1 between the first test pad i and the first conductive path 391 and a laser beam 20 to a second space P2 between the second test pad j and the second conductive path 392, to make the first and second spaces P1 and P2 conductive. The detector 396 has an electrical characteristic value sampler 197 connected to one of the first and second conductive paths 391 and 392.

This apparatus employs two test heads 404 and 405. The test head 404 is made of a glass plate 397 and a transparent conductive film 403 having a power supply pad 401. The test head 405 is made of a glass plate 398 and a transparent conductive film 406 having a detection pad 402. The test heads 404 and 405 are arranged on opposite sides of the circuit board 9 such that the conductive films 403 and 406 face and are spaced away from the circuit board 9. The power supply pad 401 of the test head 404 is connected to the voltage source V1, and the detection pad 402 of the test head 405 is connected to the current detector 197. The conductive films 403 and 406 adjacent to the test pads i and j of the circuit board 9 respectively serve as the power supply path 391 and detection path 392. These paths 391 and 392 are electrically connected to the test pads i and j through laser plasma switches activated by pulse laser beams, and resistance between the power supply pad 401 and the detection pad 402 is momentarily measured after the emission of the laser beams. Accordingly, resistance between the test pads i and j is measurable.

This embodiment employs no contact probes, nor vacuum degassing system, nor physical contacts between test pads and test heads (transparent conductive films). This embodiment forms a closed circuit starting from the power source V1, passing through the power supply pad 401, conductive path 391, first test pad i (on the reverse side of the circuit board, for example), second test pad j (on the front side of the circuit board, for example), conductive path 392, and detection pad 402, and reaching the ground electrode GND. A resistance value is measured according to a voltage applied to the closed circuit and a current flowing through the closed circuit. The measured resistance value is not affected by the electrostatic capacitance of the traces.

Measuring time is dependent on a laser plasma switching time, a laser beam positioning and settling time, and the S/N ratio of a detected signal. The laser plasma switching time, i.e., the ON time of a laser plasma switch is 10 microseconds to one millisecond at the maximum. The laser beam positioning and settling time is about several hundreds of microseconds. Accordingly, a measurement of resistance between a pair of test pads will be completed within one to two milliseconds, which is about 1/200 of the 0.5 seconds required by the conventional contact probe (flying probe) tester. This embodiment is capable of testing different kinds of circuit boards by changing data for positioning laser beams without preparing new test jigs. This reduces testing costs and processes.

The sixth aspect of the present invention is capable of not only measuring insulation resistance between test pads on traces arranged on opposite faces of the circuit board 9 but also detecting breakage between two test pads on a trace arranged through the circuit board 9.

Figure 37:
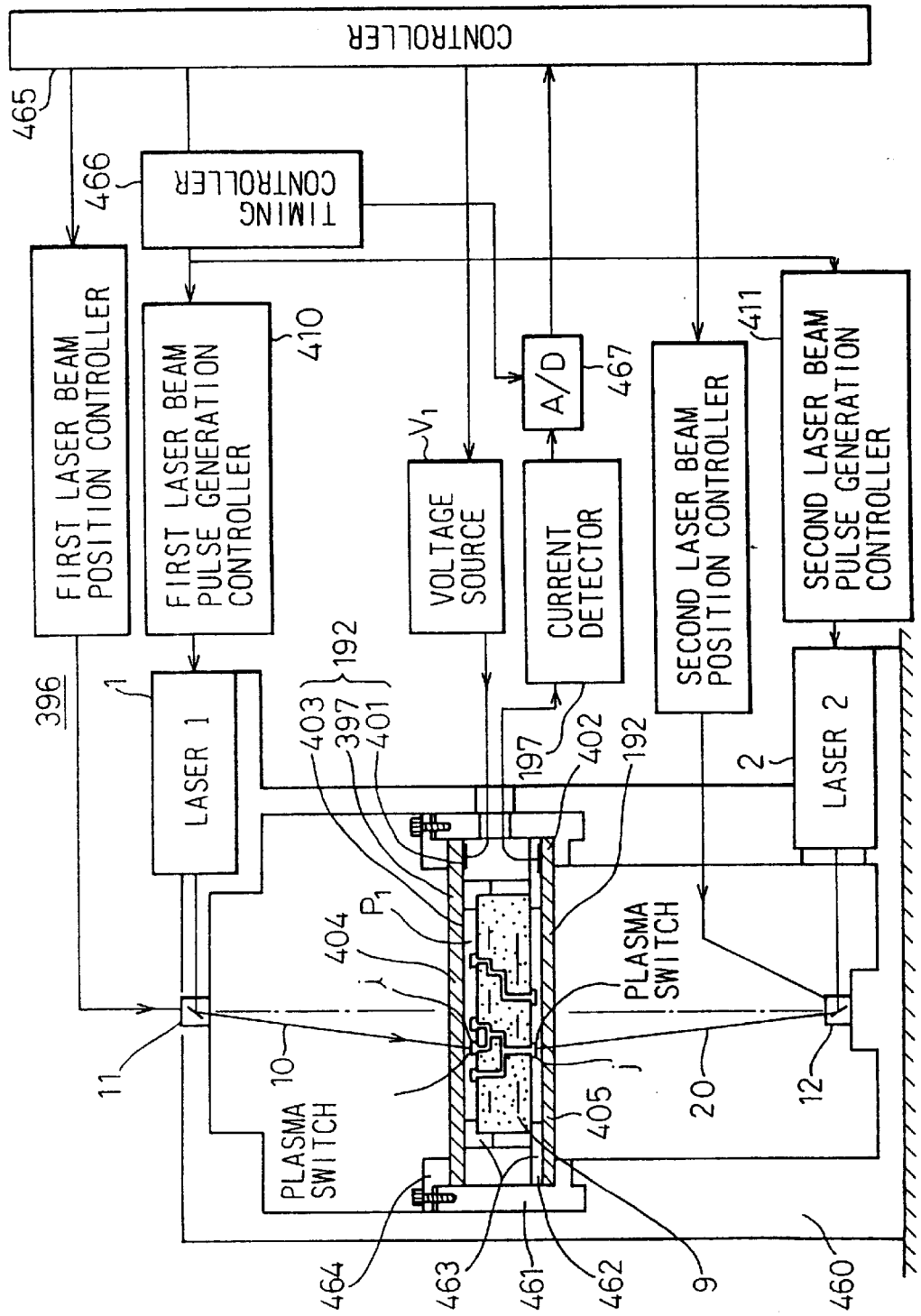
FIG. 37 is a general side view showing the apparatus according to the sixth aspect of the present invention.

FIG. 37 is a sectional view showing the apparatus according to the sixth aspect of the present invention. The path forming unit 393 for forming the first and second conductive paths 391 and 392 includes conductive sections made from conductive material similar to those of the fourth and fifth aspects. The conductive material transmits laser beams.

Lasers 1 and 2 and laser plasma switch controllers 410 and 411 of the detector 396 are arranged on opposite faces of the circuit board 9. The laser plasma switch controllers 410 and 411 preferably include laser beam deflectors 11 and 12.

To carry out a test, the laser plasma switch controllers 410 and 411 make the spaces P1 and P2 conductive, and a moment after, the electrical characteristic value sampler 197 detects the electrical characteristic values of the conductive paths including the conductive sections.

The present invention does not particularly limit the unit for forming the first and second conductive paths 391 and 392. The paths 391 and 392 may be formed of photoconductive material that becomes conductive with application of light energy.

The photoconductive material may be that employed by the first to third aspects of the present invention.

The arrangement and operation of the apparatus according to the sixth aspect of the present invention will be explained next with reference to FIGS. 36 and 37.

FIG. 36 shows the principle of the apparatus. In the figure, the apparatus measures resistance Rij between test pads i and j that are arranged on opposite faces of the circuit board.

The test heads 404 and 405 are positioned above and below the circuit board 9 with a gap of several tens of micrometers between them. The test heads 404 and 405 are made of the glass plates 397 and 398 coated with the transparent conductive films such as ITO films 403 and 406. The conductive films 403 and 406 are electrically connected to the power supply and detection pads 401 and 402, respectively. The power supply pad 401 is connected to the voltage source V1, and the detection pad 402 is connected to the current detector 197, which is grounded. Any one of the pads 401 and 402 may be used as any one of the power supply and detection pads.

The pulse laser beams 10 and 20 are simultaneously emitted toward the pads i and j, to excite plasma in the space P1 between the conductive film 403 and the pad i and in the space P2 between the conductive film 406 and the pad j, as indicated with large black dots. As a result, the conductive films momentarily become conductive with the pads i and j, to form an electrical path passing through the power supply pad 401, pads i and J, and detection pad 402. In this state, a current flows from the voltage source V1, passes through the power supply pad 401, pads i and j, and the detection pad 402, and reaches ground. This current is dependent on the resistance Rij between the pads i and j. The resistance Rij is insulation resistance if the test is an insulation test, and wiring resistance if it is a conduction test. The output current i is measured when the pulse laser beams are emitted or a moment after the emission of the beams. Resistance Rmes between the power supply pad 401 and the detection pad 402 is obtained by V/i. The insulation resistance Rij between the test pads i and j is obtained by subtracting resistance values Rin and Rout of the transparent conductive films and double the ON resistance Rlps of the laser plasma switch, from the resistance Rmes. Namely, the resistance Rij is obtained as follows:

$$Rij=Rmes-Rin-Rout-2\times Rlps$$

where Rij is the measured resistance value between the test pads i and j, Rmes is the measured resistance value between the power supply pad 401 and the detection pad 402, Rin is the resistance value of the transparent conductive film 403 from the power supply pad 401 to a position just above the pad i, Rout is the resistance value of the transparent conductive film 406 from the detection pad 402 to a position just below the pad J, and Rlps is the ON resistance of the plasma laser switch.

In this way, this embodiment positions a circuit board to be tested between the test heads, applies a voltage to one of the transparent conductive films of the test heads, and .detects an output current from the conductive film of the other test head with use of the laser plasma switch technique, to thereby carry out a conduction or insulation test between the opposite faces of the circuit board. This embodiment forms a closed circuit in a noncontact manner, to carry out the conduction and insulation tests. Accordingly, this embodiment precisely and speedily measures resistance between test pads.

The resistance values Rin and Rout are easily obtainable according to an experimentally obtained resistance value of the transparent conductive film per unit length and the length of a path from the power supply pad 401 to the detection pad 402 calculated according to the coordinates of the test pads. The accuracy of measured resistance value between the test pads is dependent on fluctuations in the resistance values Rin, Rout, and Rlps. Each of these resistance values is about 10 kilohms, and a fluctuation in them is about 10% thereof, i.e., about one kilohm. Although it is difficult to achieve an accuracy of several tens of megohms to several hundreds of megohms, it is possible to carry out a conduction test at an accuracy of about a kilohm. This accuracy is quite sufficient for the insulation test.

FIG. 37 generally shows the apparatus. A frame 460 supports the two lasers 1 and 2 involving laser sources and laser deflectors. A casing 461 is arranged between the lasers 1 and 2. In the casing 461, the circuit board 9 is positioned between the test heads 404 and 405. The circuit board 9 is held by spacers 462 and 463 that are held by the test heads 405 and 404 so that a gap of several tens of micrometers is maintained between the circuit board 9 and the test heads 405 and 404 in the casing 461. A cover 464 is fixed to the casing 461 under proper pressure. In the embodiment, the test head 404 serves as a power supply head, and the test head 405 serves as a detection head. The power supply pad 401 of the test head 404 is connected to the voltage source, and the detection pad 402 of the test head 405 is connected to the current detector 197. In response to an instruction from the controller 465, the first and second laser beams 10 and 20 are positioned at the test pads i and j. In response to a trigger signal from a timing controller 466, the laser beam pulse generation controllers 410 and 411 emit the pulse laser beams 10 and 20. After a predetermined time (for example, 0.5 milliseconds), the timing controller 466 provides a sampling strobe to let an A/D converter 467 convert an output of the current detector 197 into digital data. The digital data are fetched by the controller 465, which calculates resistance and determines whether or not conduction or insulation between the pads is sound. According to the test sequences, the test pad i on one of the faces of the circuit board 9 is tested with respect to all testable pads on the other face of the circuit board 9. Thereafter, the test pad i is updated, to repeat the test. After all pairs of pads are tested, the test sequences complete.

The laser optical system of this embodiment has no lenses. Depending on the diameter of a laser probe determined by the size of a test pad, lenses such as a scan lens may be employed.

This embodiment involves no mechanical movements to test pads on opposite faces of a circuit board.

The embodiment completes a test on a pair of pads within about 3 milliseconds. When the conduction or insulation test is carried out on 2000×2000 pairs of test pads, the tests will be complete within about three hours, which is about ⅟₁₆₀ of the conventional technique.

It is easy to condense a laser probe to 10-odd micrometers. Namely, the spatial resolution of a plasma switch is substantially equal to the length of a gap between a test pad and a conduction path. Accordingly, the embodiment is capable of carrying out an insulation test on a pad of several tens of micrometers in size that is difficult to test by a conventional multiple-probe tester.

The conventional two- or four-probe tester always requires mechanical two-dimensional movements of a stage, so that it takes several hundred milliseconds to test a pair of pads. On the other hand, the present invention selects test pads by deflecting laser beams, so that it takes several milliseconds to test a pair of pads. Accordingly, 2000×2000 pairs of test pads on opposite faces of a circuit board will be tested in about 550 hours by the conventional technique, while three hours is sufficient for the present invention. Namely, the present invention reduces the testing time to about ⅟₁₆₀ of the prior art, when the prior art achieves a measuring speed of 0.5 seconds per pair of test pads and the present invention achieves a measuring speed of 3 milliseconds per pair of test pads.

A modification of the sixth aspect of the present invention provides an apparatus for testing a circuit board having wiring patterns and traces with pads for insulation between the traces and conduction between the pads on each trace.

The apparatus has two transparent test heads. One face of each of the test heads is coated with a transparent conductive film provided with one of power supply and detection pads. The test heads are arranged above and below the circuit board so that the conductive films face opposite faces of the circuit board with a predetermined gap between them.

The apparatus has two lasers one for power supply and the other for detection, having a wavelength to transmit through conductive sections of the test heads.

The apparatus also has unit for converging, deflecting, and emitting the laser beams from the opposite sides of the circuit board toward separate positions on the test heads. The apparatus also has a unit for measuring resistance between the power supply pad and the detection pad. The power supply and detection laser beams are positioned at two test pads on the circuit board through the conductive sections of the test heads. The laser beams cause a gas conduction phenomena (laser plasma switches) due to plasma excited by the laser beams. As a result, the power supply pad of one of the test heads is electrically connected to the corresponding test pad, and the detection pad of the other test head is electrically connected to the corresponding test pad. Then a resistance value is measured between the power supply pad and the detection pad, to determine whether or not conduction or insulation between the two test pads is sound.

The unit for measuring the resistance between the power supply pad and the detection pad includes a unit for applying a constant voltage to the power supply pad and a detector for detecting an output current flowing from the detection pad to ground. Alternatively, it may have a unit for applying an AC signal (sine wave or pulse wave) to the power supply pad and a detector for detecting the amplitude of an output current waveform flowing from the detection pad to ground. The resistance between the power supply pad and the detection pad is calculated according to a ratio between the input voltage or the amplitude of the input voltage waveform and the output current or the amplitude of the output current waveform.

The test pad corresponding to the first test head is tested in relation to all testable pads corresponding to the second test head. Thereafter, another test pad corresponding to the first test head is selected, to repeat the same test. In this way, the conduction or insulation test is carried out on every pair of test pads on the opposite faces of the circuit board.

As explained above, the apparatus according to the first aspect of the present invention employs a light transmission mask such as a liquid crystal mask whose patterns are electrically controllable, and two laser beams, to speedily test conduction and insulation between optional test pads in a noncontact manner. The apparatus according to the second aspect of the present invention employs a photoconductive sheet on which transparent conductive film patterns are entirely formed, to shorten the actual length of a conductive path, reduce the ON resistance of the conductive path, and improve the accuracy of measurement of insulation resistance. The apparatus according to the third aspect of the present invention employs no light transmission mask, to shorten the actual length of a conductive path and accurately and speedily measure insulation resistance.

Many different embodiments of the present invention may be constructed without departing from the spirit and scope of the present invention, and it should be understood that the present invention is not limited to the specific embodiments described in this specification, except as defined in the appended claims.

What is claimed is:

1. An apparatus for testing a circuit board having wiring patterns and traces with pads, comprising:
    a means for holding said circuit board;
    a means for detecting the electrical characteristics of said circuit board, having a conductive path between a position corresponding to a first test pad on one of said traces and a first power source as well as a second conductive path between a position corresponding to a second test pad on another of said traces and ground potential;
    a means for controlling a first laser plasma switch in a first space between said first test pad and said first conductive path and a second laser plasma switch in a second space between said second test pad and said second conductive path, said first and second laser plasma switches being activated with laser beams to make said first and second spaces conductive;
    an electrical characteristic value sampling means included in said electrical characteristics detection means and connected to one of said first and second conductive paths; and
    a sealing means for sealing a space between a photoconductive sheet or glass plate and said circuit board, and the sealed space is filled with a pressurized or depressurized air or rare gas,
    wherein said laser plasma switch control means makes said first and second spaces conductive, and a predetermined time thereafter, said electrical characteristics detection means drives said sampling means to detect an electrical characteristic value in said conductive paths.

2. An apparatus as claimed in claim 1, wherein said conductive path forming means is made from laser transmission material.

3. An apparatus as claimed in claim 2, wherein said conductive path forming means is made from photoconductive material.

4. An apparatus as claimed in claim 3, wherein said conductive path forming means is made from photoconductive material and has a means for supporting the photoconductive material.

5. An apparatus as claimed in claim 4, wherein said photoconductive material support means has a function of controlling light transmission.

6. An apparatus as claimed in claim 5, wherein said photoconductive material support means is a liquid crystal mask.

7. An apparatus as claimed in claim 6, wherein said photoconductive material support means has a means for controlling patterns to transmit light.

8. An apparatus as claimed in claim 1, wherein said laser plasma switch control means has a means for emitting laser beams and a means for deflecting the laser beams.

9. An apparatus as claimed in claim 3, wherein said electrical characteristics detection means has a means for exciting the photoconductive material.

10. An apparatus as claimed in claim 1, wherein the electrical characteristics detected by said electrical characteristics detection means include resistance, voltages, currents, and insulation resistance.

11. The apparatus of claim 1, wherein said rare gas consists of at least one of argon and neon.

12. The apparatus of claim 1, wherein said sealing means comprises an O-ring.

* * * * *

UNITED STATES PATENT AND TRADEMARK OFFICE
CERTIFICATE OF CORRECTION

PATENT NO. : 6,154,038  
DATED : November 28, 2000  
INVENTOR(S) : Akio Ito et al.

Page 1 of 1

It is certified that error appears in the above-identified patent and that said Letters Patent is hereby corrected as shown below:

<u>Title page,</u>  
Item [30], change the application number of the second foreign priority, "66-41333" to be -- 6-41333" --.

Signed and Sealed this

Thirteenth Day of November, 2001

Attest:

*Nicholas P. Godici*

NICHOLAS P. GODICI  
*Acting Director of the United States Patent and Trademark Office*

*Attesting Officer*